United States Patent [19]
Mihara et al.

[11] Patent Number: 5,666,305
[45] Date of Patent: Sep. 9, 1997

[54] METHOD OF DRIVING FERROELECTRIC GATE TRANSISTOR MEMORY CELL

[75] Inventors: Takashi Mihara, Iruma; Hiroshi Nakano, Hachioji; Hiroyuki Yoshimori, Kanagawa-ken; Shuzo Hiraide, Hachioji, all of Japan

[73] Assignee: Olympus Optical Co., Ltd., Tokyo, Japan

[21] Appl. No.: 404,300

[22] Filed: Mar. 14, 1995

Related U.S. Application Data

[63] Continuation-in-part of Ser. No. 218,740, Mar. 28, 1994, abandoned.

[30] Foreign Application Priority Data

| Mar. 29, 1993 | [JP] | Japan | 5-069472 |
| Sep. 20, 1994 | [JP] | Japan | 6-225415 |
| Jan. 25, 1995 | [JP] | Japan | 7-009992 |

[51] Int. Cl.⁶ .............................. G11C 11/22
[52] U.S. Cl. ........................... 365/145; 257/295
[58] Field of Search ................ 365/145, 149; 257/295

[56] References Cited

U.S. PATENT DOCUMENTS

| 3,832,700 | 8/1974 | Wu et al. | 365/145 |
| 5,060,191 | 10/1991 | Nagasaki et al. | 365/145 |
| 5,307,305 | 4/1994 | Takasu | 365/145 |
| 5,412,596 | 5/1995 | Hoshiba | 365/145 |

FOREIGN PATENT DOCUMENTS

| 4-192173 | 7/1992 | Japan. |

OTHER PUBLICATIONS

Science, Dec. 15, 1989, vol. 246, No. 4936, James F. Scott et al; "Ferroelectric Memories", pp. 1400–1405, American Association for the Advancement of Science.

Kyoyudentai Hakumaku Shyusekika Gijutsu, "Ferroelectric Thin Film Integration Technique", Chapter 5, Section 3, Science Forum Publishing Co. 1992, pp. 261–274.

3rd International Symposium on Integrated Ferroelectrics, Apr. 3–5, 1991, Takashi Mihara et al, pp. 116–137, "Process Dependent Electrical Characteristics . . . ".

*Primary Examiner*—Joseph A. Popek
*Attorney, Agent, or Firm*—Frishauf, Holtz, Goodman, Langer & Chick

[57] ABSTRACT

A ferroelectric gate transistor has a structure in which n-type source and drain regions are formed on a p-type semiconductor, a ferroelectric thin film is formed on a channel region between the source and drain regions, and a gate electrode is formed thereon. Memory information is erased by applying a voltage $V_g$ to the ferroelectric to cause poling in the first direction. The memory information is written by applying a voltage $V_W$ lower than a coercive voltage of the ferroelectric and having a polarity opposite to that of the voltage $V_g$ to the ferroelectric. The memory information is read out by applying a voltage $V_{DR}$ lower than the voltage $V_W$ and having a polarity opposite to that of the voltage $V_g$ to the drain to read a drain current $I_{DS}$.

105 Claims, 35 Drawing Sheets

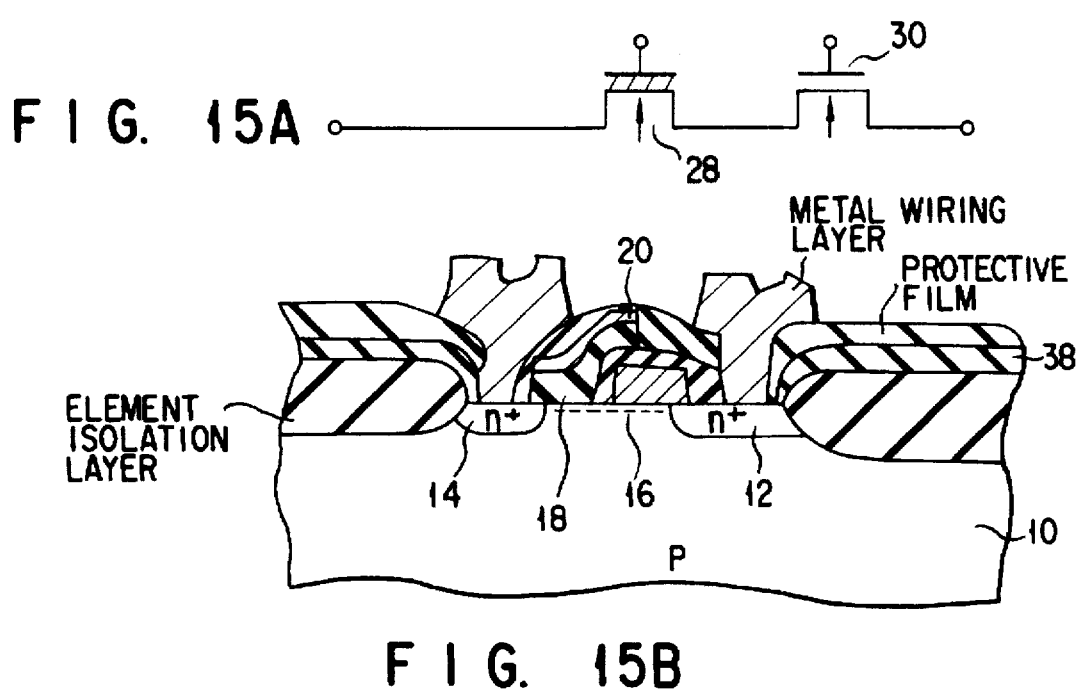
FIG. 15A
FIG. 15B
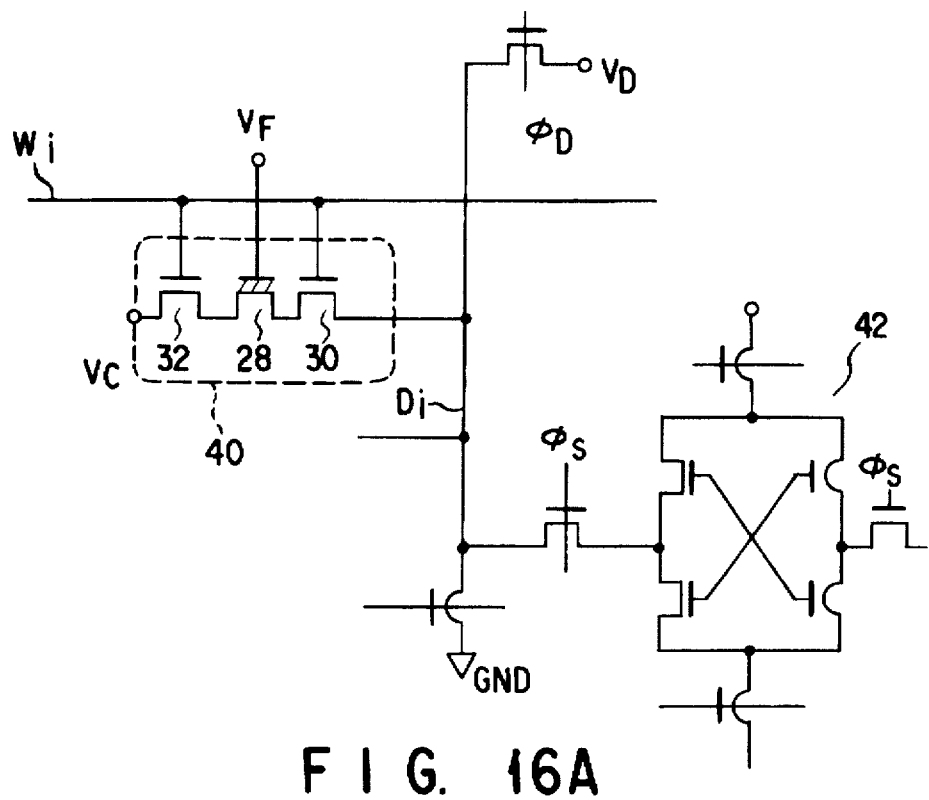
FIG. 16A

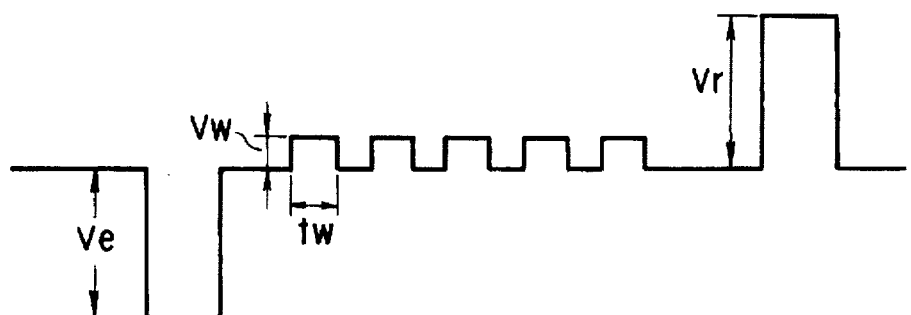
F I G. 21A
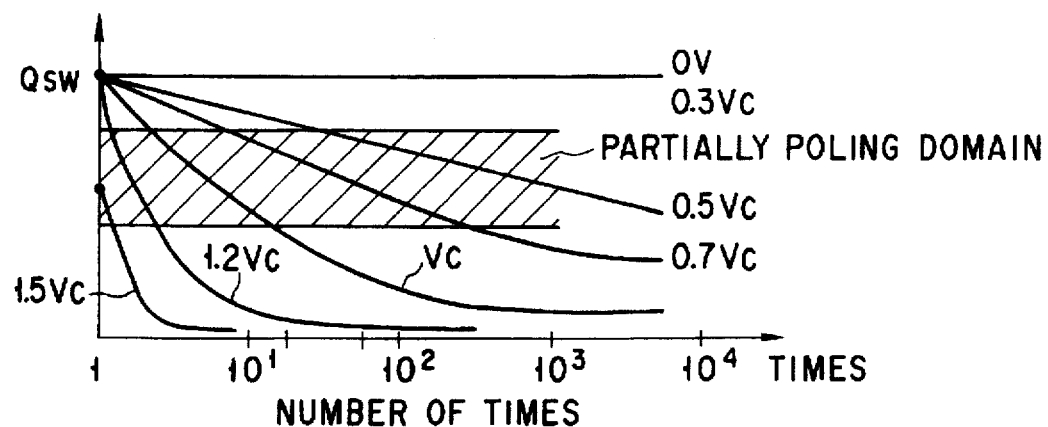
F I G. 21B
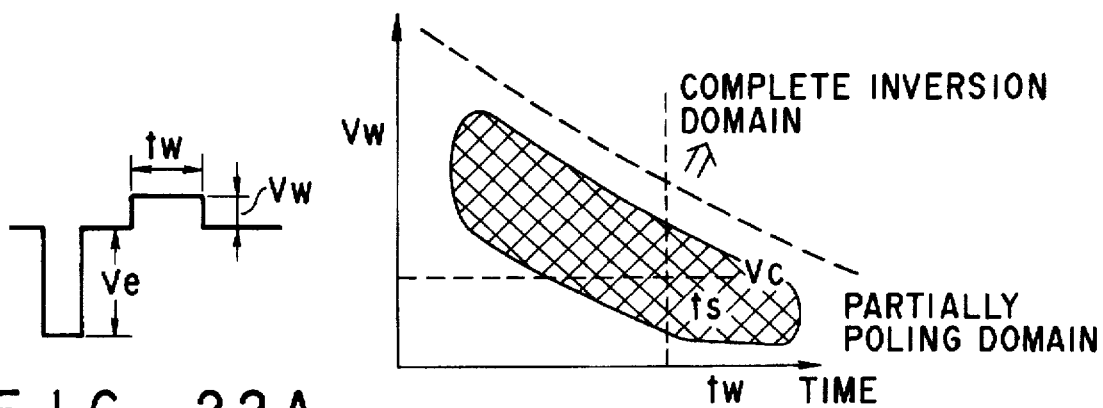
F I G. 22A
F I G. 22B

FIG. 23A
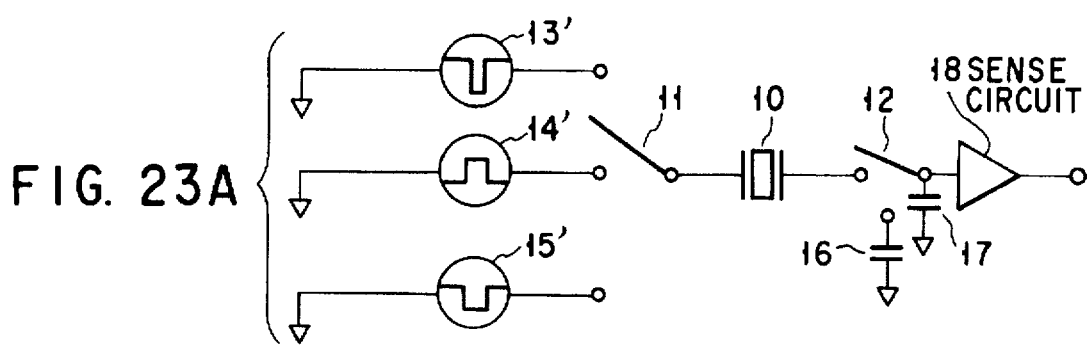
FIG. 23B
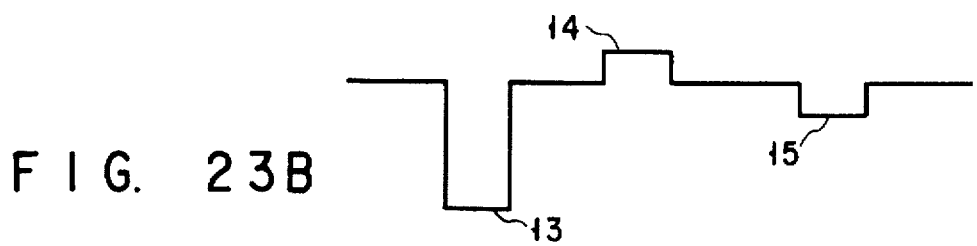
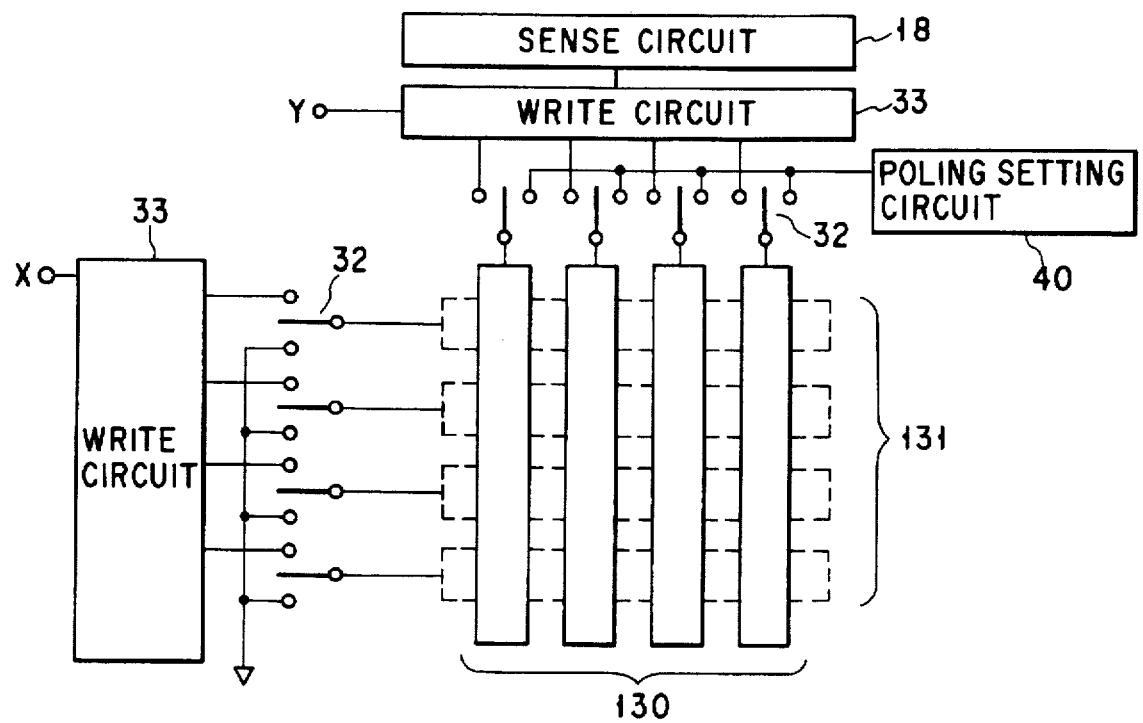
FIG. 24

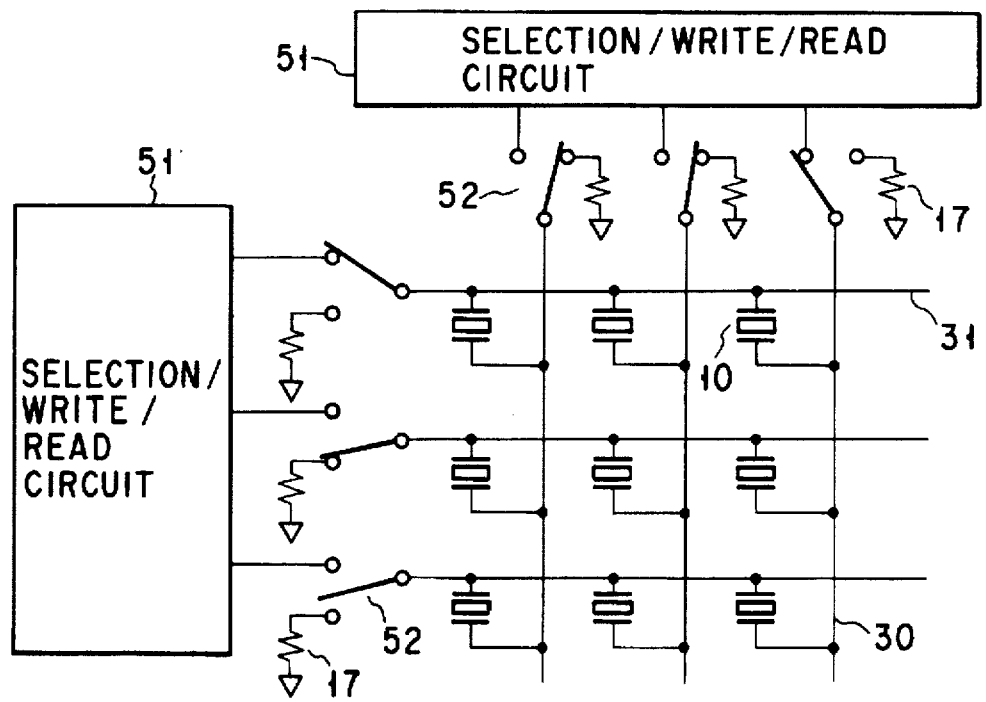
F I G. 28
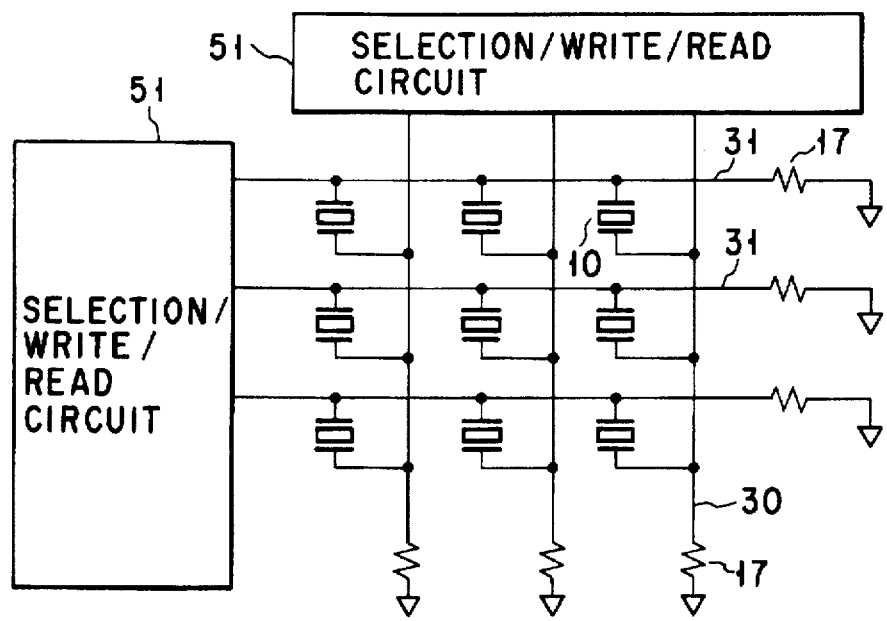
F I G. 29

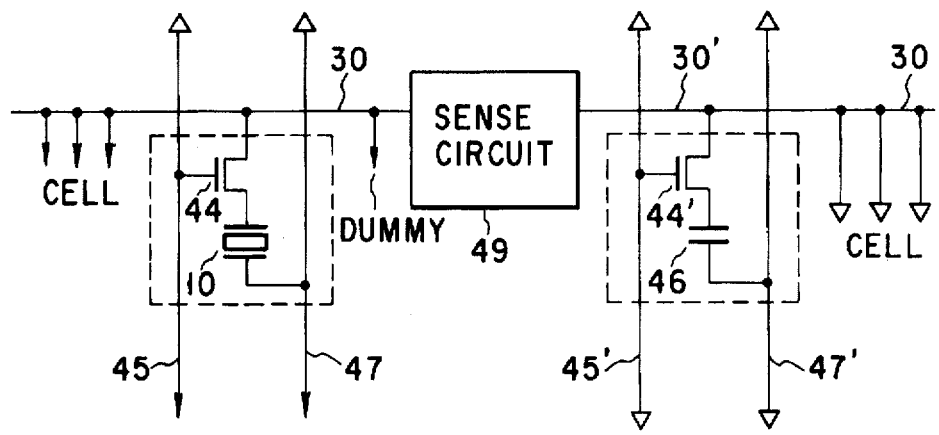
F I G. 30A
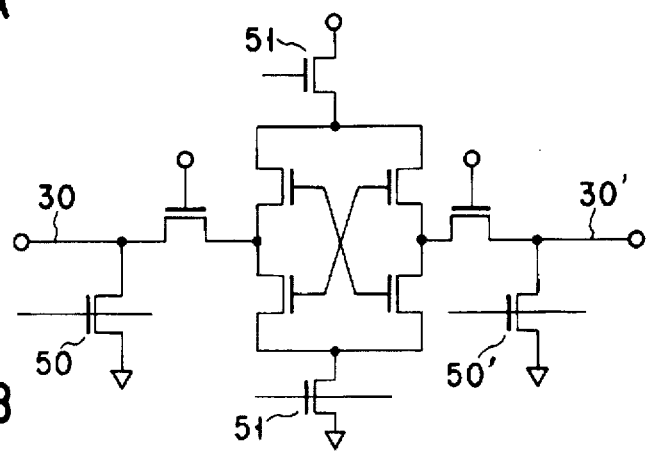
F I G. 30B
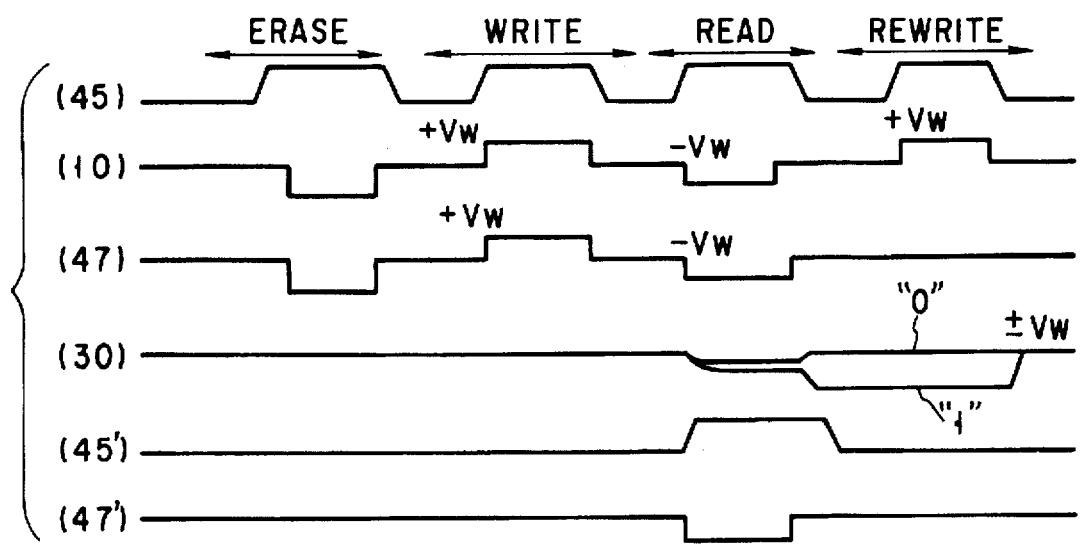
F I G. 30C

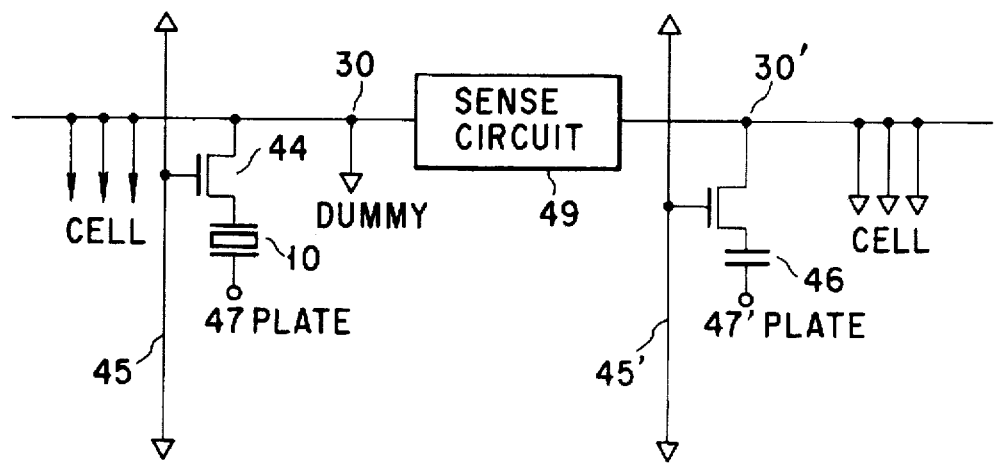
F I G. 31A
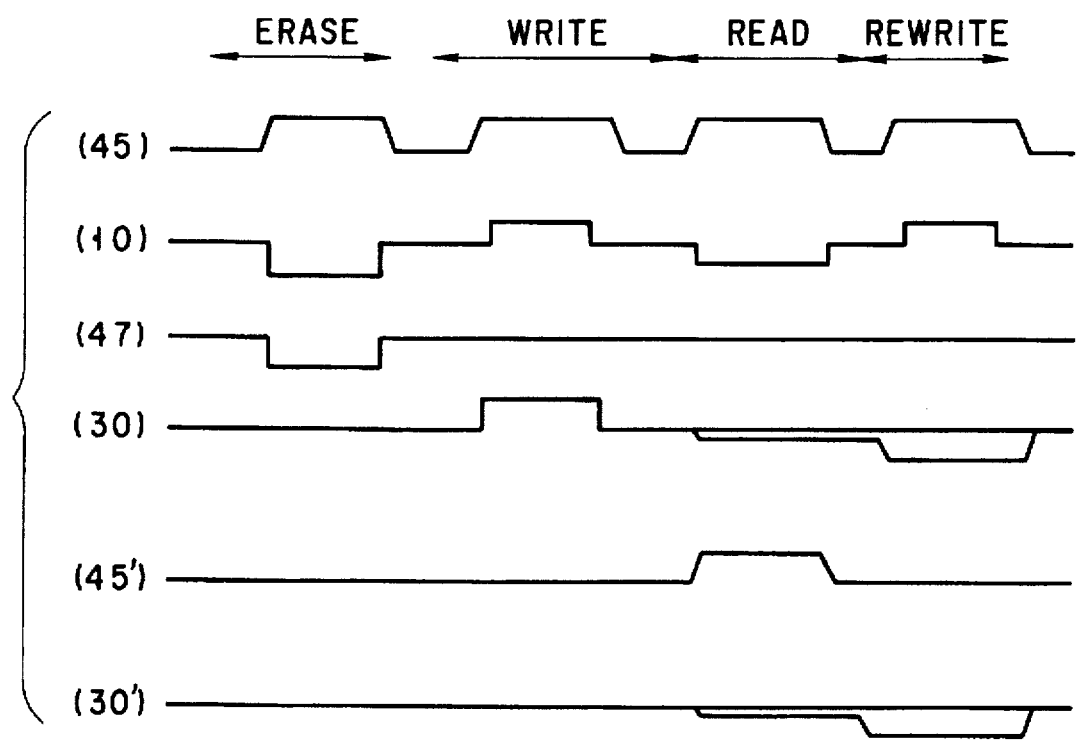
F I G. 31B

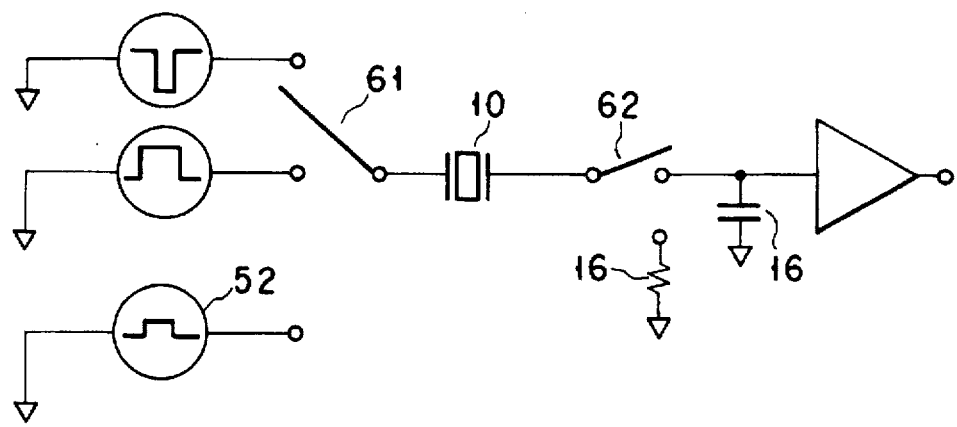
F I G. 32A
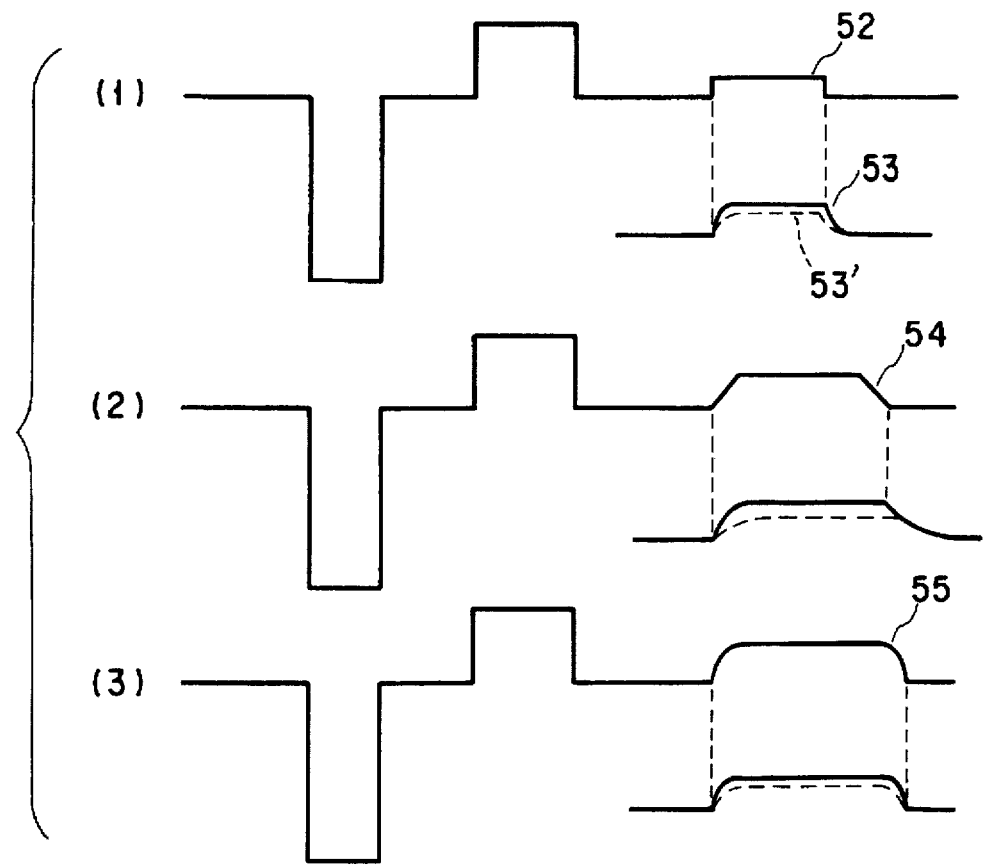
F I G. 32B

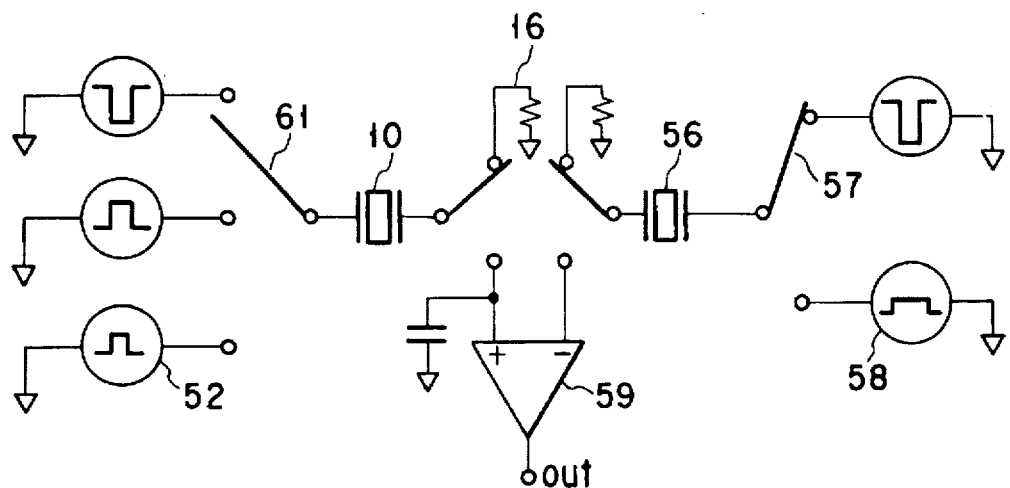
F I G. 33A
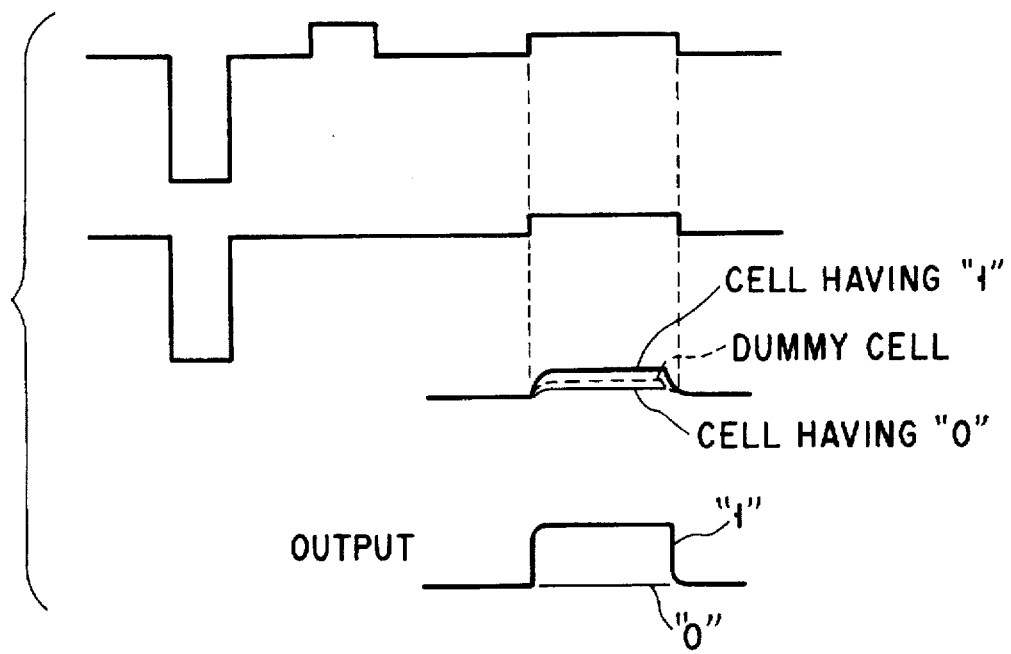
F I G. 33B

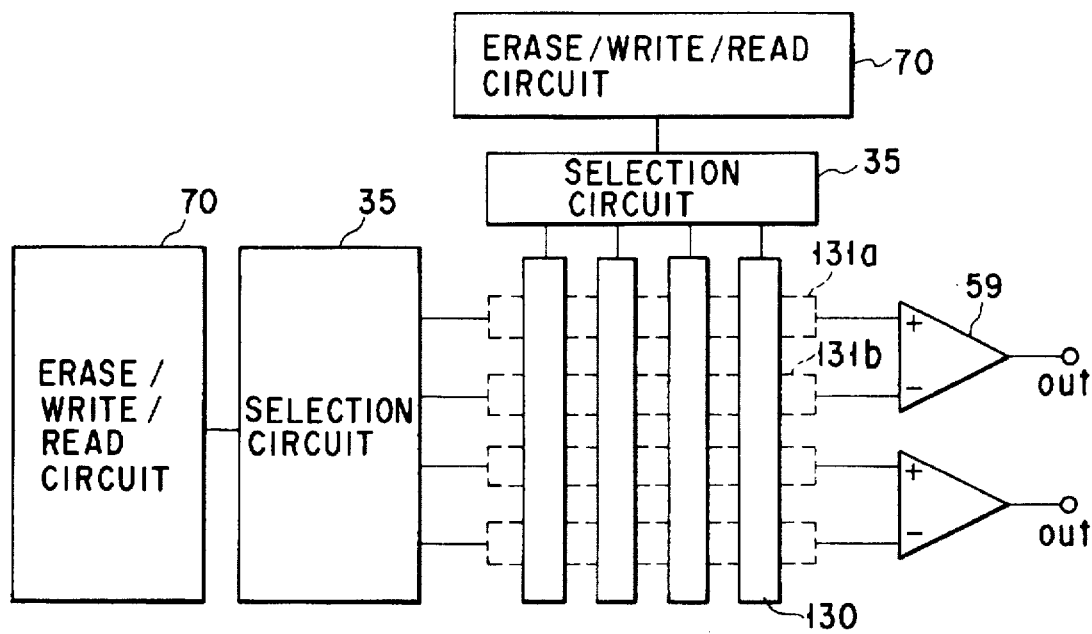
F I G. 34A
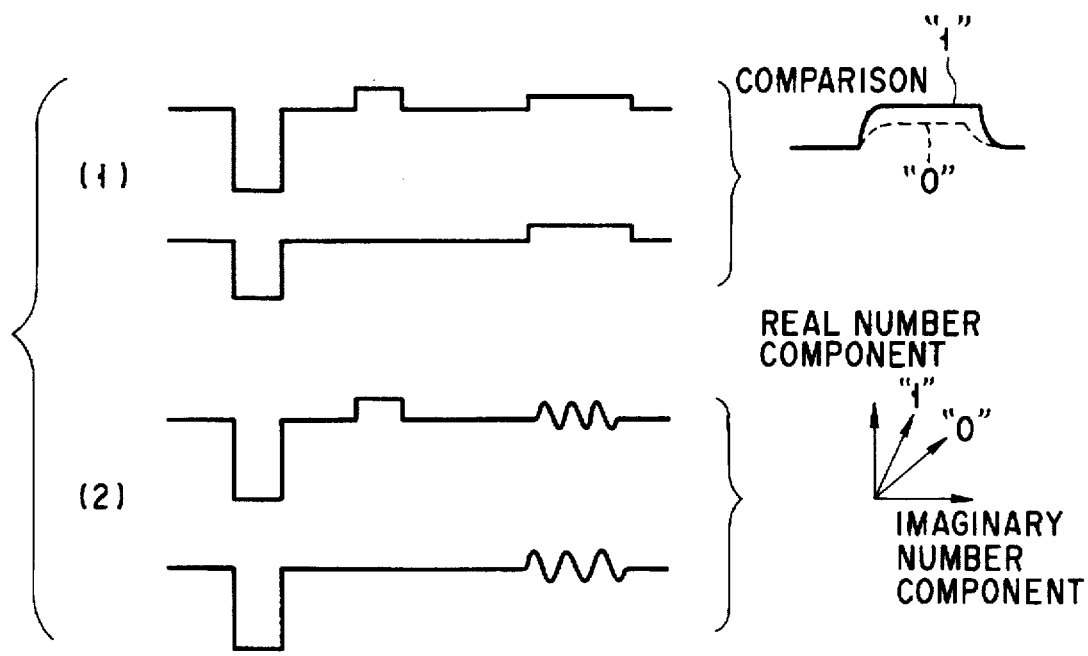
F I G. 34B

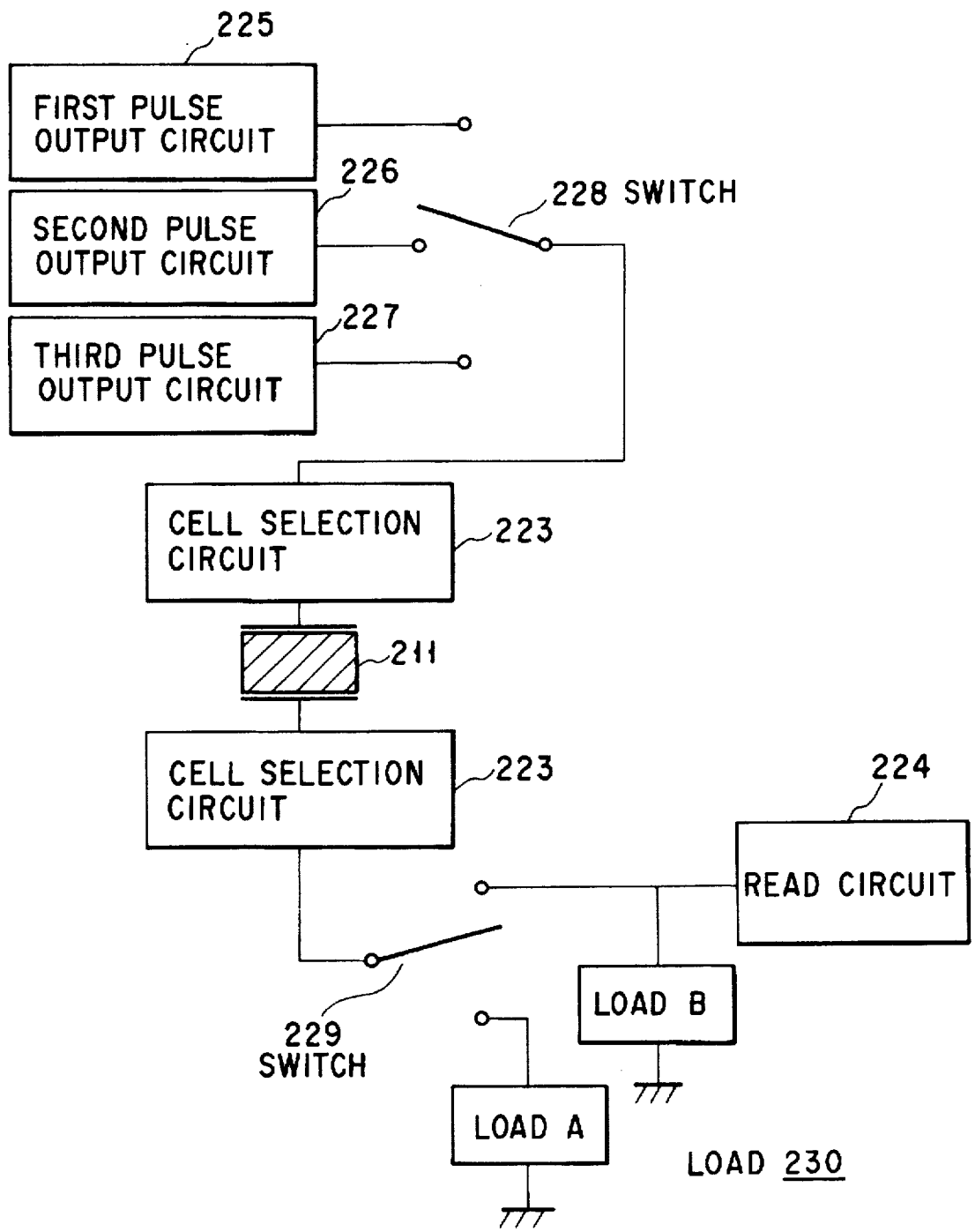
F I G. 38

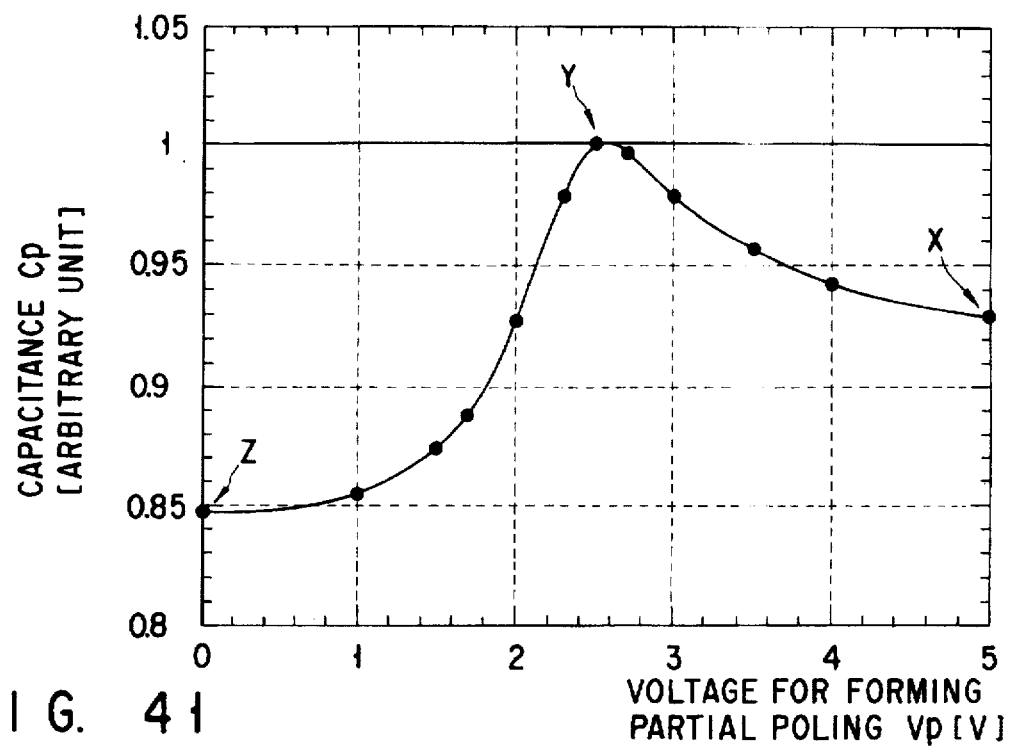
F I G. 41
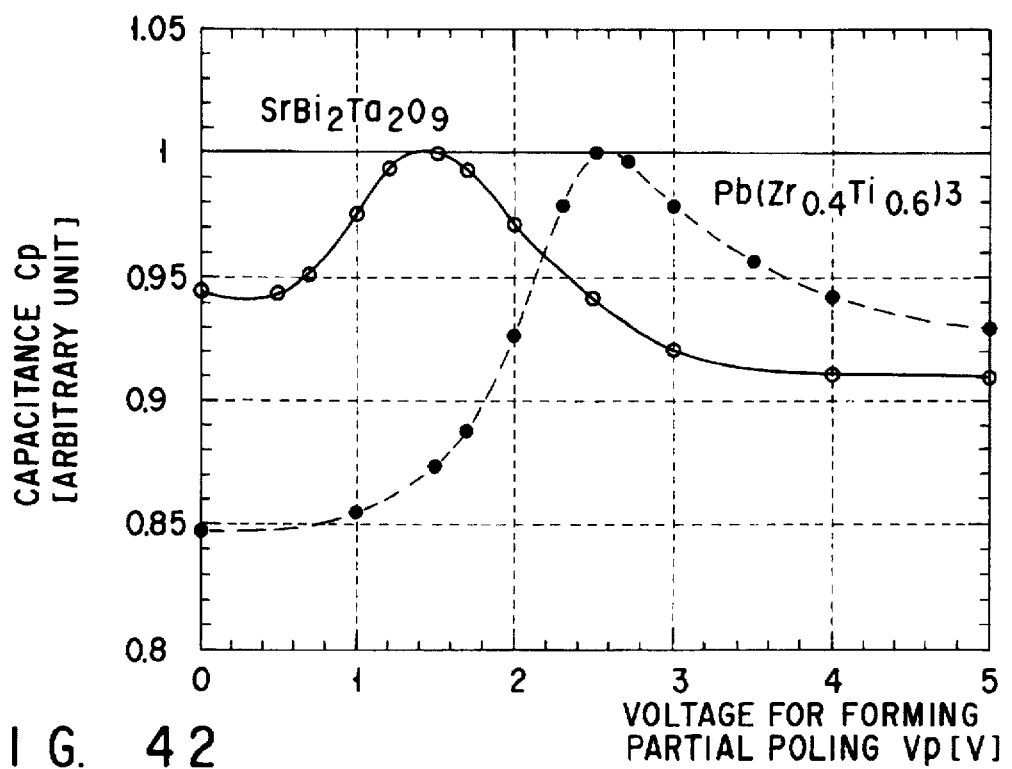
F I G. 42

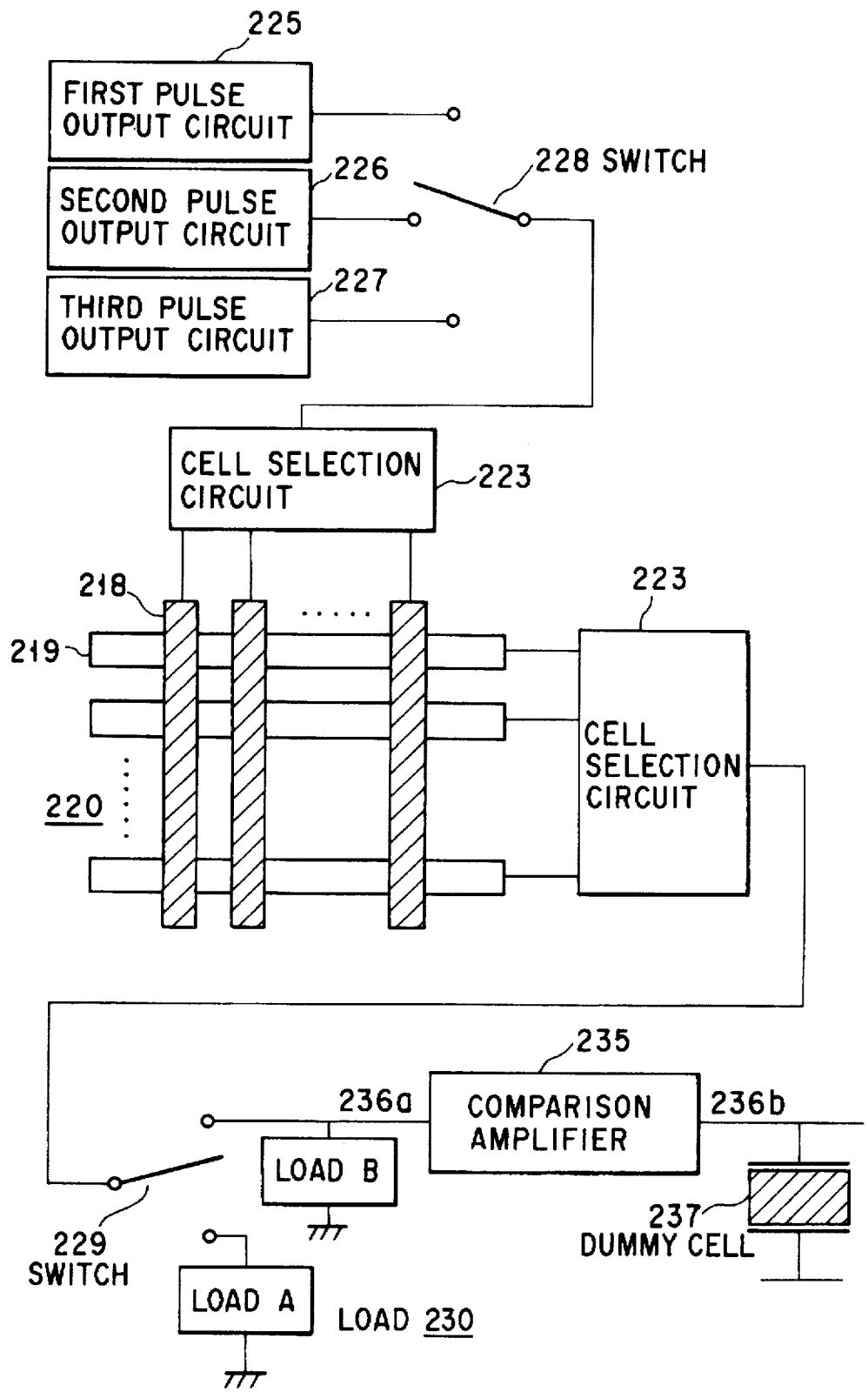
F I G. 44

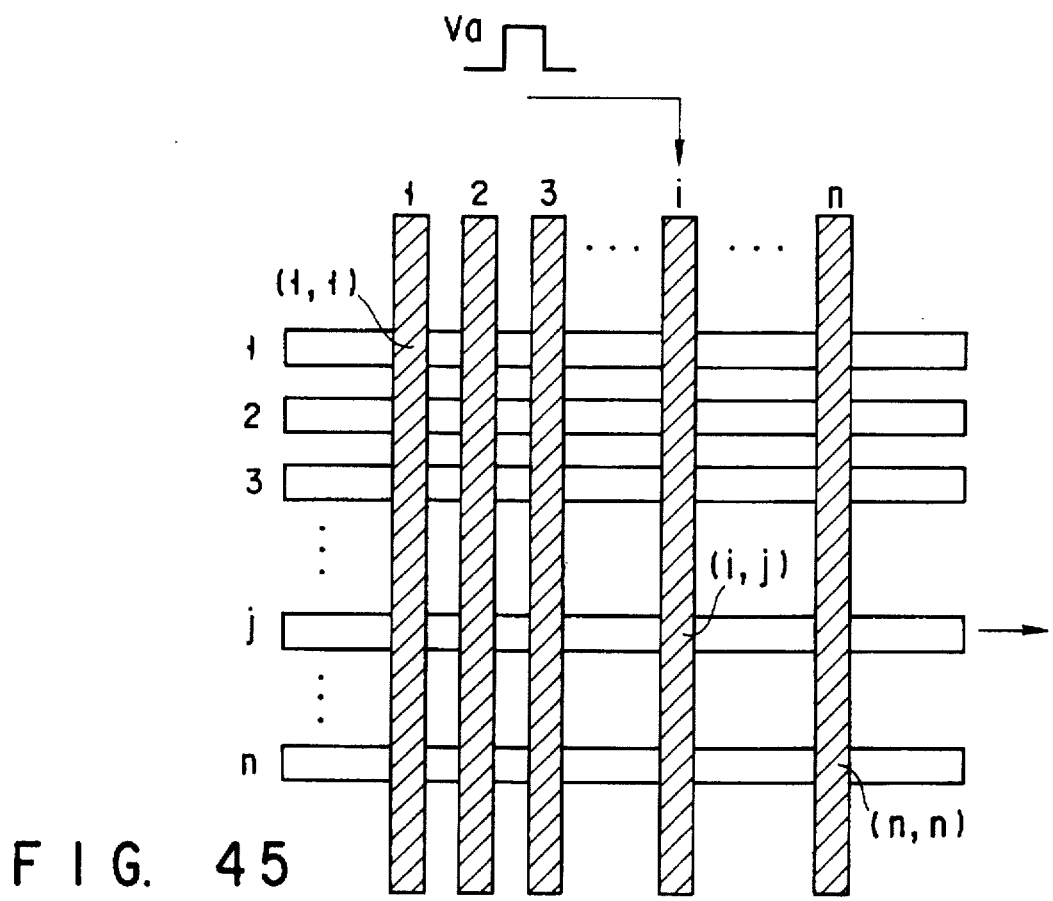
F I G. 45
| SELECTED CELL | $c_{ij}$ | APPLIED VOLTAGE |
|---|---|---|
| | | $V_a$ |
| NON-SELECTED CELL | $C_{ki}$ $k=1\sim n$ (EXCEPT FOR $k=j$) | $V_a \dfrac{(n-1)}{(2n-1)}$ |
| | OTHERS | $V_a \dfrac{1}{(n-1)}$ |
F I G. 46

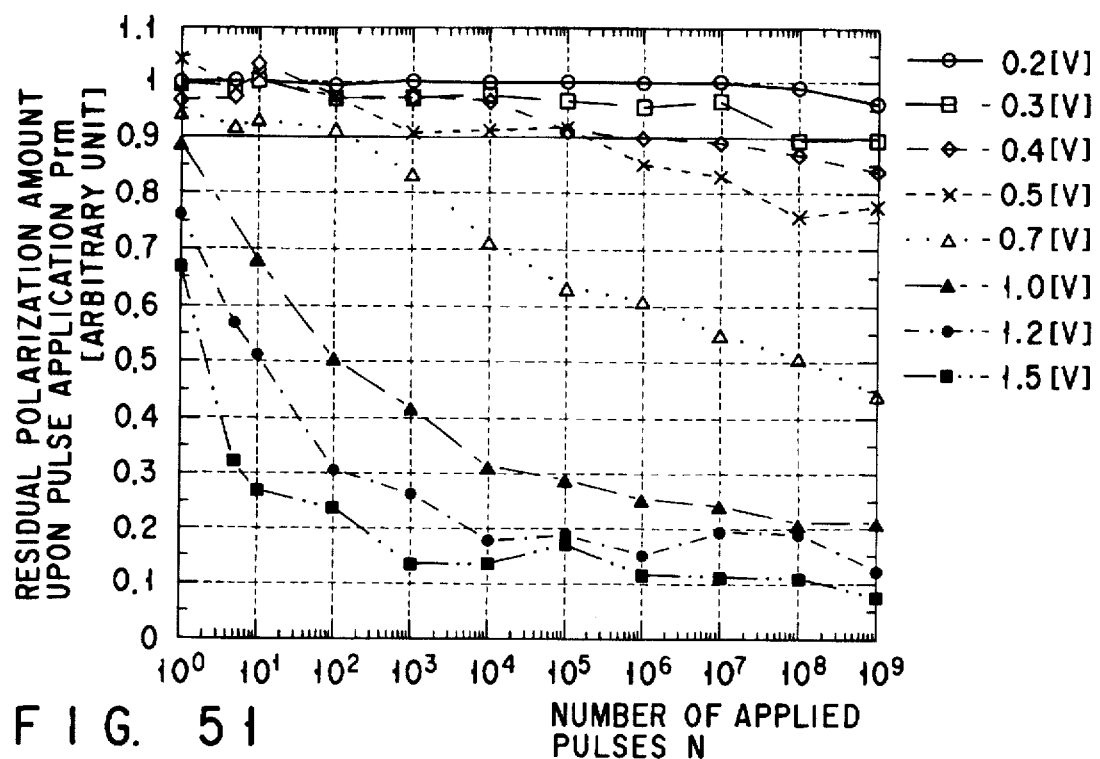
F I G. 51
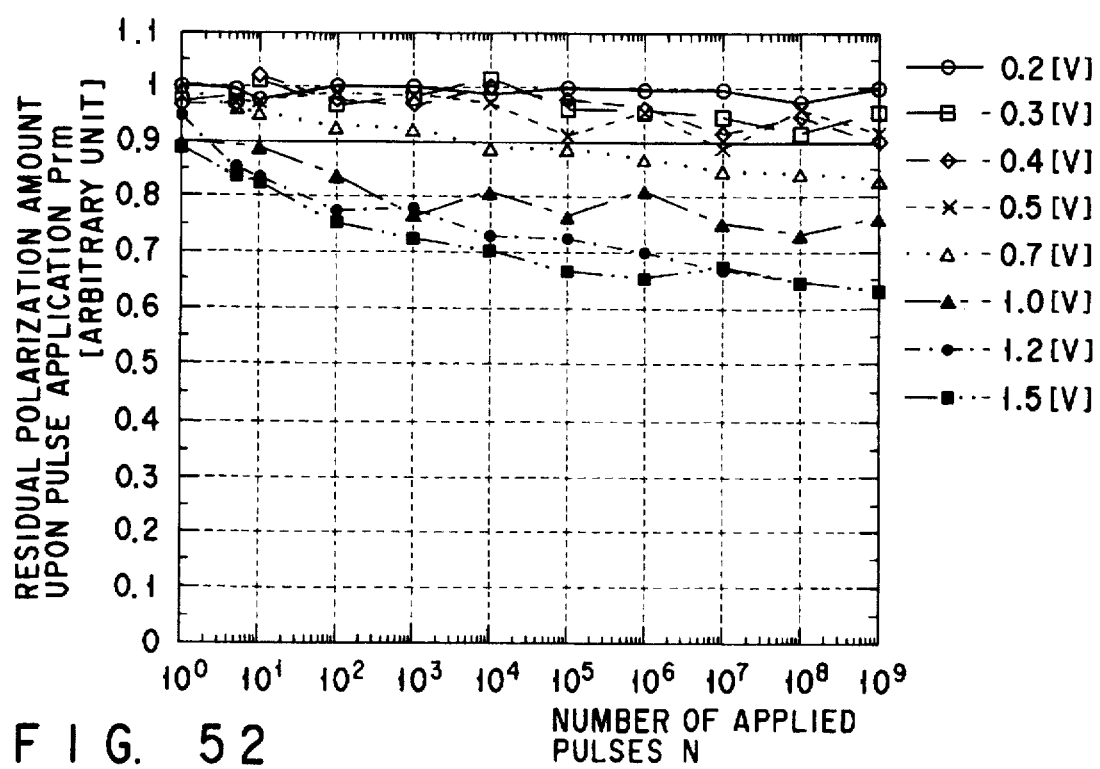
F I G. 52

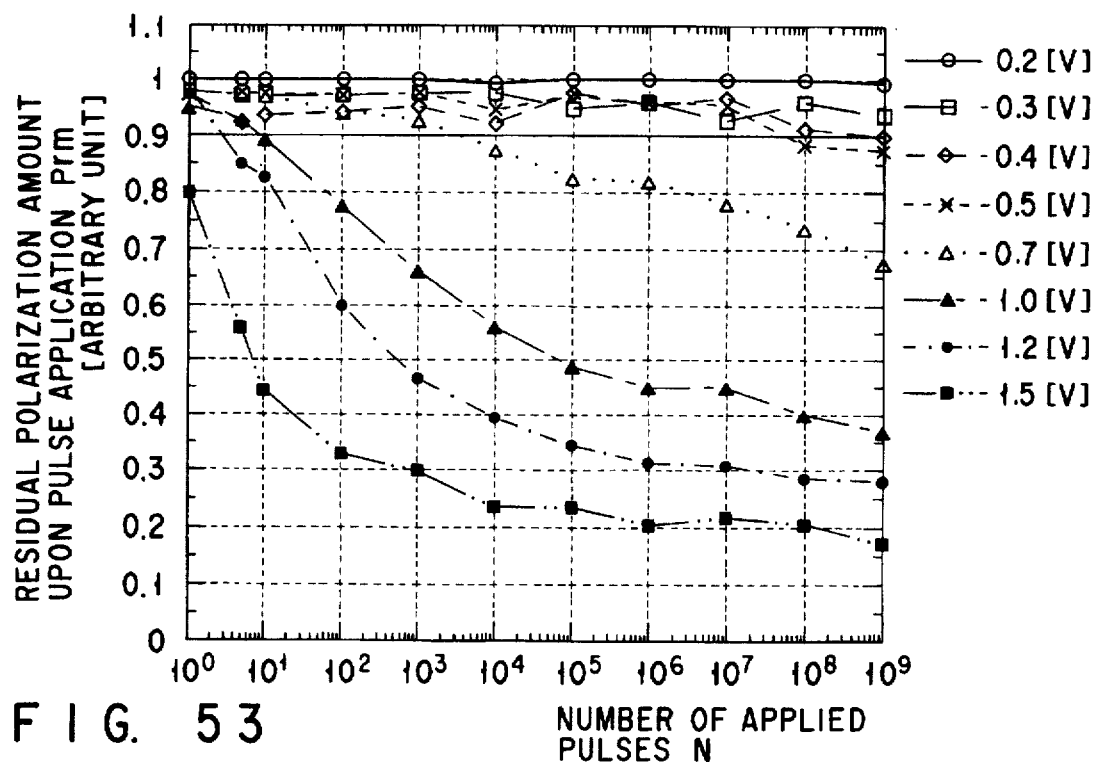
F I G. 5 3
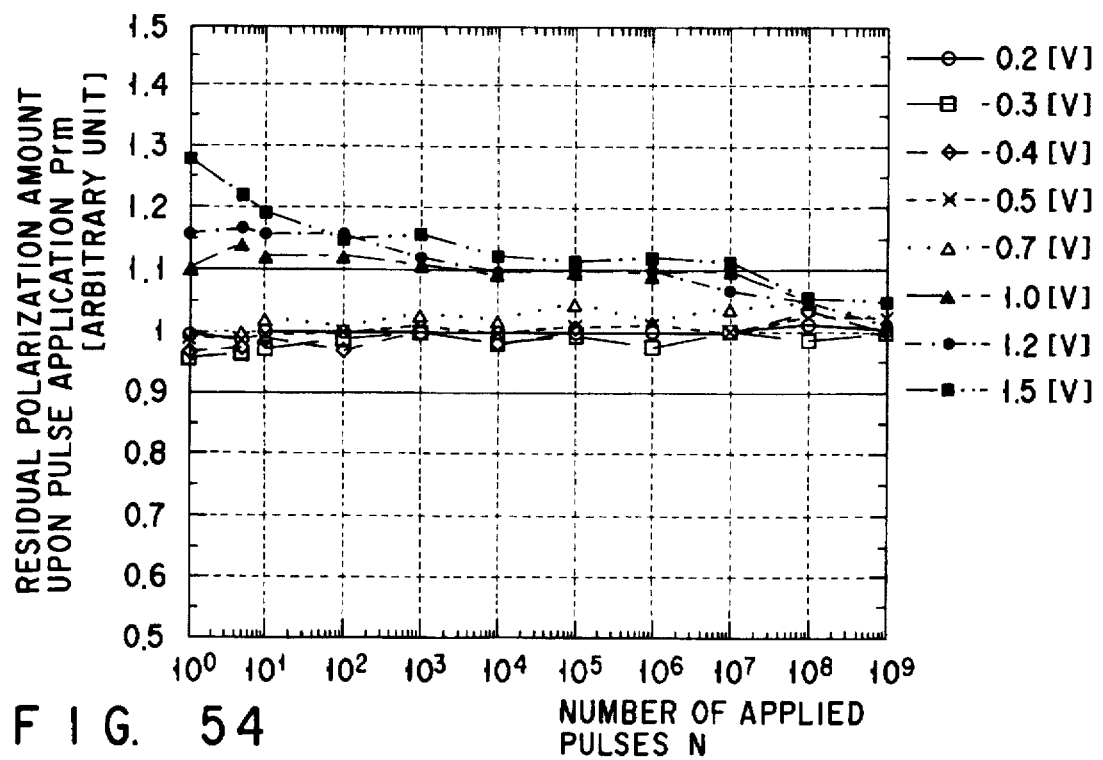
F I G. 5 4

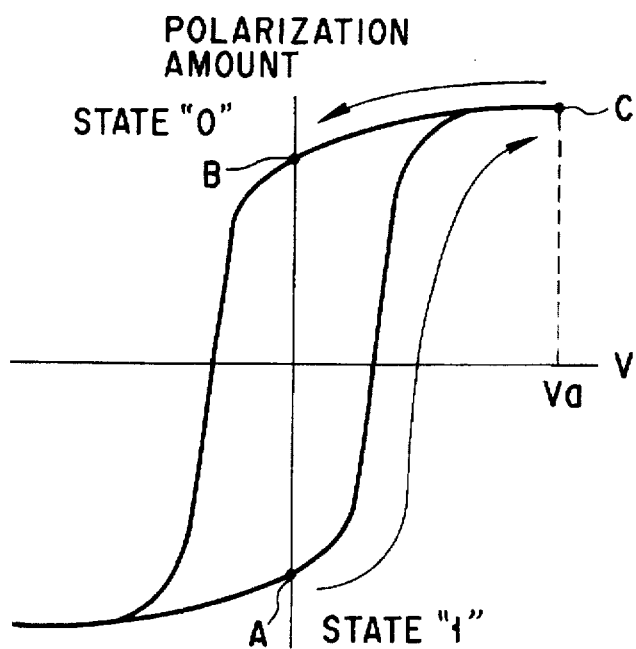
F I G. 55A
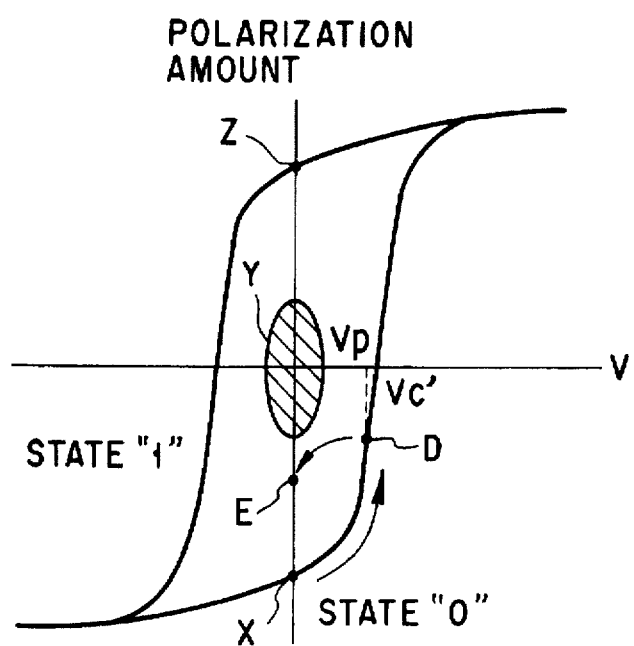
F I G. 55B

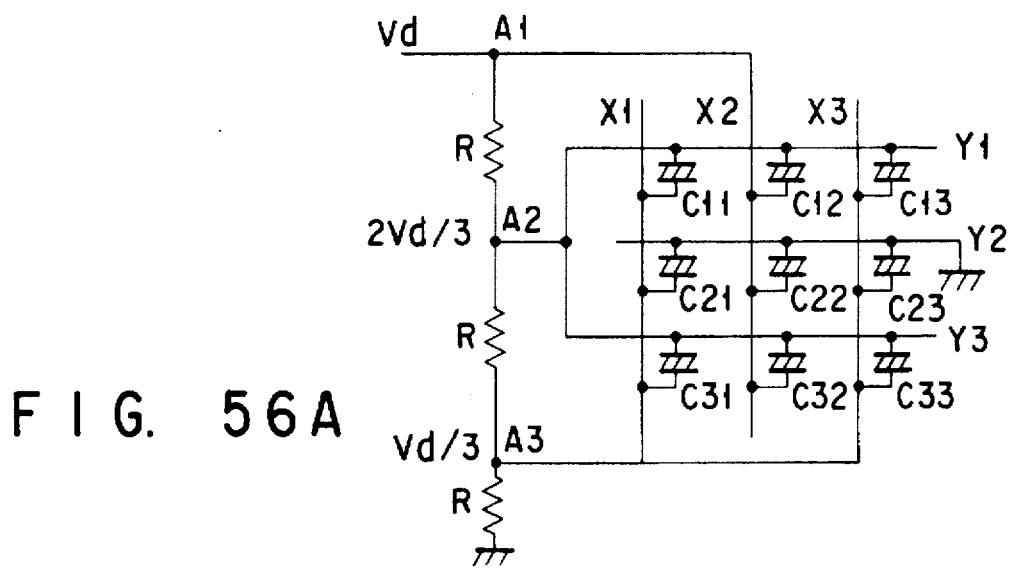
FIG. 56A
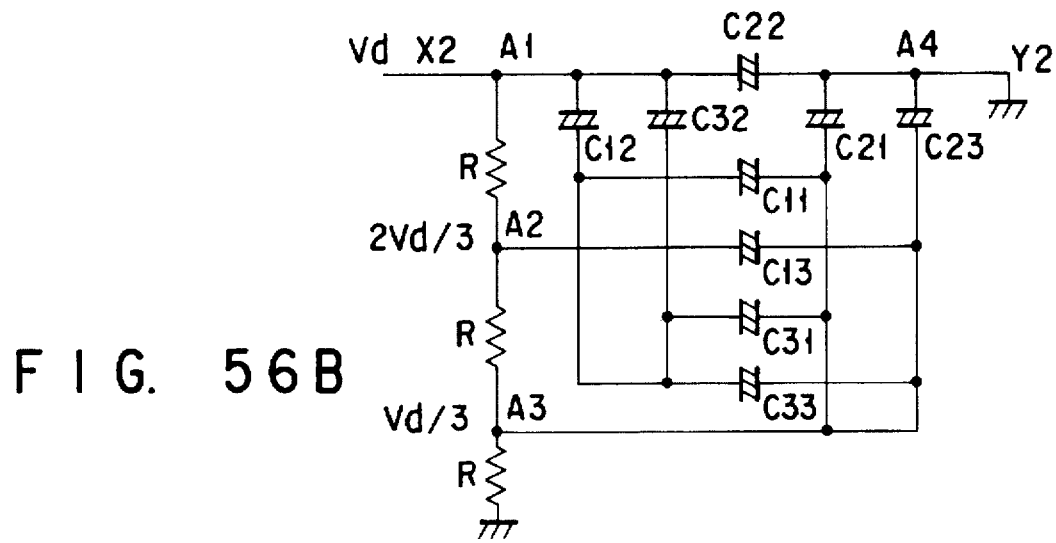
FIG. 56B
| | APPLIED VOLTAGE |
|---|---|
| SELECTED CELL C22 | Vd |
| NON-SELECTED CELL | Vd / 3 |
FIG. 56C

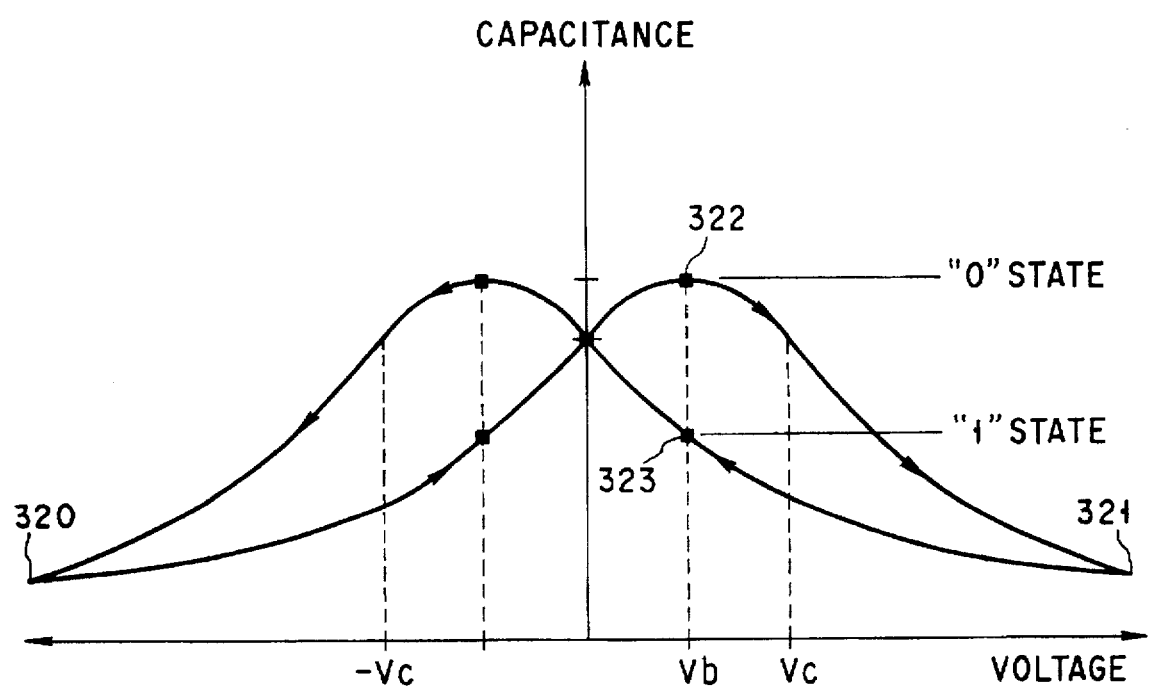
F I G. 59

METHOD OF DRIVING FERROELECTRIC GATE TRANSISTOR MEMORY CELL

RELATED APPLICATION

This is a Continuation-In-Part patent application Ser. No. 08/218,740 filed Mar. 28, 1994, now abandoned.

BACKGROUND OF THE INVENTION

1. Field of the Invention

The present invention relates to a method of driving a ferroelectric gate transistor memory cell and, more particularly, to a nondestructive memory information reading method.

2. Description of the Related Art

Conventionally, ferroelectric materials are known to have hysteresis characteristics which can be used in data recording. FIG. 1 is a graph showing the hysteresis characteristics of a ferroelectric, in which an electric field (or voltage) E is plotted along the abscissa, and a poling amount P is plotted along the ordinate. Referring to FIG. 1, by causing digital signals of "1" and "0" to correspond to two poled states A and C when the voltage is 0 V, respectively, this ferroelectric can be used as a memory.

For example, a signal of "1" is stored in such a ferroelectric to set the poled state A. When a read pulse $E_r$ in the positive direction is applied, the poled state changes from A to B and then returns to C. The amount of charges generated at this time from the ferroelectric to flow into a read circuit (not shown) is $Q_{CB} - Q_{AB} = Q_{SW}$. If the ferroelectric is in the state C with a signal of "0", $Q_{AB} = Q_{BA}$ is established and the total charge amount becomes "0". In this case, the ferroelectric can be used as a memory.

An attempt is described in detail in "Science", J. F. Scott and C. A. P. Araujo, VOL. 246, p. 1400 (1989), in which a very thin ferroelectric film (e.g., about 100 to 400 nm) is formed on a Si wafer to form a memory cell, and a memory unit is constituted by a combination of this memory cell and a transistor for selecting this memory cell.

On the other hand, an attempt has been made in which a ferroelectric film is formed on a semiconductor substrate to control a current or resistance. Such conventional attempts are described in detail Kyoyudentai Hakumaku Shyusekika Gijutsu (Ferroelectric Thin-film Integration Technique) chapter 5, section 3, p. 261 to 274, Science Forum Publishing Co.. In these attempts, a semiconductor is formed on a bulk ferroelectric, or a ferroelectric is formed on an n-type semiconductor as shown in FIG. 2.

In the structure shown in FIG. 2, in accordance with the polarization amount P of the ferroelectric, a charge having a polarity opposite to the polarization amount P appears at the interface of the semiconductor. The shift amount of the threshold voltage $V_{th}$ by the charge by poling is represented as follows.

$$\Delta V_{th} = \frac{2Q_P}{C_{SiO_2}}$$

where $C_{SiO_2}$ represents the capacitance by a gate oxide film, and $Q_P$ represents the amount of charge by poling.

This structure has been known long since. Recently, however, as disclosed in Jpn. Pat. Appln. KOKAI Publication No. 4-192173, a memory constituted by one ferroelectric gate transistor is proposed.

However, in the conventional ferroelectric gate transistor (FGT) having the typical structure in FIG. 2, a voltage must be applied between source and drain to read the charge amount. Since the poling of the ferroelectric is deteriorated by this voltage, nondestructive reading is difficult.

SUMMARY OF THE INVENTION

The present invention has been made in consideration of the above situation, and has as its object to provide a method of driving a ferroelectric gate transistor memory cell, in which a ferroelectric gate transistor can be used as a nondestructive nonvolatile memory having the same write, erase, and read times as in an SRAM or DRAM.

According to one aspect of the present invention, there is provided a method of driving a ferroelectric gate transistor memory cell having a ferroelectric gate transistor structure in which source and drain regions of a second conductivity type are formed on a semiconductor of a first conductivity type, a ferroelectric thin firm is formed on a channel region between the source and drain regions, and a conductive electrode serving as a gate electrode is formed thereon, comprising the steps of erasing memory information by applying a first voltage having a first polarity to the ferroelectric to cause poling in a first direction, writing the memory information, during a write cycle, by applying a second voltage lower than a coercive voltage of the ferroelectric and having a second polarity opposite to that of the first voltage to the ferroelectric, and reading the memory information, during a read cycle, by applying a third voltage lower than the second voltage and having the second polarity to the drain to read out a drain current.

According to another aspect of the present invention, there is provided a ferroelectric gate transistor memory, comprising a ferroelectric gate transistor memory cell having a ferroelectric gate transistor structure in which source and drain regions of a second conductivity type are formed on a semiconductor of a first conductivity type, a ferroelectric thin film is formed on a channel region between the source and drain regions, and a conductive electrode serving as a gate electrode is formed thereon, and control means for erasing memory information by applying a first voltage having a first polarity to cause poling in a first direction, writing the memory information, during a write cycle, by applying a second voltage lower than a coercive voltage of the ferroelectric and having a second polarity opposite to that of the first voltage, and reading the memory information, during a read cycle, by applying a third voltage lower than the second voltage and having the second polarity to the drain to read out a drain current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 15A and 15B are a circuit diagram and a sectional view, respectively, showing the circuit arrangement and the structure of a memory cell in the sixth embodiment of the present invention;

FIGS. 16A and 16B are a circuit diagram and a timing chart, respectively, showing a memory circuit using the memory cell of the fifth embodiment to explain the seventh embodiment of the present invention.

FIG. 21A shows a pulse train used for the FIG. 18 embodiment;

FIG. 21B is a graph pertaining to characteristics of the embodiment of FIG. 18;

FIG. 22A is a pulse used for the FIG. 18 embodiment;

FIG. 22B is a graph pertaining to characteristics of the FIG. 18 embodiment;

FIG. 23A is a circuit diagram for generating pulses used for the FIG. 18 embodiment;

FIG. 23B shows a pulse train produced by the circuit of FIG. 23A;

FIG. 24 is a circuit diagram for a further embodiment of the present invention;

FIG. 28 shows one configuration of the FIG. 27A embodiment;

FIG. 29 shows another configuration of the FIG. 27A embodiment;

FIG. 30A shows a further embodiment of the present invention;

FIGS. 30B shows a sense circuit used in the FIG. 30A embodiment;

FIG. 30C is a timing diagram for the FIG. 30A embodiment;

FIG. 31A is a further embodiment of the present invention;

FIG. 31B is a timing diagram for the FIG. 31A embodiment;

FIG. 32A is a further embodiment of the present invention;

FIG. 32B is a timing diagram for the FIG. 32A embodiment;

FIG. 33A is a circuit used for a read operation;

FIG. 33B shows signals of the circuit shown in FIG. 33A;

FIG. 34A is a further embodiment of the present invention;

FIGS. 34B shows a pulse sequence used in the FIG. 34A embodiment;

FIG. 38 shows an arrangement of a ferroelectric memory device using partial poling;

FIGS. 39–42 are graphs of the characteristics pertaining to FIG. 38;

FIG. 44 is a further embodiment of the present invention;

FIG. 45 shows a matrix of the FIG. 44 embodiment;

FIG. 46 is a table of values for the FIG. 44 embodiment;

FIGS. 51, 52, 53 and 54 show the relationship between an applied voltage for a type of thin film and poling destruction amount;

FIGS. 55A and 55B are graphs showing a difference between a conventional ferroelectric memory and a ferroelectric memory of the FIG. 35 embodiment;

FIG. 56A is an equivalent circuit for the FIG. 44 embodiment.

FIG. 56B is an equivalent circuit for the FIG. 44 embodiment;

FIG. 56C is a table of values pertaining to FIG. 56B;

FIG. 59 shows capacitance v. voltage characteristics of a ferroelectric material.

DETAILED DESCRIPTION OF THE PREFERRED EMBODIMENTS

In order to readily understand the present invention, the principle of the present invention will be described prior to a description of embodiments of the present invention. In a method of driving a ferroelectric gate transistor memory cell of the present invention, a new phenomenon is found and newly applied to solve the above problem and constitute a new memory.

Figure 1:
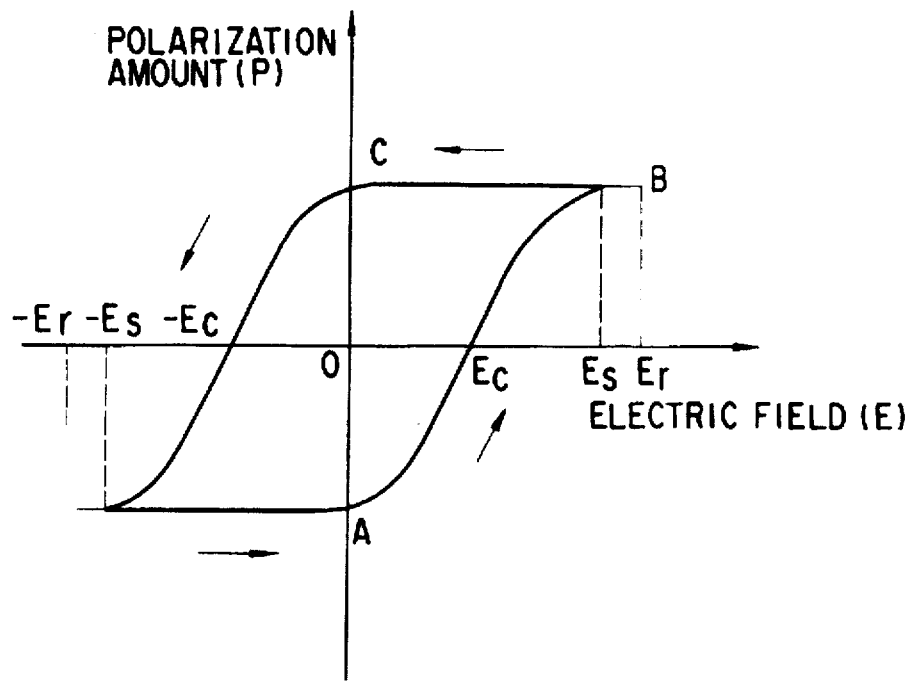
FIG. 1 is a graph showing the hysteresis characteristics of a well-known ferroelectric.
Figure 2:
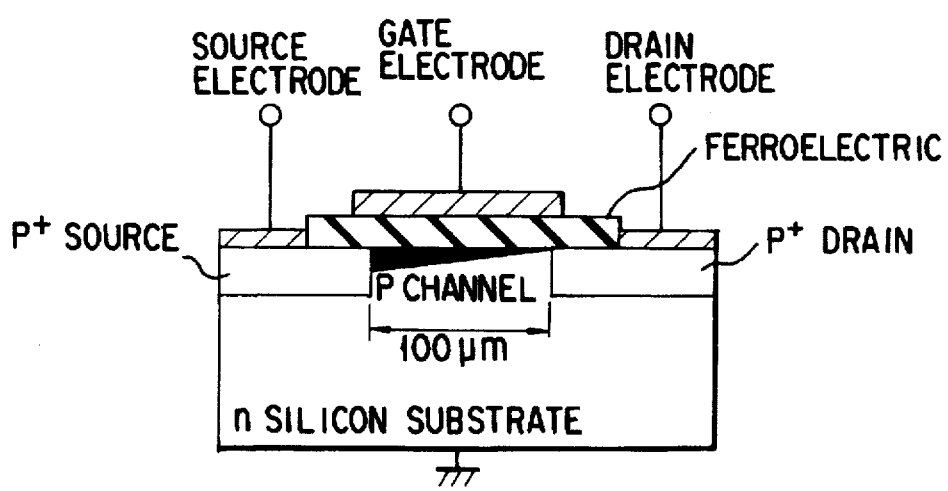
FIG. 2 is a view showing the structure of a conventional ferroelectric gate transistor.
Figure 3:
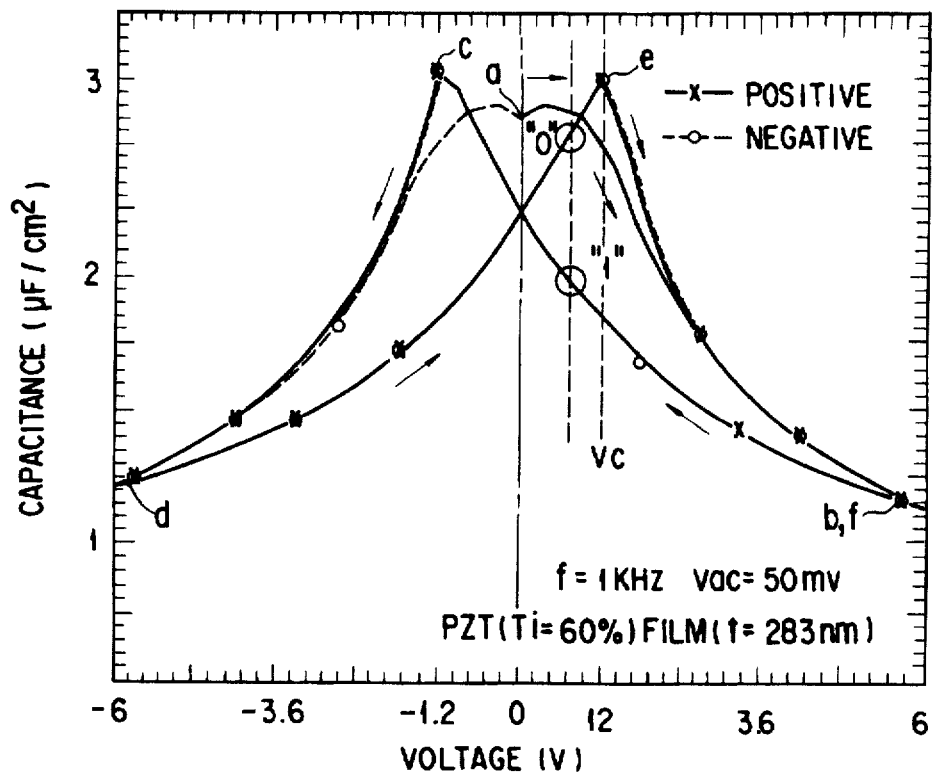
FIG. 3 is a graph showing the capacitance vs. voltage characteristics of a ferroelectric for explaining the principle of the present invention.

FIG. 3 is a graph of the capacitance vs. voltage characteristics of a ferroelectric. As for the capacitance, a waveform superimposed with an AC signal of 1 kHz and 50 mv is applied to the ferroelectric kept applied with a given voltage, and the impedance is evaluated by using an LCR meter.

The voltage is applied in an order of a→b→c→d→e→f, in which a represents an initial state, b represents a poled state in the direction of a top electrode, and d represents a poled state in the direction of a bottom electrode.

The capacitance draws a hysteresis curve having a peak at a coercive voltage $V_C$ of the ferroelectric.

Figure 4:
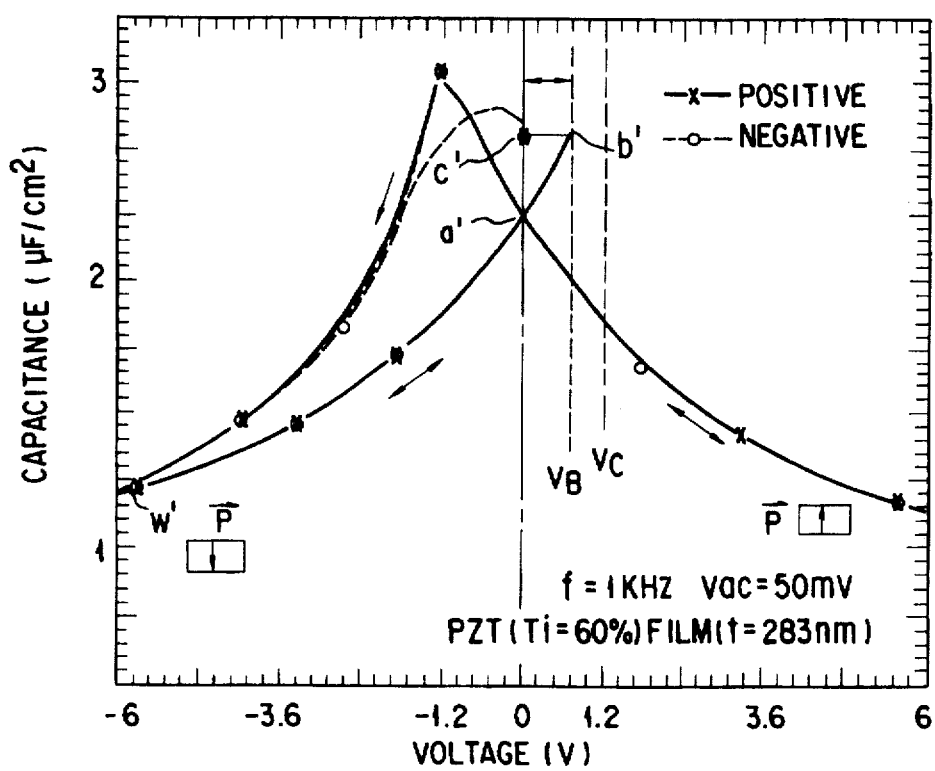
FIG. 4 is a graph showing capacitance vs. voltage characteristics of the ferroelectric for explaining the principle of the present invention, in which a state of partial depoling or partial switching from a poled state is shown.

On the other hand, FIG. 4 shows a state of partial depoling or partial switching from the poled state.

a' represents a zero-biased state after a poled state w'. When the poled state repeatedly changes between a' and w', the hysteresis curve is plotted along the same trace as in an order of a'→w'→a'.

On the other hand, when the poled state is changed from the zero-biased state a' to a poled state b' (this state represents a voltage lower than the coercive voltage $V_C$), the capacitance increases at $V_B$. Even when the voltage is withdrawn, i.e., the zero-biased state is restored, the capacitance keeps a value of a state c' larger than that of the zero-biased state a'. When a voltage is applied from the state c' to the poled state b', i.e., $V_B$, the poled state only changes between c' and b', and no deterioration is observed.

In the present invention, this phenomenon is utilized.

Figure 5A:
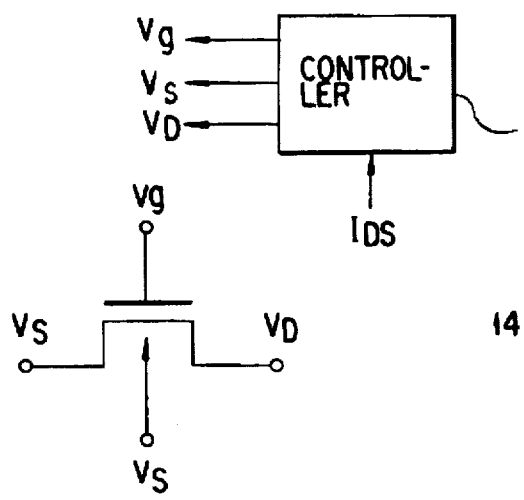
FIGS. 5A to 5C are a circuit diagram, a sectional view, and a timing chart, respectively, showing a ferroelectric gate transistor using the principle of the present invention.
Figure 5B:
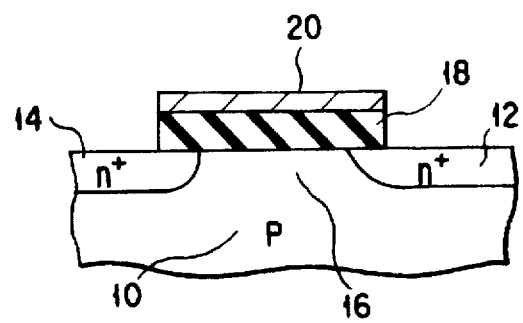
Figure 5C:
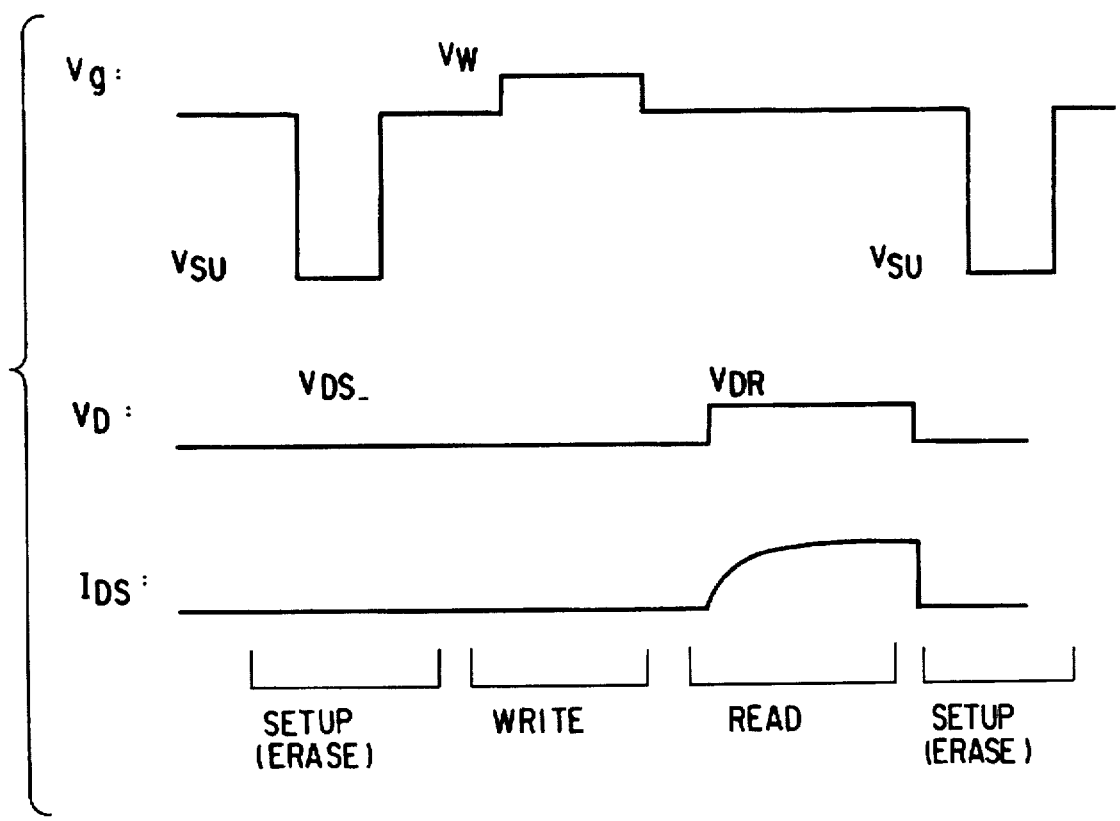

FIGS. 5A to 5C are views showing an actual application of this phenomenon to a device. FIG. 5A shows the circuit diagram, FIG. 5B shows the structure, and FIG. 5C shows the sequence of pulse application in write, erase, and read cycles.

As shown in FIG. 5B, the structure is the same as in the conventional ferroelectric gate transistor (FGT). More specifically, n-type source and drain regions 12 and 14 are formed on a p-type semiconductor (Si) substrate 10, a ferroelectric thin film 18 is formed on a channel region 16 between the source and drain regions 12 and 14, and a conductive electrode 20 serving as a gate electrode is formed thereon to constitute a MOS transistor structure.

A threshold voltage Vth of this MOS transistor is obtained by the following equation.

$$V_{th} = V_{FB} + 2\Psi_B + \frac{\sqrt{2 \cdot \epsilon_S \cdot q \cdot N_A(2\Psi_B + V_{BS})}}{C_i} + \frac{\Delta PA_f}{C_i}$$

$$C_i = \frac{\epsilon_0 \epsilon_f}{d_f} A_f$$

where, $d_f$ represents the thickness of the ferroelectric 18, $A_f$ and $\epsilon_f$ represent the area and dielectric constant of the ferroelectric 18, $\epsilon_S$, $N_A$, $V_{BS}$, and $\Psi_B$ represent the dielectric constant, concentration, substrate voltage, and surface potential of the channel region 16, $V_{FB}$ represents a flat-band voltage, and $\Delta P$ represents inverted poling when a voltage is applied to a point b. The voltage at the point b is preferably equal to or lower than ½ the coercive voltage $V_C$ to ignore the influence of the inverted poling $\Delta P$.

When the dielectric constant $\epsilon_f$ of the ferroelectric 18 changes depending on the state, the threshold voltage $V_{th}$ changes. A change in current is represented by the following expression.

$$I_{DS} \propto I_{DS}^{(0)} \exp\left(-\frac{q\Delta V_{th}}{RT}\right)$$

Therefore, when the dielectric constant $\epsilon_f$ of the ferroelectric 18 increases, a corresponding drain current $I_{DS}$ is output as an amount of change.

Since the ferroelectric 18 has the dielectric constant $\epsilon_f$ as large as 300 to 1,000, when the dielectric constant $\epsilon_f$ changes only 1%, the drain current $I_{DS}$ changes greatly. For this reason, this ferroelectric can be used not only as a memory but also as an analog or neural element.

In the present invention, the conventional change in poling, i.e., inversion of a poling domain is not used. This will be described below with reference to FIGS. 6A to 6C.

Figure 6A:
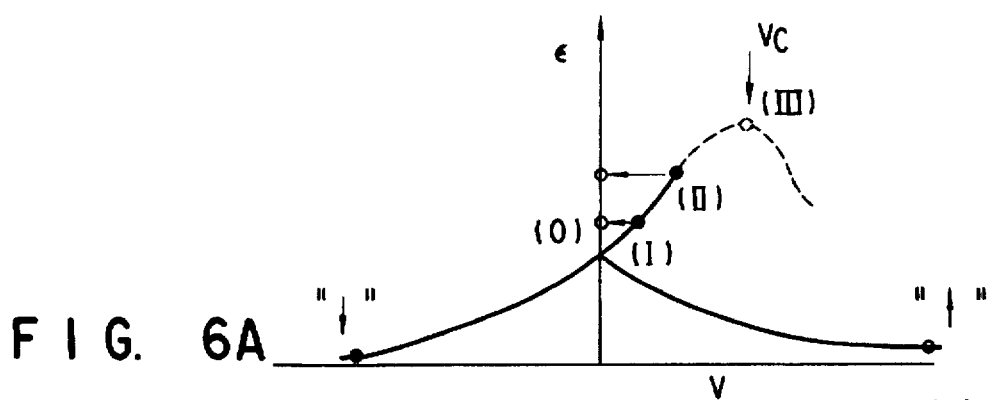
FIGS. 6A to 6C are a graph of C($\epsilon$)-V characteristics of the ferroelectric, a graph of $Q_{SW}$-V characteristics, and a view showing the structures of poling domains, respectively, for explaining the principle of the present invention.
Figure 6B:
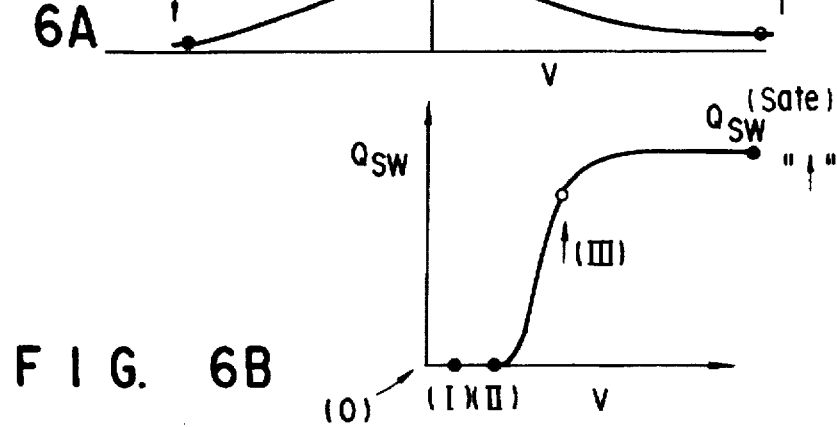
Figure 6C:
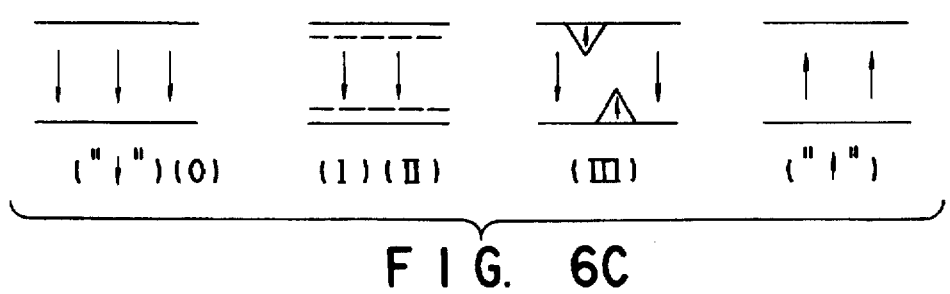

FIG. 6A is a graph of the C-V characteristics, in which the dielectric constant $\epsilon$ vs. V characteristics are shown. FIG. 6B is a graph of the $Q_{SW}$-V characteristics. In this case, the switching charge amount $Q_{SW}$ is twice a remanent polarization amount $P_r$. FIG. 6C is a view showing the structures of poling domains each corresponding to one point in FIGS. 6A and 6B.

A symbol "↓" represents a downward poled state, and a symbol "↑" represents an upward pored state. (0), (I), (II), and (III) represent four states. The states (I) and (II) represent that a slightly "+" (positive) voltage is applied to the cell in the poled state "↓" after writing. The state (III) represents a voltage corresponding to the coercive voltage $V_C$. As is apparent from the graph of the $Q_{SW}$-V characteristics in FIG. 6B, the state (III) represents a point immediately before a point (threshold voltage $V_{th}$) where the switching charge amount $Q_{SW}$ rises. That is, the states (I) and (II) represent poling inversion or inversion without partial switching of the poling domain shown in the state (III).

In the states (I) and (II), although the poled state does not change, the dielectric constant (capacitance) $\epsilon$ greatly changes. This is assumed to be closely related to a relaxation phenomenon in a space-charge region near the surface or grain boundary. The relationship between the space-charge layer on the surface or grain boundary and the C-V characteristics or hysteresis characteristics is disclosed in detail in "Proc. International Symposium of Integrated Ferroelectric - 91", T. Mihara et al., p. 116 (1991).

The relaxed states (I) and (II), or the state (III) of partial switching (which is generally referred to as a partially polarized state) are assumed to be obtained when some relaxing and irreversible process occurs from the strongly restrained state as represented by the state "↓" by an electric field weaker than a coercive electric field $E_C$.

Figure 7:
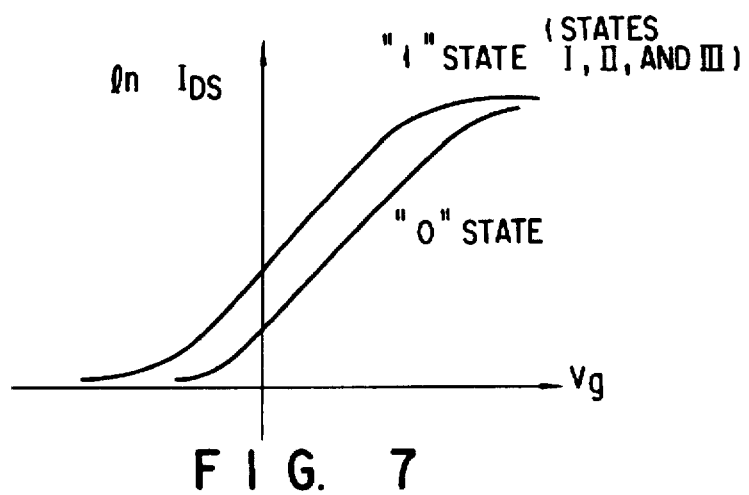
FIG. 7 is a graph of $I_{DS}$-$V_g$ characteristics of the ferroelectric gate transistor in FIG. 5A.

The ferroelectric gate transistor in FIG. 5A, which uses this phenomenon, exhibits the drain current $I_{DS}$ vs. gate voltage $V_g$ characteristics as shown in FIG. 7. In this case, the "0" state represents a downward poled state "↓", and the "1" state represents the states (I), (II), and (III). In an actual application, the states (I) and (II) are preferable. Since in the state (III), partial switching has already occurred, a switching charge amount is produced. This switching charge amount is large at the first pulse and becomes smaller at the subsequent pulses. That is, the drain current $I_{DS}$ at the first pulse is different from those at the subsequent pulses.

FIG. 5C is a view showing a sequence for applying a voltage to the ferroelectric gate transistor by a controller 1 in FIG. 5A. $V_g$ represents the gate voltage, and $V_D$ represents a drain voltage. $V_{SU}$ represents a setup (erase) voltage, $V_W$ represents a write voltage, and $V_{DR}$ represents a read drain voltage.

In the erase cycle, the negative setup voltage $V_{SU}$ is applied as the gate voltage $V_g$. In this case, the drain 14 preferably has the same level as in the source 12 and is in a state of a substrate voltage $V_{SUB}=V_D=V_S$.

In the write cycle, as the gate voltage $V_g$, a voltage lower than the coercive voltage $V_C$ and in the states (I) and (II), or (III) as needed, in FIGS. 6A to 6C is applied. At this time, write access to the ferroelectric 18 is performed to increase the dielectric constant (capacitance) ε. This capacitance ε is preserved even after the voltage is withdrawn.

In the read cycle, the read drain voltage $V_{DR}$ is applied as the drain voltage $V_D$. This read drain voltage $V_{DR}$ must be lower than the write voltage $V_W$. When the read drain voltage $V_{DR}$ is lower than the write voltage $V_W$, the state of the ferroelectric 18, i.e., the dielectric constant (capacitance) ε does not change, and the state of the memory does not change. This makes nondestructive read access possible. The output signal is represented by the drain current $I_{DS}$.

Embodiments of the present invention will be described below with reference to the accompanying drawings.

First Embodiment

Figure 8:
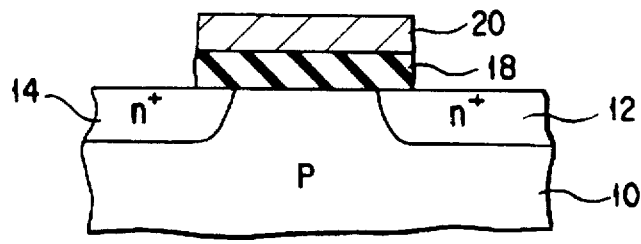
FIG. 8 is a sectional view showing the structure of an n-type ferroelectric gate transistor in the first embodiment of the present invention.
Figure 9:
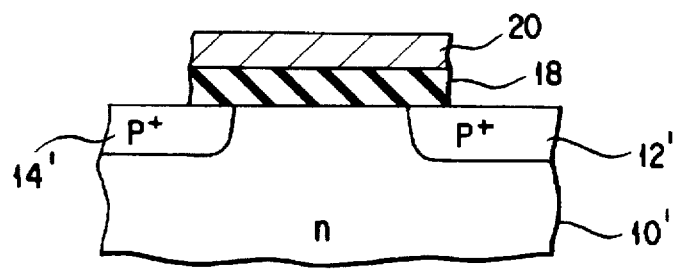
FIG. 9 is a sectional view showing the structure of a p-type ferroelectric gate transistor in the first embodiment of the present invention.
Figure 10:
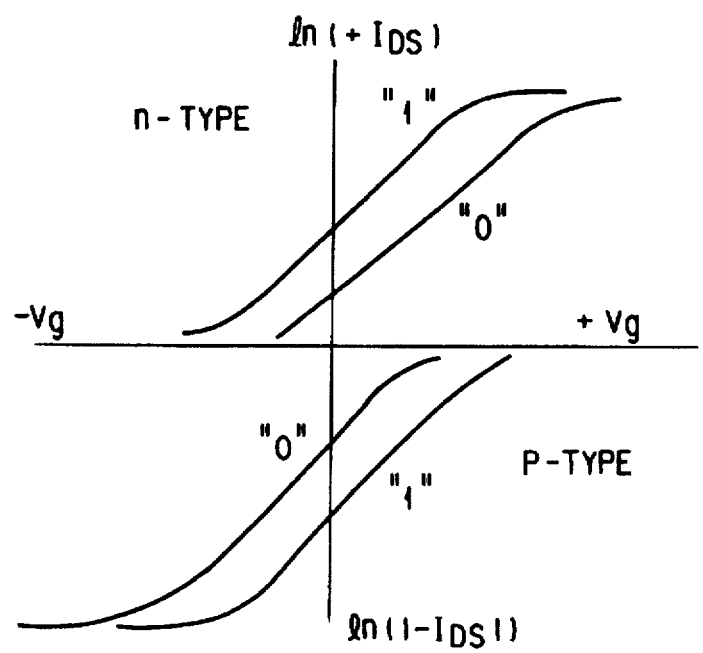
FIG. 10 is a graph simultaneously showing the $I_{DS}$-$V_g$ characteristics of the ferroelectric gate transistors in FIGS. 8 and 9.

FIGS. 8 to 10 are views showing the first embodiment of the present invention.

FIG. 8 is a view showing an n-channel ferroelectric gate transistor (FGT). In this n-type FGT, source and drain regions 12 and 14 serving as n⁺-type heavily doped diffusion layers are formed on a p-type Si substrate 10. In this case, an impurity such as P or As is used at a concentration of $10^{19}$ to $10^{22}$ cm⁻³. $X_j$ (junction layer) preferably has a thickness of 0.5 to 0.1 μm. A ferroelectric 18 is deposited on the resultant structure while keeping cleanness not to form a spontaneous oxide film.

Normally, it is very difficult to directly form the ferroelectric on the Si surface regardless of the material of the ferroelectric 18. More specifically, in the annealing process in oxygen to crystallize the ferroelectric, the Si-ferroelectric interface on the surface is converted into an oxide or silicide. At this time, an undesirable oxide film or a series capacitance is formed to increase the coercive voltage and reduce the polarization amount P of the ferroelectric. For this reason, of ferroelectric materials, a Bi-based ferroelectric having a very stable interface with respect to Si is preferably used. LiNbO₃, LiTaO₃, NaNO₂, BaMgF₄, BiTaO₃, BaTiO₃, (Ba,Sn)TiO₃, of course, PZT, PLZT, or other tungsten-bronze-based ferroelectric may also be used. Any deposition method may be used. The sol-gel method, sputtering, or MOCVD is normally used.

An upper electrode 20 is formed on the ferroelectric 18. In order to most effectively extract the characteristics of this electrode 20, a metal such as Pt or Ag is preferably used and annealed in oxygen. Other materials such as poly-Si, Al, TiN, Ti, and Ta may also be used. A lower electrode (not shown) is formed on the lower surface of the substrate 10.

FIG. 9 is a view showing the structure of the p-type FGT which uses a semiconductor having a polarity opposite to that of the n-type semiconductor in FIG. 8. More specifically, source and drain regions 12' and 14' serving as p⁺-type heavily doped diffusion layers are formed on an n-type Si substrate 10', the ferroelectric 18 is deposited, and the upper electrode 20 is formed thereon.

FIG. 10 is a graph simultaneously showing the drain current $I_{DS}$ vs. gate voltage $V_g$ characteristics of the above n- and p-type FGTs. In this embodiment, a polarization amount P represents not only the change of polarity but also the change in dielectric constant (capacitance) ε itself. For this reason, in the p- and n-type FGTs, the drain current IDS increases at the same rate.

Second Embodiment

Figure 11:
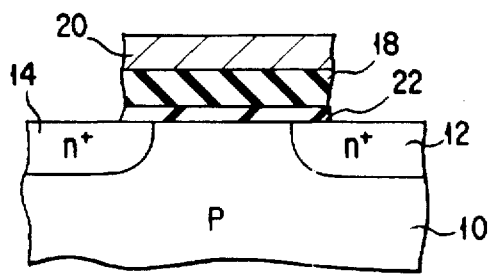
FIG. 11 is a sectional view showing the structure of a ferroelectric gate transistor of the second embodiment of the present invention.

FIG. 11 is a view showing the structure of an FGT of the second embodiment of the present invention. In this embodiment, two ferroelectric layers (18 and 22) are formed.

Normally, a ferroelectric having a Bi-based layered perovskite structure satisfactorily matches with Si. However, a dielectric constant ε is small and a polarization amount P is also small. On the other hand, a Pb-based perovskite ferroelectric such as PZT has a large polarization amount P and a large dielectric constant ε. However, it poorly matches with Si.

For this reason, a Bi-based layered perovskite is used as an underlayer (ferroelectric layer 22), and PZT is formed thereof (ferroelectric layer 18) to constitute a two-layered structure. In this case, when a polycrystalline material is taken into consideration from the beginning, the problem of lattice mismatching is not so serious. However, a ferroelectric having a high crystallization temperature is used as the first layer (22), and a ferroelectric having a low crystallization temperature such as PZT is used as the upper layer (18).

Third Embodiment

Figure 12:
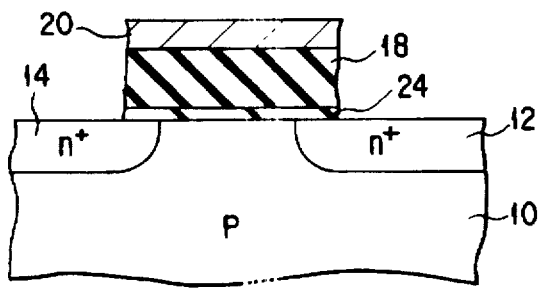
FIG. 12 is a sectional view showing the structure of a ferroelectric gate transistor of the third embodiment of the present invention.

FIG. 12 is a view showing the structure of an FGT of the third embodiment of the present invention. In this embodiment, a dielectric 24 is used in place of the first ferroelectric layer 22 in the second embodiment.

A ferroelectric normally has a dielectric constant ε as large as 200 to 1,000. In order to obtain the Δε effect by relaxation, a dielectric having a large dielectric constant ε must be used. Examples of such a ferroelectric are Ta₂O₅, BST, (Ba,Sr)TiO₃, BaTiO₃, SrTiO₃, and YO₃. Several ferroelectric materials are used as a dielectric in this case.

The thickness of the dielectric film 24 changes in accordance with the dielectric constant ε. In order to maximize the total capacitance of the gate oxide film, the value ε/d must be almost equal to that of a ferroelectric 18.

Fourth Embodiment

Figure 13:
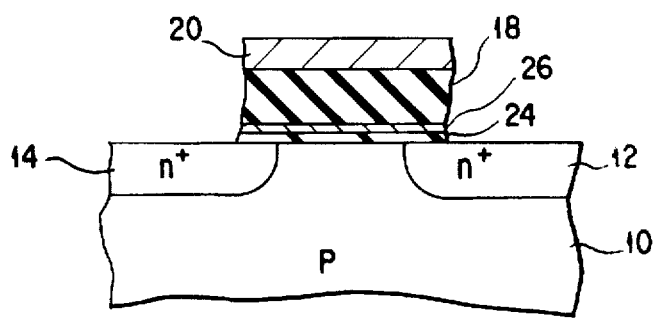
FIG. 13 is a sectional view showing the structure of a ferroelectric gate transistor of the fourth embodiment of the present invention.

FIG. 13 is a view showing the structure of an FGT of the fourth embodiment of the present invention. In this embodiment, a metal 26 is formed on an Si interface through a dielectric 24, and a ferroelectric 18 is formed thereon.

A Pb-based perovskite ferroelectric such as PZT has a polarization amount P as large as 30 µC/cm$^2$, a dielectric constant $\epsilon$ as large as 1,000 or more, and the $\Delta\epsilon$ as large as about 100 to 200. However, in order to enhance this capability at maximum, a refractory noble metal such as Pt or As which is not converted into an oxide or silicide during oxidation is required. For this reason, as shown in FIG. 13, a method of depositing the ferroelectric 18 on the metal 26 is used.

Fifth Embodiment

Figure 14A:
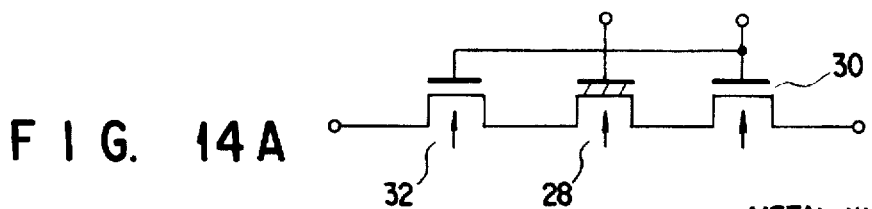
FIGS. 14A and 14B are a circuit diagram and a sectional view, respectively, showing the circuit arrangement and the structure of a memory cell in the fifth embodiment of the present invention.
Figure 14B:
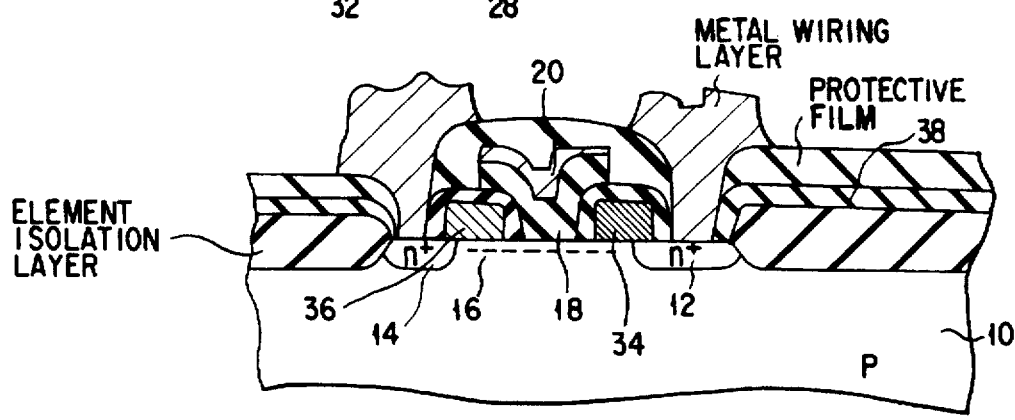

FIGS. 14A and 14B show a memory cell when driving of the memory is also taken into consideration.

FIG. 14A is a view showing the circuit arrangement of the memory cell including an FGT 28 and two path gate transistors (MOSFETs) 30 and 32. FIG. 14B shows a detailed example of the device structure (memory cell). More specifically, after two path gates 34 and 36 of poly-Si are formed, the poly-Si is oxidized to form SiO$_2$ (protective film) 38. SiO$_2$ between the two gates 34 and 36 is removed and a ferroelectric 18 is formed on the exposed portion. That is, a compact self-aligned memory cell is manufactured.

Sixth Embodiment

FIG. 15A is a view showing the circuit arrangement of a memory cell including an FGT 28 and a path gate transistor 30. FIG. 15B is a view showing the structure for realizing the memory cell. This memory cell has a structure simpler than that of the fifth embodiment, and a detailed description thereof will be omitted.

Seventh Embodiment

FIG. 16A is a view showing a memory circuit. The structure of the above fifth embodiment is used as memory cell 40.

Figure 16B:
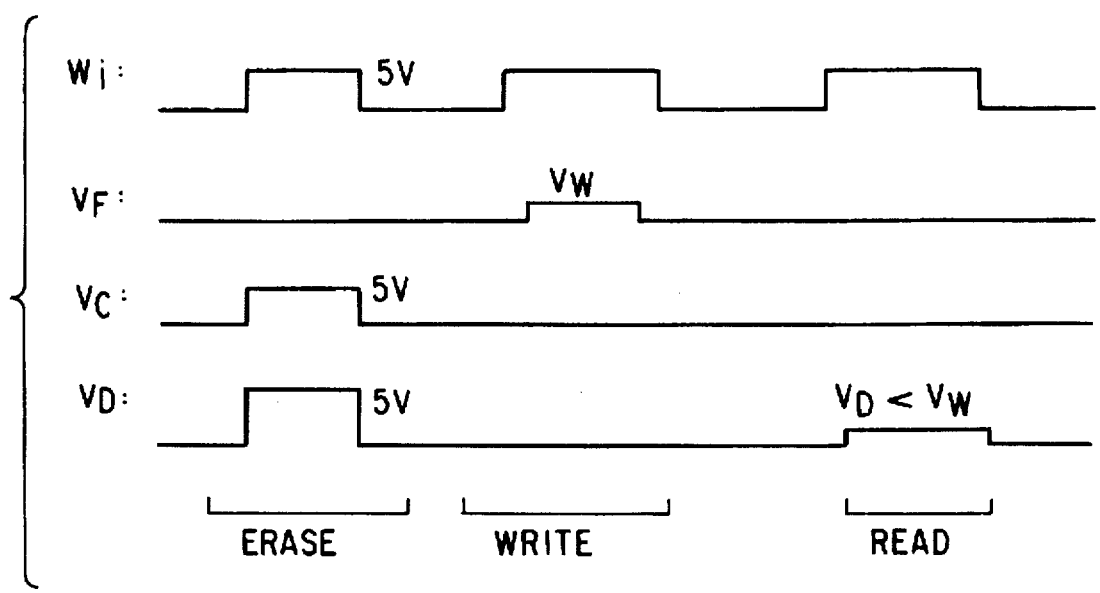

FIG. 16B is a timing chart. Selection of the memory cell is performed by selecting a row selection line W$_i$ and a column selection line D$_j$. Erasing in the memory is determined by a gate voltage V$_F$, a source voltage V$_C$, and a drain voltage V$_D$ after the row selection line W$_i$ is selected. Writing is performed by slightly applying a write voltage V$_W$ to the gate voltage V$_F$ after the cell 40 is selected by the row selection line W$_i$ and the column selection line D$_j$. In reading, after the cell 40 is selected by the row selection line W$_i$ and the column select D$_j$, the voltage V$_D$ (apparently lower than the write voltage V$_W$) on the column selection line D$_j$ is detected as a current by a sense amplifier 42.

Eighth Embodiment

Figure 17:
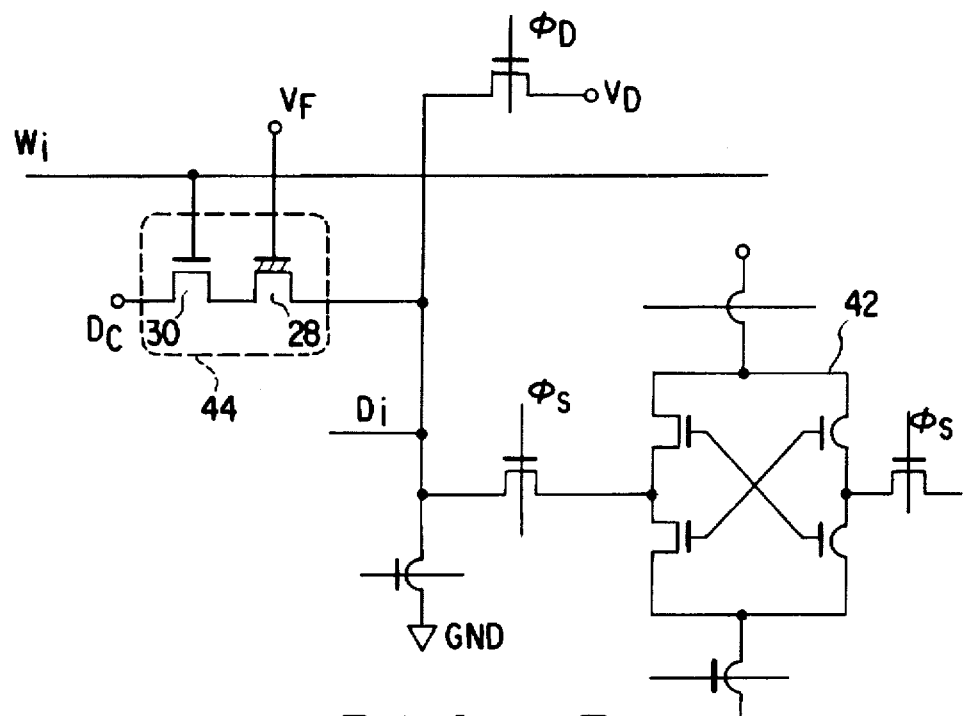
FIG. 17 is a circuit diagram showing the circuit arrangement of a memory circuit using the memory cell having the structure of the sixth embodiment to explain the seventh embodiment of the present invention.

FIG. 17 is a view showing a memory circuit when a memory cell is further simplified, i.e., a memory cell 44 having the structure of the sixth embodiment is used. In this case, all bits in the column direction are erased at the same timing.

As has been described above in detail, according to the present invention, there is provided a method of driving a ferroelectric gate transistor memory cell in which a ferroelectric gate transistor can be used as a nondestructive nonvolatile memory having the same write, erase, and read times as in an SRAM or DRAM.

In the embodiments described so far, the ferroelectric memory is constituted by a ferroelectric gate transistor memory in which a gate electrode is formed on a ferroelectric substance provided on a silicon substrate and which utilizes a partially polarized state. In the embodiments which will be described below, a partially polarized state is utilized in a simple-structure ferroelectric memory wherein a ferroelectric substance is sandwiched by a pair of electrodes.

Other embodiments of the present invention will be described below.

Recently, electronic equipments have been greatly developed, and particularly a high-density memory device with high performance has been required along with the development of computers and image devices. External memory devices such as a magnetic tape, a floppy disk, and a magneto-optical disk, and semiconductor memories such as a DRAM, an SRAM, an EPROM, an EEPROM, and a flash memory have met this expectation. In the near future, a compact memory with higher performance which is 1) non-volatile, 2) driven at a high speed and a low voltage, 3) a solid-state memory free from driving will be required due to a fusion of multimedia and a computer, but the current memory technique cannot cope with this requirement.

Figure 57:
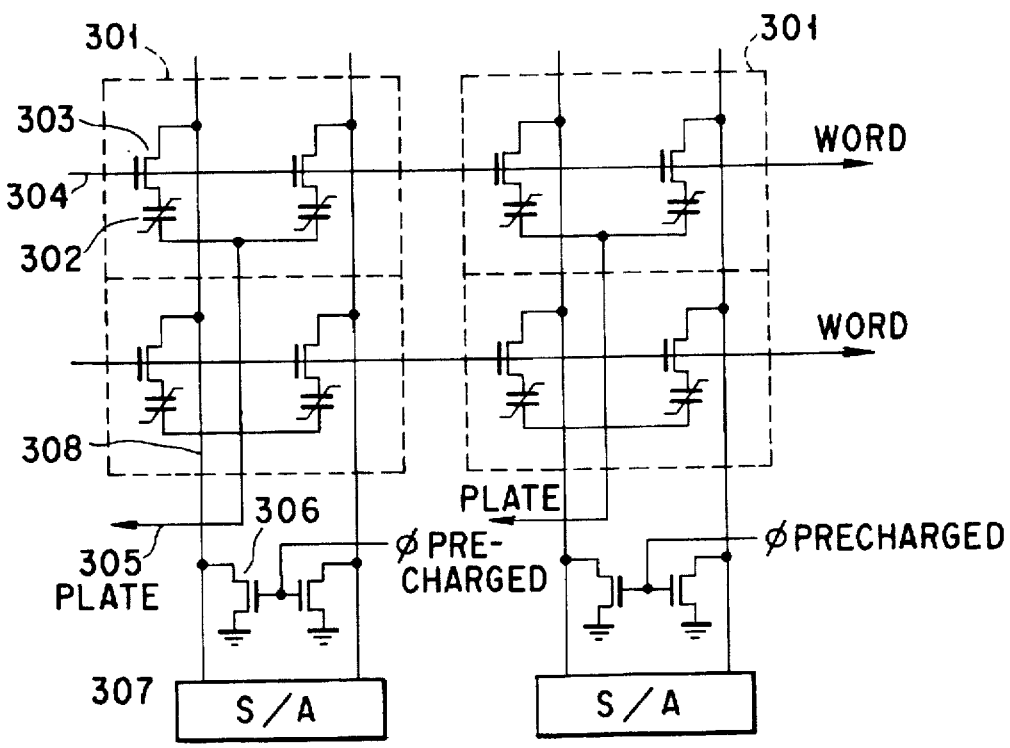
FIG. 57 shows a prior art ferroelectric memory circuit.

As a memory which meets this requirement, a ferroelectric memory as disclosed in U.S. Pat. No. 4,873,664 (S. Sheffield Eaton Jr., Colorado Spring, Colo.) is considered. FIG. 57 shows the first embodiment disclosed in this patent. A ferroelectric thin film capacitor 302 in each of memory cells 301 is a ferroelectric capacitor having an arrangement in which the ferroelectric thin film capacitor 302 is driven by an FET 303 serving as a switching element, in place of a storage capacitor of a DRAM system. Each memory cell 301 is connected to a word line 304, a plate line 305, and a bit line 308. A read operation is performed by a sense amplifier (S/A) 307. In this case, since the memory cells 301 are arranged on an Si device, the degree of integration and the cost of this memory are almost equal to those of a DRAM semiconductor memory or a flash memory. Therefore, this memory is inconvenient in manufacturing, e.g., a memory card of several 100 Mbytes.

Figure 58:
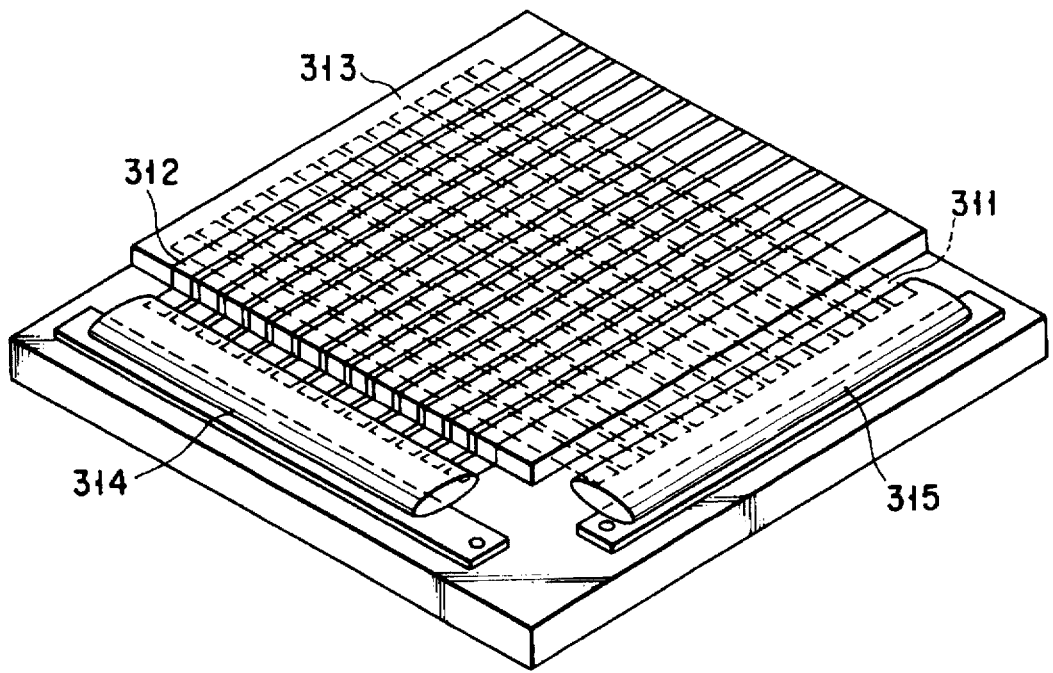
FIG. 58 shows a prior art matrix structure for a memory using a ferroelectric material.

In contrast to this, a method disclosed in U.S. Pat. No. 5,060,191 is a method of forming a simple matrix structure using a ferroelectric material 313, and detecting a signal by read driving circuits 314 and 315, as shown in FIG. 58. The memory constituted by the simple matrix has a serious problem of interference between cells. That is, when a voltage V$_a$ is applied in selecting a cell, and performing write/read operations, this voltage is also applied to non-selected cells. As the number of cells is increased, a voltage V$_a$/2 is undesirably applied to non-selected cells connected to an electrode line at input and output sides of the selected cell. In U.S. Pat. No. 5,060,191, e.g., a voltage V$_a$/3 is set to be applied to non-selected cells while the voltage V$_a$ is applied to a selected cell, thereby performing a write operation. In a read operation, a voltage having a low impedance is read out, and noise from the non-selected cells is cut off. If, however, the voltage V$_a$ required for inverting poling of the selected cell is applied, the voltage V$_a$/3 is applied to the non-selected cells many times, and this application destructs poled states of the non-selected cells.

In U.S. Pat. No. 5,140,548 (C. J. Brennan), it is considered that both of a space charge layer and a neutral domain are present in a ferroelectric to produce capacitance vs. voltage characteristics as shown in FIG. 59. According to this patent, a voltage V$_b$ equal to or lower than a coercive voltage V$_{th}$ is applied to a state 320 obtained by writing data at a negative voltage, and a state 321 obtained by writing data at a positive voltage, and capacitances are measured using AC signals superposed on these states. With this operation, two capacitances 322 and 323 are respectively obtained in states "1" and "0", and "1" or "0" is discriminated in accordance with a difference between the two capacitances. Therefore, upon a write operation, the read voltage $V_b$ is applied with a time constant longer than a relaxation time of a space charge, and an AC waveform having a frequency component faster than the relaxation time is applied to perform a read operation without changing a poled state.

Drawbacks of the above conventional techniques are as follows. First, although a combination of the memory and a semiconductor shown in FIG. 57 is relatively easily realized, the degree of integration and the cost of the memory are equal to those of a DRAM due to using a switching element and an FET. In the ferroelectric memory having a simple matrix arrangement shown in FIG. 58, assurance of the ferroelectric memory against poling destruction is not disclosed in detail. If the method shown in FIG. 59 employs a simple matrix arrangement, this method using a capacitance change also has the same problem as that shown in FIG. 58 in a write operation. In a read operation, if the read operation is to be performed at a high S/N ratio, a read voltage $V_b$ having a certain magnitude must be applied many times, and this application changes poling. For this reason, a nondestructive read operation cannot be performed.

Figure 18:
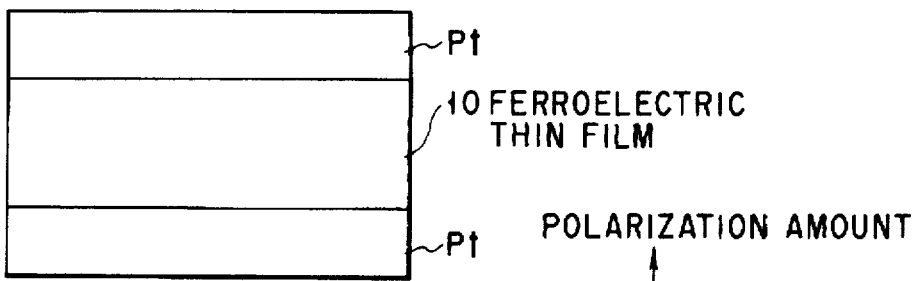
FIG. 18 shows a further embodiment of the present invention.
Figure 19A:
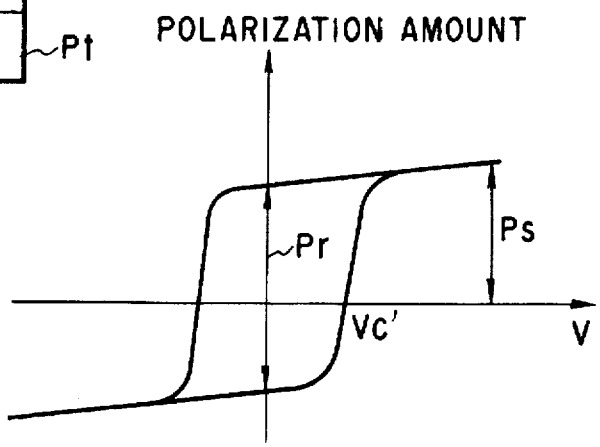
FIG. 19A shows the hysteresis characteristics of the embodiment of FIG. 18.
Figure 19B:
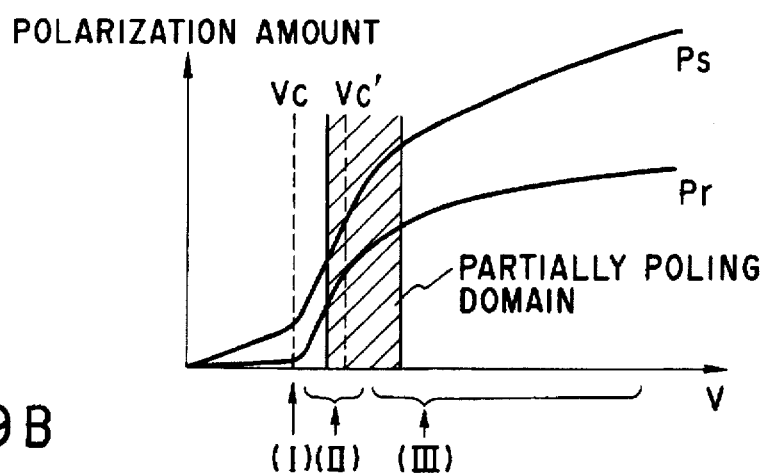
FIG. 19B shows a relationship between the hysteresis characteristics and a polarization amount with respect to an applied voltage.

In order to solve the above drawbacks, first, the ninth embodiment of the present invention will be described with reference to FIGS. 18 to 23. As shown in FIG. 18, a ferroelectric thin film 10 is interposed between two electrodes Pt consisting of platinum and the like. When a voltage is applied to the electrodes, a polarization amount with respect to the applied voltage nonlinearly changes to represent hysteresis characteristics shown in FIG. 19A. FIG. 19B shows a relationship between the hysteresis characteristics and a polarization amount with respect to an applied voltage. The hysteresis characteristics are generally measured by using a continuous sine wave having about 1 KHz or a triangular wave. $P_r$ is defined as a residual polarization amount, $P_s$ is a saturation polarization amount, and a difference between $P_s$ and $P_r$ is a back switching. $V_c$, is a coercive voltage obtained from the hysteresis characteristics, and $V_c$ is a coercive voltage obtained from $P_r$ vs. V characteristics. The two voltages do not always coincide but have almost the same value. The coercive voltage $V_c$, is defined as a voltage when poling is 0, and the coercive voltage $V_c$ is defined as an intermediate voltage between a voltage when poling is completely destructed and a voltage when poling is not destructed.

A domain (I) is a domain in which poling is not inverted, i.e., changed from a poled state set in the first direction by the first pulse, a domain (III) is a domain having a poled state obtained by inverting the poled state set in the first direction to almost the second direction, and a domain (II) is a partially poled state. The partially poled state means a poled state having a mixed state of poling in the first direction and poling in the second direction.

Figure 20A:
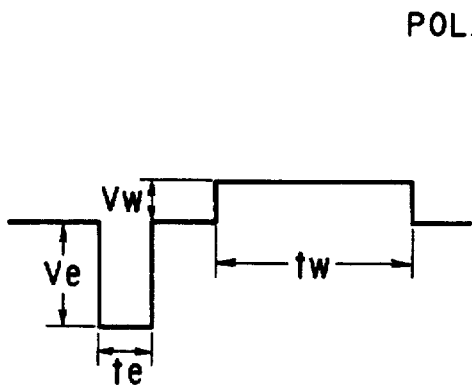
FIG. 20A shows a pulse used for forming a partially poled state.
Figure 20B:
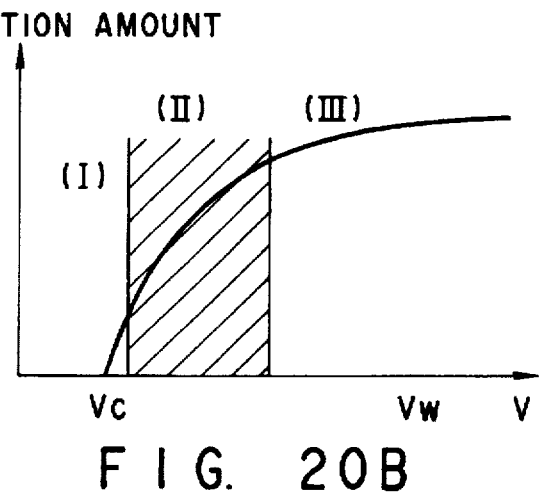
FIG. 20B is a graph obtained by evaluating a polarization inversion amount during the pulse of FIG. 20A.

FIGS. 20A and 20B show a method of forming this partially poled state using a single pulse. First, as shown in FIG. 20A, a state is poled sufficiently in the negative direction using the first pulse having a pulse width $t_e$ and a pulse height $V_e$. Thereafter, the second pulse having a pulse height $V_w$ and the pulse width $t_w$ five times a switching time $t_s$ of the ferroelectric thin film 10 or more is applied. FIG. 20B is a graph obtained by evaluating a polarization inversion amount at this time. (I), (II), (III) are the same domains as in FIG. 19B. In this case, the domain (II) is highly stable upon application of the second pulse having the pulse width $t_w$.

FIG. 21B is a graph showing a relationship between the number of applied pulses and a charge amount obtained by applying the third pulse having a pulse height of $V_r$, upon application of the first and second pulses using the pulse height $V_w$ as a parameter. Also, FIG. 21B shows results obtained when the pulse height $V_w$ is changed 0.3 to 1.5 times the coercive voltage $V_c$ of the ferroelectric thin film 10, and the number of pulses is changed to 1 to $10^4$. Referring to FIG. 21B, a hatched domain is a partially poled domain. When the pulse height $V_w$ has the same magnitude as that of the coercive voltage $V_c$, if the pulse width $t_w$ is set to ⅓ the switching time $t_s$, pulse application about 3 to 30 times can cause partial poling.

FIG. 22 shows this by being organized using the pulse height $V_w$ and the pulse width $t_w$. The poling of the ferroelectric thin film 10 can be set in a partially poled state by the second pulse having the pulse width $t_w$ and the pulse height $V_w$ represented by a hatched portion in FIG. 22B.

As described above, the ferroelectric thin film 10 interposed between the pair of electrodes Pt is used as a memory cell. The first pulse having a voltage higher than the coercive voltage $V_{th}$ of the ferroelectric thin film 10 is applied to the ferroelectric thin film 10, and the state of the ferroelectric thin film 10 is poled to a poled state in the first direction of two spontaneous poled states. Then, the second pulse having a voltage with a polarity opposite to that of the first pulse is applied to the poled state. With this operation, a partially poled state in which the domain having the poled state in the first direction and the domain having the poled state in the second direction opposite to the first direction are mixed can be formed stably.

The arrangement and operation of a ferroelectric memory device for generating partial poling will be described below with reference to FIGS. 23A and 23B. FIG. 23A is a circuit diagram, in which reference numeral 13' denotes a first pulse generation circuit for generating a first pulse; 14', a second pulse generation circuit for generating a second pulse; 15', a third pulse generation circuit for generating a third pulse; 11 and 12, switches; 10, the ferroelectric thin film; 16, a load capacitor used except for a read operation; 17, a load capacitor in the read operation; and 18, a sense circuit.

FIG. 23B shows a pulse train. In FIG. 23B, reference numeral 13 denotes a first pulse; 14, a second pulse; and 15, a third pulse. These pulses are selected by changing the switch 11. The ferroelectric thin film 10 is set in a poled state in the first direction (negative direction) by the first pulse 13, and then set in a partially poled state by the second pulse 14. A relationship between the pulse height $V_w$ and the pulse width $t_w$ at this time must satisfy the above conditions of manufacturing partial poling (FIGS. 22A and 22B). For this purpose, preferably, the magnitude $V_w$ (absolute value) of the second pulse 14 is set to 0.3 to 2 times the coercive voltage of the ferroelectric thin film 10. Alternatively, the magnitude $V_e$ (absolute value) of the first pulse 13 and the magnitude $V_w$ (absolute value) of the second pulse 14 satisfy $V_w \leq V_e$, the pulse width $W_w$ of the secondpulse 14 is 1% to 300% the pulse width $W_e$ of the first pulse 13, and preferably the pulse width $W_w$ of the second pulse 14 and the pulse width $W_e$ of the first pulse 13 satisfy $W_w \leq W_e$. Under these conditions, a partially poled state whose polarization amount is 10% to 90% the polarization amount of the first poled state can be formed stably.

A read operation is performed by applying the third pulse 15, and detecting the response of the third pulse 15. The third pulse 15 is fundamentally the same as the second pulse 14, or even if its pulse width and height are different from those of the second pulse 14, the third pulse 15 is a pulse having a value defined by the hatched portion in FIG. 22B. In a poling setting operation or a write operation, the switch 12 is fixed to the load capacitor 16 or at a low impedance. In a read operation, the switch 12 is fixed to the relatively large load capacitor 17. The capacitance of this load capacitor 17 is desirably set to 5 to 100 times the capacitance of the ferroelectric thin film 10, i.e., it must suppress the fluctuation amount of a signal flowing into the sense circuit 18 as small as possible to obtain a proper signal for detection. The sense circuit 18 may be an operational amplifier, or a low-impedance amplifier such as an emitter follower, or a cathode follower.

Here, a poled state set by the first pulse generation circuit 13' is defined as data "0", and a poled state set by the second pulse generation circuit 14' is defined as data "1". Since change amounts of the poled states by applying the third pulse 15 differ from each other, the resultant charge amounts also differ from each other. By discriminating a difference between the obtained amounts, data "1" and "0" can be identified, and two values of data "1" and "0" can be stored in accordance with the poled state in the first direction and the poled state of partial poling. The memory which can be read-accessed in this manner can be realized.

According to the above ninth embodiment, the pulse having a polarity opposite to that of the first pulse 13 is applied in the write operation. With this operation, not a completely poled state but a very stable, partially poled state can be formed. Since the partially poled states "1" and "0" have different capacitances even at a voltage of 0 V, these can be read out in a zero-biased state, thereby performing a read operation in a completely nondestructive state.

In the write operation, the second pulse 14 having a polarity opposite to that of the first pulse 13 and a pulse height 0.3 to 2 times the coercive voltage is applied. With this operation, the partially poled state in which the poled state in the second direction is mixed can be stably formed without completely inverting the poled state in the first direction.

Also, in the write operation, the second pulse 14 having a polarity opposite to that of the first pulse 13 and the voltage $V_w$ having a magnitude (absolute value) smaller than that of the applied voltage $V_e$ is applied. With this operation, the partially poled state in which the poled state in the second direction is mixed can be stably formed without completely inverting the poled state in the first direction.

In addition, in the write operation, the second pulse 14 having a polarity opposite to that of the first pulse 13 and a pulse width of 1% to 300% the pulse width of the first pulse is applied. With this operation, the partially poled state in which the poled state in the second direction is mixed can be stably formed without completely inverting the poled state in the first direction.

Further, in the write operation, the second pulse 14 having a polarity opposite to that of the first pulse 13 and a pulse width satisfying $W_w \leq W_e$ is applied. With this operation, the partially poled state in which the poled state in the second direction is mixed can be stably formed without completely inverting the poled state in the first direction.

Still further, a partially poled state having a polarization amount of 10% to 90% the polarization amount of the first poled state is set. With this operation, this partially poled state has a difference between capacitances in accordance with the partially poled states "1" and "0" even at a voltage of 0 V, thereby identifying data "1" and "0".

By detecting a difference between the first poled state and the partially poled state as a difference between capacitances, the amplitude of the third pulse may be small, i.e., a voltage applied to the ferroelectric thin film 10 can be low, thereby preventing the poled state from being destructed.

The 10th embodiment of the present invention will be described below. A third pulse 15 in the 10th embodiment has the same polarity as that of a second pulse 14. If the third pulse 15 having a polarity opposite to that of the second pulse 14 is applied to perform a read operation, the change rate of poling increases. Therefore, the resultant charge amount increases, and an S/N ratio for a read operation is increased. In addition, the third pulse 15 having a pulse width longer than a set time required for a normal operation of a sense circuit 18 for detecting a read signal is used. With this arrangement, a read operation can be performed while the sense circuit 18 is in the normal operation domain. Therefore, an erroneous read operation can be avoided. Further, the third pulse 15 having a pulse height 0.3 times or less the coercive voltage of a ferroelectric thin film 10, or a pulse height or width smaller than that of the second pulse 14 is used. Therefore, destruction of poling caused by a read operation does not occur. That is, the ferroelectric memory in which poling is kept unchanged and a storage state is kept upon the read operation can be provided.

According to the above 10th embodiment, data is read out using the third pulse 15 having a polarity opposite to that of the second pulse 14 to read stored data "1" and "0" at a high S/N ratio. Moreover, data is read out using the third pulse 15 having a pulse width longer than the set time of the sense circuit 18. With this operation, since a read operation can be performed while the sense circuit 18 is in a normal operation state, an erroneous read operation can be avoided. That is, the ferroelectric memory which can perform the read operation at a high S/N ratio can be realized.

Since data is read out using the third pulse 15 having a pulse height 0.3 times or less a coercive voltage $V_c$ of the ferroelectric thin film 10, a poled state of the ferroelectric thin film 10 is not destructed by the read operation.

Moreover, in the read operation, the third pulse 15 having a pulse height or width smaller than that of the second pulse 14 is applied. With this operation, the poled state of the ferroelectric thin film 10 is not destructed.

The 11th embodiment of the present invention will be described below. According to the 11th embodiment, a difference between the first poled state and a partially poled state is detected as a difference between capacitances using a third pulse 15 as an AC signal having a baseline in a zero-biased state. With this arrangement, unlike a conventional method of superposing an AC waveform on a DC bias, the maximum value of a voltage to be applied to a ferroelectric thin film 10 is decreased by an amount corresponding to the DC bias. Therefore, a poled state, i.e., a storage state of the ferroelectric thin film 10 need not be destructed. Preferably, the maximum value of an amplitude is set to 0.3 times or less a coercive voltage $V_c$ of the ferroelectric thin film 10 to improve nondestructive characteristics.

FIGS. 21A and 21B show the results of measuring a change in poling of a ferroelectric thin film consisting of $SrBi_2Ta_2O_9$ with respect to an applied voltage. In the case of the ferroelectric thin film, a coercive voltage obtained by a hysteresis curve depends on the thickness of this ferroelectric thin film. In contrast, in this embodiment, the thickness of the ferroelectric thin film is 200 nm, and the coercive voltage is about 0.6 to 0.8 V. In a case of an applied voltage of 0.2 V or less, when a pulse is applied to this film $10^{10}$ times, poling is kept. That is, if a voltage is 0.3 times or less the coercive voltage, poling is not destructed even if a pulse is applied at least $10^{10}$ times. In other words, assuming pulse application $10^{10}$ times, a read operation must be performed by applying 0.2 V. Therefore, according to the conventional method of applying a DC bias in addition to an excitation voltage of an AC waveform for reading out a capacitor, poling of the ferroelectric thin film cannot be read out in a nondestructive manner.

The third pulse 15 is caused to have a rise time $t_r$ longer than the set time of the sense circuit 18. With this arrangement, a read operation can be performed while the sense circuit 18 is in a normal operation domain, thereby avoiding an erroneous read operation.

According to the above 11th embodiment, data is read out using the third pulse 15 as an AC signal having a baseline in a zero-biased state to prevent the poled state of the ferroelectric thin film 10 from being destructed.

Further, data is read out using the third pulse 15 as an AC signal having a baseline in a zero-biased state and the maximum amplitude value 0.3 times or less the coercive voltage to prevent the poled state of the ferroelectric thin film 10 from being destructed.

The 12th embodiment of the present invention will be described below with reference to FIGS. 24 and 25. The 12th embodiment applies a simple matrix arrangement to the above ferroelectric memory. Upper and lower electrodes of a ferroelectric thin film 10 are constituted by first and second striped electrodes 130 and 131. Reference numeral 32 denotes switches between a write/read operation and a poling setting operation by a poling setting circuit 40. In this case, all the first striped electrodes 130 and 131 are electrically connected to each other, and the same voltage $-V_e$ is applied to the electrodes. Therefore, a poling setting operation is performed at once.

Write circuits 33 are used for applying a voltage $V_w$ only to a selected cell. For example, a voltage $V_w/2$ and 0 V are applied to a selected line and non-selected lines of X-lines, respectively. A voltage $-V_w/2$ and 0 V are applied to a selected line and non-selected lines of Y-lines, respectively. With this operation the voltages $V_w$, 0 V, and the voltage $V_w/2$ are applied to the selected cell, the non-selected cells connected to the selected line, and other non-selected cells, respectively. A voltage $V_w/3$ and 0 V are applied to the selected line and the non-selected lines of the X-lines, respectively. The voltage of 0 V and a voltage $2V_w/3$ are applied to the selected line and the non-selected lines of the Y-lines, respectively. With this operation the voltages $V_w$, and $\pm V_w/3$ are applied to the selected cell and the non-selected cells, respectively. Therefore, only the low voltage of $V_w/2$ or $V_w/3$ is applied to the non-selected cells, and poling of the non-selected cells are not destructed.

Figure 25A:
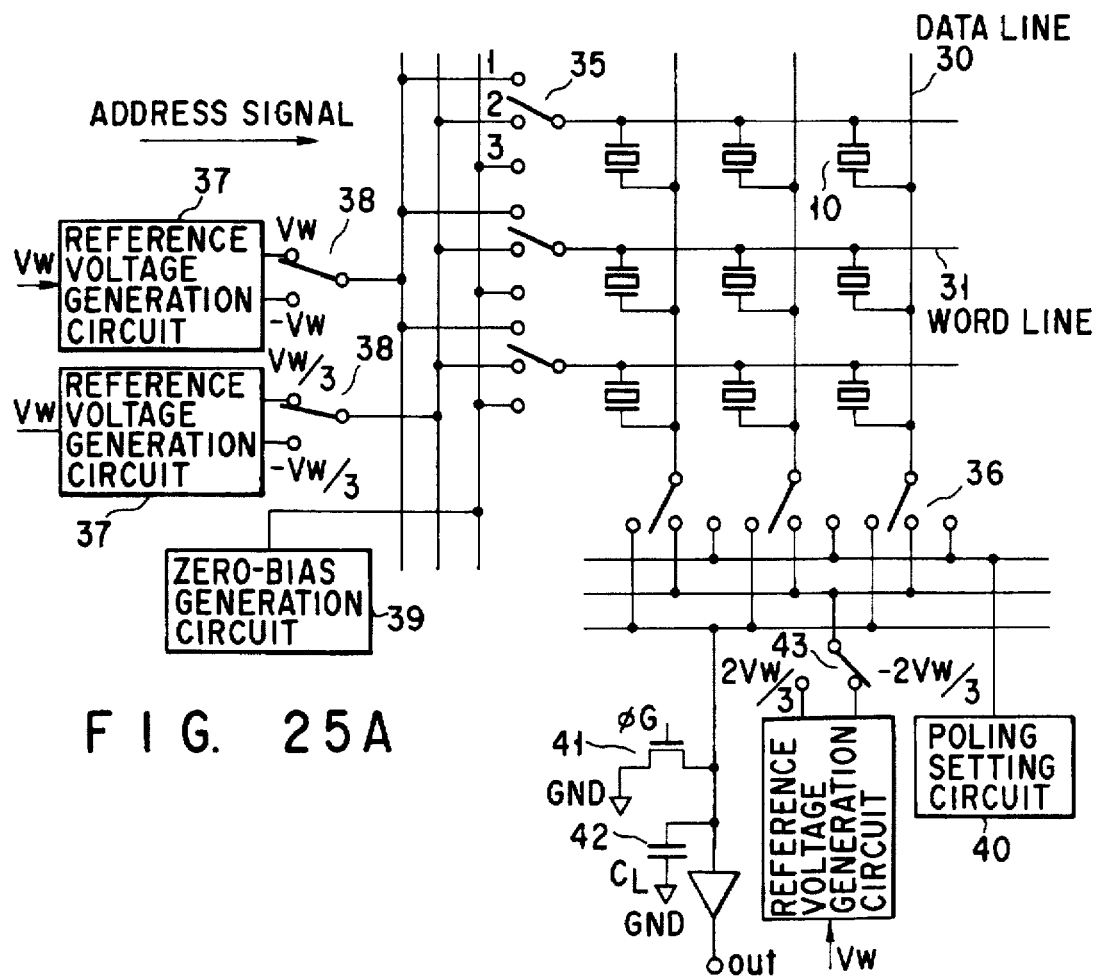
FIG. 25A provides more detail of the FIG. 24 arrangement.

FIG. 25A is a circuit diagram showing the arrangement in FIG. 24 in more detail. In FIG. 25A, reference numerals 35 and 36 denote switches for poling set, write, and read operations; and 38, switches for write and read operations. This embodiment will be described in accordance with a ⅓ method. Reference numeral 37 denote reference voltage generation circuits, which generate, e.g., the voltages $\pm V_w/3$ from the voltage or voltages $\pm 2V_w/3$ from the voltage $V_w$.

Figure 25B:
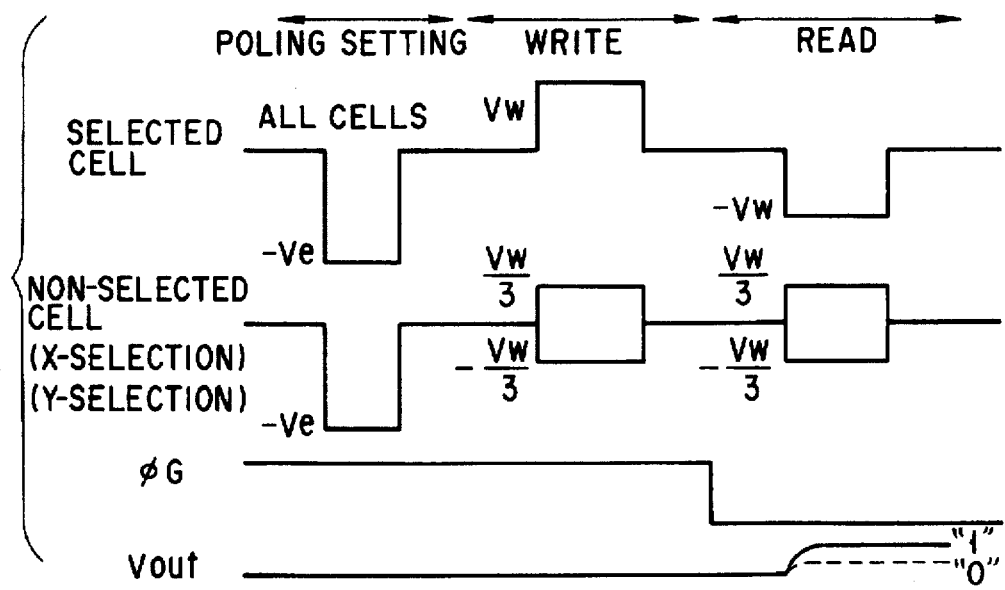
FIG. 25B shows signals used in the FIG. 24 embodiment.

In FIGS. 25A and 25B, as for a poling setting operation, a zero-bias generation circuit 39 and the poling setting circuit 40 are connected by the switches 35 and 36, and a first pulse 13 having a magnitude $V_e$ is applied to all the memory cells at once. Then, as for a write operation, the second pulse 14 is applied as in the ⅓ method in FIG. 24. The voltages $V_w$ and switches 36 and a switch 40. Then, the voltages $V_w$ and $V_w/3$ are selected by the switches 35 and 38, and the voltage $2V_w/3$ and 0 V are selected and applied by the switches 36 and a switch 40. Then, the voltages $V_w$ and $V_w/3$ are applied to the selected cell and the non-selected cells, respectively.

It is important that a magnitude $V_w$ and a pulse width $t_w$ of the second pulse 14 satisfy the conditions shown in FIG. 22. Preferably, the second pulse 14 has the pulse width $t_w$ about 2 to 5 times a switching time $t_s$, and the magnitude $V_w$ about 1.2 to 1.5 times a coercive voltage $V_c$, and a partially poled state having a polarization amount about 20% to 60% a polarization amount in the first direction is set. Thereafter, in a read operation, $\phi_G$ is disabled by a transistor 41, the switches 36 are changed, and data lines 30 are set in an open state. Note that electric charges are prestored in a load capacitor ($C_L$) 42 to keep a potential stable. The capacitance of the load capacitor 42 at this time is desirably about 5 to 100 times that of a load capacitor 10.

Thereafter, the switches 38 and 43 are changed for the read operation. That is, a third pulse 15 is applied in the following manner. The selected line is fixed at a voltage $-Vr$, and the non-selected lines are fixed at a voltage $-Vr/3$. Of the data lines 30, the selected line is fixed at a potential of 0 bias (accurately at a potential of the load capacitor 42), and the non-selected lines are fixed at a potential of $-2Vr/3$. In this manner, the voltages $-Vr$ and $\pm Vr/3$ are applied to the selected cell and the non-selected cells, respectively. Electric charges flow from the selected cell in accordance with a change in poling. That is, since electric charges are stored in the load capacitor 42 to increase a potential, a sense circuit 18 can detect data "1" and "0". Assume that the number of X- and Y-lines of the simple matrix arrangement is n ×m. The selected cell is written in using the second pulse having the magnitude of $V_w$ during a write operation of all the cells, but applied with a signal having a voltage of $\pm V_w/3$ n×m−1 times when other cells are written. Assume that the signal is applied n ×m−1 times in a direction of destructing poling. For example, in a 1-Gbit memory, the number of times of application is $10^9$. Taking into an actual device, a change in polarization amount is about 10% upon application of the voltage $V_w/3$ $10^9$ times. Referring to FIGS. 22A and 22B, if a voltage is 0.3 times a coercive voltage $V_c$ of the ferroelectric thin film 10, a change in poling, i.e., a destruction amount is 10% the original polarization amount even upon application $10^4$ times. Therefore, when the voltage $V_w$ as a magnitude of the second pulse 14 is set to 0.8 to 1.5 times the coercive voltage $V_c$, a memory of 1 Mbits to 1 Gbits can be realized.

Referring back to FIGS. 25A and 25B, assume that the voltage $-Vr$ is applied to the selected cell during the read operation. When the cell is in a "1" state, i.e., is partially poled, an electric charge having an amount of $\Delta Q_p$ flows into the sense circuit 18 and the data lines 30. On the other hand, when the cell is in a "0" state, only an electric charge corresponding to a linear component $C_c V_r$ flows into the sense circuit 18 and the data lines 30. That is, the data lines 30 are $\Delta V1 = (\Delta P_p + C_c V_r)/(C_L + C_d)$ $\Delta V0 = C_c V_r/(C_L + C_d)$ where $C_d$ is a total capacitance of the data lines 30. Therefore, $$\Delta V1-\Delta V0=\Delta Q_p/(C_L+C_d)$$

The load capacitor 42 and the total capacitance $C_d$ of the data lines 30 are determined to detect this difference by the sense circuit 18. $\Delta Q_p$ depends on a cell area, a residual polarization amount, the amount of partial poling. Note that, if the voltage $V_w/3$ is suppressed to about 0.2 to 0.5 times the coercive voltage $V_c$ of the ferroelectric thin film 10, the voltage $V_w/3$ becomes 0.2 to 1.0 V because the characteristics of the ferroelectric thin film 10 are normally designed to have the coercive voltage $V_c$ of about 0.8 to 2.0 V. Therefore, $\Delta V0$ is desirably set lower than this voltage.

According to the 12th embodiment, data is read out using the third pulse 15 as an AC signal having a baseline in a zero-biased state, and a pulse rise time $t_r$ longer than the set time of the sense circuit 18. With this operation, the poled state of the ferroelectric thin film 10 is not destructed, and the read operation is performed by the sense circuit 18 during a normal operation, thereby avoiding an erroneous read operation.

In addition, the write circuits 33 and a read circuit are electrically connected to the memory cells constituted by the ferroelectric thin film 10 interposed between the first and second striped electrodes 130 and 131, and write and read operations are performed. With this arrangement, a highly integrated large-capacity memory which performs a nondestructive read operation can be realized.

In the write operation, the voltage $V_w$, the voltage $V_w/3$, 0 V, the voltage $2V_w/3$ are applied to a word line 31 which select the second pulse 14, the non-selected word lines 31, the selected data line 30, and the non-selected data lines 30, respectively. With this operation, the voltages $V_w$ and $Vw/3$ are applied to the selected cell and other non-selected cells. Therefore, a write operation to cells other than the selected cell can be avoided, and the write operation can be performed without interfering other cells.

Figure 26:
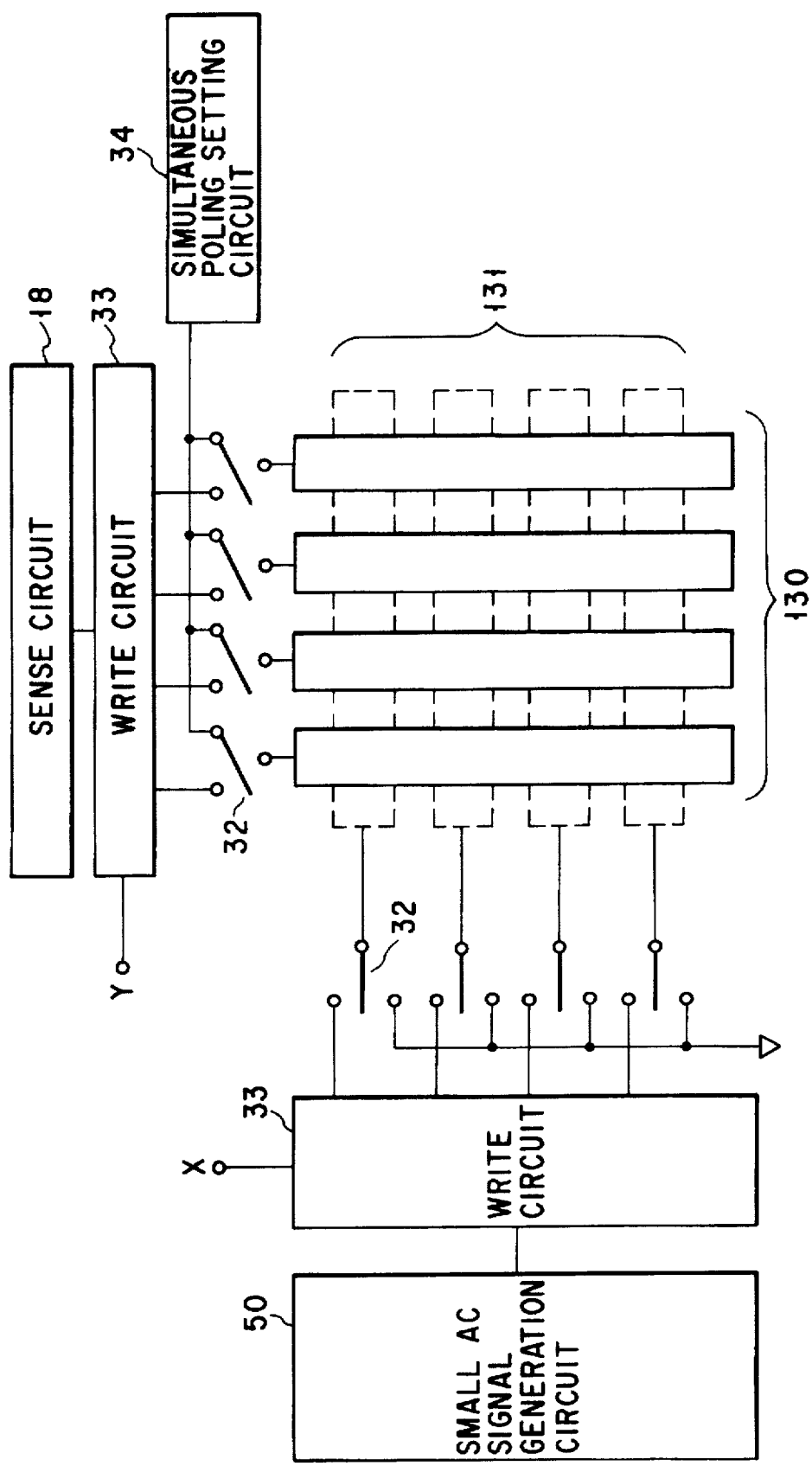
FIG. 26 is a further embodiment of the present invention.

The 13th embodiment of the present invention will be described below. As shown in FIG. 26, in the 13th embodiment, the principle of the ninth embodiment is applied to a memory having a simple matrix arrangement. In this case, second striped electrodes 131 constituting lower electrodes are used as X-lines, i.e., word lines 31, and first striped electrodes 130 constituting upper electrodes are used as Y-lines, i.e., data lines 30. The respective X- and Y-lines are constituted by a ferroelectric thin film interposed therebetween.

These X- and Y-lines are switched to a simultaneous poling setting circuit 34 or an address circuit (not necessarily required in this case) by write/read switches 32. The word lines 31 are connected to a write circuit 33 using a ½ or ⅓ $V_w$ method, and a small AC signal generation circuit 50 for a read operation.

On the other hand, the data lines 30 are connected to a write circuit 33 similarly using a ½ or ⅓ $V_w$ method, and a sense circuit 18. The sense circuit 18 is connected to an amplifier and a measurement circuit (not shown) for detecting both a phase and an output. The detected output is sent to an external circuit (not shown). The sense circuit 18 may be connected to each word line 30 (Y-line) to read a large number of data at once, or the word lines 30 may be connected to the sense circuit 18 through a selection circuit. The sense circuit 18 may detect some of data as a group so as to process a combination of data lines 30, i.e., outputs in units of, e.g., 4, 8, or 16 bytes. Data processing suitable for a system can be performed. The small AC signal generation circuit 50 can be connected to each word line 31, and a large number of data can be written at once. With this operation, an access speed to this memory device can be increased. In addition, the small AC signal generation circuit 50 may be connected to the word lines 31 through a selection circuit. The small AC signal generation circuit 50 may write some of data as a group so as to process a combination of word lines 30, i.e., inputs in units of, e.g., 4, 8, or 16 bytes. Data processing suitable for a system can be performed.

According to the above 13th embodiment, the desired word line 31 can be selected by a selection circuit, and a second pulse 14 from a signal generator can be applied to a selected cell, thereby applying a signal only to the selected cell.

Since a signal from the signal generator can be applied to selected cells through some or all of the word lines 31 at once, the memory with a high-speed operation can be realized.

The data lines 30 selected by the selection circuit can be electrically connected to the sense circuit. That is, some or all of the data lines 30 through which data from selected cells can be read out without interference from other cells are electrically connected to the sense circuit at once, thereby reading out data at a high speed.

Moreover, some or all of the first and second striped electrodes 130 and 131 can be selected, and a first pulse 13 can be applied to the selected electrodes, thereby setting first poled states at once. With this operation, the highly integrated large-capacity memory at a high speed can be realized.

Figure 27A:
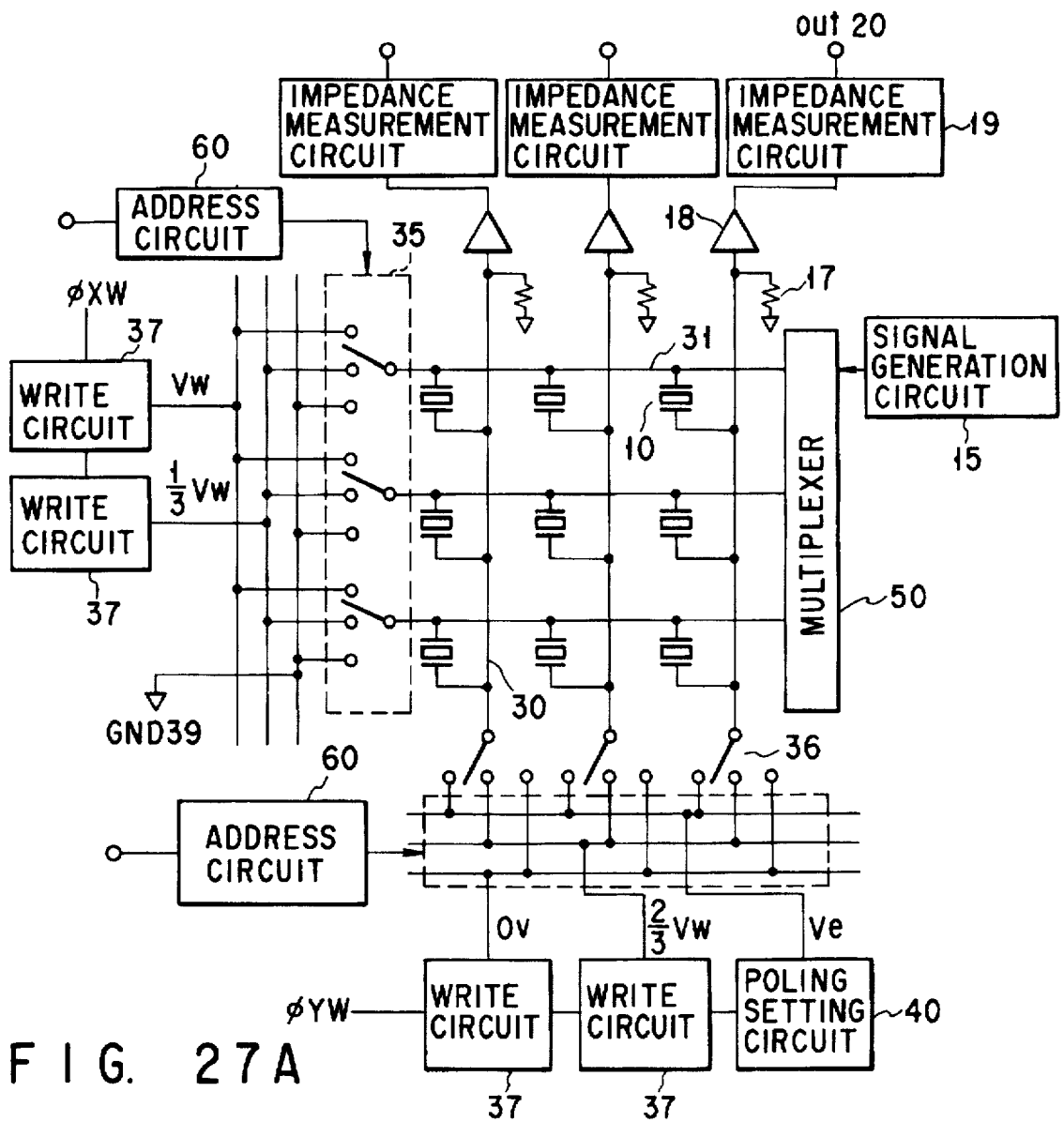
FIG. 27A is a further embodiment of the present invention.

The 14th embodiment of the present invention will be described below with reference to FIGS. 27A and 27B. In FIG. 27A, X-lines 31 and Y-lines 31 serve as upper electrodes and lower electrodes, respectively. Both the X-lines 31 and the Y-lines are connected to a selection circuit (not shown), a poling setting circuit 40, and write circuits 37 through switches 35 and 36. The switches 35 and 36 are changed in response to an address signal, and only specific lines are selected. That is, in a poling setting operation, all or a certain set of lines are selected. In a write operation, a write voltage $V_w$ is applied only to specific lines, and a voltage $V_w/3$ is applied to other cells.

On the other hand, in a read operation, the specific lines are selected by the X-lines 31 and a selection multiplexer 50, and a small AC signal for the read operation is applied from a signal generation circuit. Domains interposed between the X-lines 31 and the Y-lines 30 are memory cells 10. The terminations of the Y-lines are matched by a proper impedance. However, this is not required depending on a case. In this embodiment, an impedance measurement circuit 19 detects an output value and a phase, but any other method can be taken in place of the impedance measurement circuit 19.

Figure 27B:
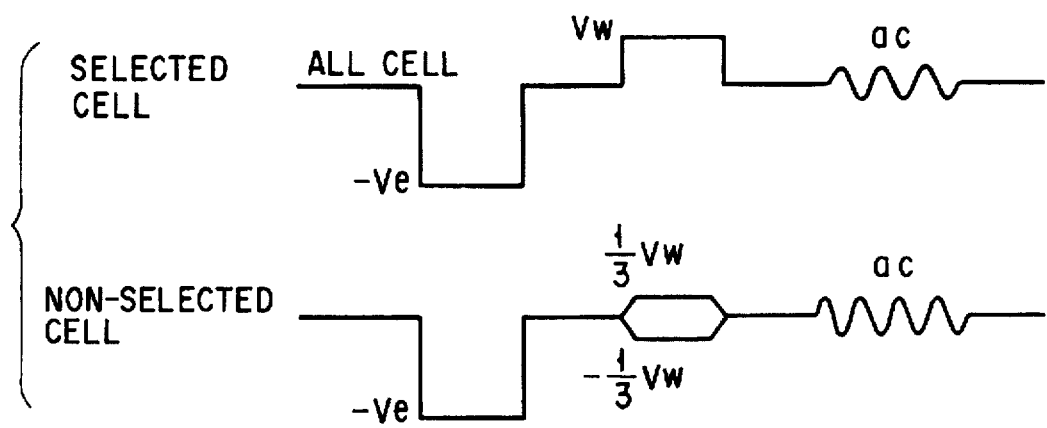
FIG. 27B shows signals used in the FIG. 27A embodiment.

Pulse time dependency of a selected cell and a non-selected cell will be represented in a timing chart of FIG. 27B. In a poling setting operation, a magnitude $-Ve$ is applied to all the cells using the lower electrodes 30 as a reference, and the poling setting circuit 40 sets poling. Then, as for a write operation, cells are sequentially selected in accordance with an address circuit 60, and a write signal is applied to the selected cells by the write circuits 37. In this case, the voltage $V_w$ is applied to the selected cells, and the voltage $\pm V_w/3$ is applied to other cells. Here, the voltage $V_w$ has the magnitude and pulse width of a second pulse 14 which causes partial poling, and satisfies the relationships shown in FIGS. 21A, 21B, 22A, and 22B. When a width $t_w$ of the second pulse 14 for the write operation is almost equal to or longer than a switching time $t_s$ of the ferroelectric thin film 10, the voltage $V_w$ preferably falls within a range of 0.7 to 2 times a coercive voltage. If the width $t_w$ is shorter than the switching time $t_s$, the voltage $V_w$ preferably falls within a range of 1 to 3 times a coercive voltage $V_c$. Further, if a voltage having a magnitude of $V_w/3$ is applied to non-selected cells, and the memory device has an n×m matrix arrangement, (n×m−1)/2 pulses are applied. For this reason, the value of the voltage $V_w$ must be determined such that a change amount is 10% or less by which non-selected cells are not poled, i.e., memory contents are not changed.

Next, for a read operation, a small AC signal is applied in a zero-biased state. By setting a zero bias, poling of cells, i.e., a change in memory contents can be avoided. An amplitude of this small AC signal is determined in FIG. 22. That is, memory contents must be read out several times at a voltage or less which does not change poling. It is important that poling is not changed by this operation because a capacitance can be detected at a very low voltage of about 30 to 100 mV. An output corresponding to a "0" state is detected as a point 25, and an output corresponding to a "1" state is detected as a point 26. A read operation is performed by a difference ΔC between the capacitances. When normal PZT or $Pb(Zr_{0.4}Ti_{0.6})O_3$ is used, the AC becomes 1% to 5% the total capacitance.

As shown in FIG. 28, the X-lines 31 (i.e., word lines) and the Y-lines 30 (i.e., data lines) are terminated by impedance elements 17 through switches 52. In a read operation, only selected cells are connected to write/read circuits 51. Other lines are connected to the impedance elements 17. With this arrangement, the X- and Y-lines other than the selected X- and Y-lines are set at a relatively low impedance. Capacitances of the selected cells are read out using a signal slower than a time constant τ determined by a capacitance $C_d$ of the work line 31 and a resistance R of the impedance element 17, thereby preventing signals, i.e., noise from cells other than the selected cells from being included into output lines.

As shown in FIG. 29, all the X-lines 31 and the Y-lines 30 may be connected to the impedance elements 17 without switches. In this case, the poling setting and write operations are performed using the second pulse 14 having a pulse width faster than a time constant $C_d$·R determined by the capacitance $C_d$ per data line 30 and the resistance R of the impedance element 17. The read operation is performed using a third pulse 15 having a frequency component slower than this time constant.

According to the above 14th embodiment, desired lines are electrically connected to the impedance circuits or elements 17 grounded to a GND level by one or both of the data lines 30 and the word lines 31. With this arrangement, since data, i.e., so-called noises from non-selected cells flow into the GND level through the impedance circuits or impedance elements, a read operation can be performed at a high S/N ratio without interference from non-selected cells.

The second pulse 14 having a rise time faster than the time constant determined by the resistance of the impedance circuit or element 17 and the capacitance of the word line 31 or the data line 30 is applied. Therefore, since an effective voltage to be applied to non-selected cells can be reduced, the write operation can be performed without changing poling of the non-selected cells, i.e., interference.

In addition, the third pulse 15 having a rise time slower than the time constant determined by the resistance of the impedance circuit or element 17 and the capacitance of the word line 31 or the data line 30 is applied. With this operation, since data, i.e., so-called noise from non-selected cells flows into the GND level through the impedance circuits or impedance elements 17, the read operation can be performed at a high S/N ratio without interference from non-selected cells.

The switching elements electrically connected between ferroelectric capacitors and the data lines 30 are turned on/off to select desired cells. With this operation, since the selected cells can be electrically isolated from non-selected cells, the write and read operations can be performed at a high S/N ratio.

The 15th embodiment of the present invention will be described below with reference to FIGS. 30A, 30B, and 30C. In the 15th embodiment, a partially poled memory of this embodiment is applied to a DRAM type memory. Normally, poling of a ferroelectric thin film is completely inverted in a DRAM type ferroelectric memory. Since the polarization amount of the ferroelectric thin film is halved due to the fatigue properties of the ferroelectric thin film, access is undesirably performed only $10^6$ to $10^{13}$ times. Partial poling of this embodiment, however, is in a so-called low-energy state in which part of a poled domain rotates. For this reason, it is confirmed that the memory of this embodiment is resistant to fatigue upon repetition of $10^2$ to $10^4$ times. Therefore, the memory of this embodiment can withstand write/read operations performed $10^{16}$ to $10^{17}$ times. That is, when the same cell is always accessed by driving the memory at 10 MHz, the number of access is $10^{15}$ times for 10 years. If access can be performed $10^{16}$ to $10^{17}$ times, sufficient reliability can be assured.

In FIGS. 30A, 30B, and 30C, FIG. 30A is a view showing the arrangement of the 15th embodiment, FIG. 30B is a circuit diagram showing a sense circuit in detail, and FIG. 30C is a timing chart showing an operation. In FIGS. 30A and 30B, reference numeral 49 denotes a sense circuit; 30 and 30', data lines; 45 and 45', word lines; 47 and 47', plate lines; and 44 and 44', selection memory cells. Reference numeral 46 denotes a capacitor of a dummy cell, which is a linear capacitor for automatically performing a rewrite operation, but may be a ferroelectric capacitor or a linear capacitance component of the ferroelectric thin film. The sense circuit 49 compares a signal from a selected cell and a signal from the dummy cell 46, and amplifies a difference between the signals. Then, the sense circuit 49 latches a node of an input terminal of a high signal at a high level, and a node of an input terminal at the opposite side at a low level. Therefore, upon this read operation, i.e., upon the amplification operation by the sense circuit 49, the word line 45 corresponding to selected cell is selected again to reset poling of the selected cells inverted by the read operation to the original state.

In this embodiment, the read operation is performed under conditions that the data line 30 is set to a GND level, and the plate line 47 is controlled to have a cell potential shown in FIGS. 23A and 23B. At this time, the plate line 47 is arranged parallel to the word line 45 or perpendicular to the data line 30, thereby realizing a highly integrated memory device.

According to the above 15th embodiment, FET type semiconductor transistors are used as the switching elements electrically connected between the ferroelectric capacitors and the data lines 30, thereby realizing a highly integrated large-capacity memory.

Since the plate line 47 is arranged parallel to the word line 45, the memory can be effectively laid out, and a highly integrated large-capacity memory can be realized.

Further, since the plate line 47 is arranged perpendicular to the data line 30, the memory can be effectively laid out, and a highly integrated large-capacity memory can be realized. Since the element utilizing a linear capacitor element or a linear capacitor of the ferroelectric is employed as the dummy cell 46, a stable reference signal can be extracted, thereby performing a stable read operation.

Moreover, upon the read operation, since the word line 45 is selected again, the potential of the sense circuit 49 can be applied to the selected cell (including the dummy cell 46). Therefore, a rewrite operation for resetting inverted poling to the original state without adding any new circuit can be automatically performed.

The 16th embodiment of the present invention will be described below with reference to FIGS. 31A and 31B. The arrangement of the 16th embodiment essentially follows that of the 15th embodiment except that all plate lines 47 are fixed to one potential, i.e., a plate potential. In a poling setting operation, a negative voltage −Ve is applied. In the subsequent read and write operations, the plates lines 47 are set at an intermediate voltage $V_w/2$ of a voltage $V_w$. With this operation, a data line 30 and a sense circuit 49 are driven at a voltage of $-V_w$ to $+V_w$, thereby automatically performing the read operation. Poling inverted by the read operation can be reset to the original state without adding any new circuit.

According to the above 16th embodiment, all the plate lines 47 are fixed to ½ a power supply voltage $V_{cc}$ or ½ the write voltage $V_w$, and the data line 30 and the sense circuit 49 are driven at the voltage of $-V_w$ to $+V_w$. Therefore, the read operation is automatically performed, and the rewrite operation can be performed without any new circuit.

The 17th embodiment of the present invention will be described with reference to FIGS. 32A and 32B. In FIGS. 32A and 32B, FIG. 32A is a circuit diagram, and FIG. 32B is a timing chart showing an operation. In this embodiment, a magnitude $V_r$ and a width $W_r$ of a third pulse in a read operation are important. As is apparent from the relationship between an applied voltage and the number of times of inversion shown in FIG. 23B, the height of the third pulse is selected to make a nondestructive read operation possible. This embodiment must employ conditions that poling does not change even if the same cell is read out, i.e., accessed about $10^{12}$ to $10^{15}$ times. For this purpose, the read voltage $V_r$ has a value of about 10% to 15% a voltage $V_s$ required for completely inverting poling of a ferroelectric thin film 10 by applying one pulse. If the voltage $V_s$ is 1 to 2 V, a pulse height $V_r$ is about 1 to 0.3 V. On the other hand, a pulse width $W_r$ must be set such that a load capacitor 16 is charged from the ferroelectric thin film 10, and this state can be detected at a high S/N ratio. As for partial poling set and write operations, the ferroelectric thin film 10 is partially poled, add then a switch 61 is changed to apply a third pulse 15 in the read operation. The third pulse 15 normally comprises three types of pulses (1), (2), and (3). The pulse (1) is a rectangular wave, the pulse (2) is a pulse having a certain gradient, the pulse (3) is the upper half of a sine wave, and the like. Reference numerals 53 and 53' denote outputs. Upon partial poling, i.e., a write operation of data "1", a capacitance is large, and an output becomes a signal 53. Upon a write operation of data "0", a capacitance is small, and an output becomes a signal 53'. In this manner, since a response difference is produced with respect to data "1" and "0", data "1" and "0" can be identified.

More specifically, for example, a read operation further uses a dummy cell 56, a switch 57, and a partial poling formation circuit 58, as shown in FIG. 33A. A difference between a signal from the ferroelectric thin film 10 and a signal from the dummy cell 56 is detected. In this case, since only one dummy cell 56 is required for a sense circuit 59 comprising a differential sense amplifier, the area or polarization amount of the dummy cell 56 is adjusted such that a signal from the dummy cell 56 becomes an output falling within the "1" state and the "0" state. Instead of this, when a signal amount from the dummy cell 56 is to be detected, a voltage to be applied may be adjusted.

As shown by outputs in FIG. 33B, a signal corresponding to a poled state of the ferroelectric thin film 10, i.e., "1" or "0" is input to one input terminal of the sense circuit 59, and a reference signal is input from the dummy cell 56 to the other input terminal. Then, the sense circuit 59 performs a differential amplification operation to identify "1" and "0".

According to the above 17th embodiment, a signal from a selected cell and a signal from the dummy cell 56 are compared, and a difference between these signals is differentially amplified, thereby performing a stable read operation at a high S/N ratio.

The 18th embodiment of the present invention will be described below with reference to FIGS. 34A and 34B. The 18th embodiment has the same arrangement as that in the 17th embodiment except that the sensitivity and read characteristics of a memory are further improved. FIG. 34A shows the arrangement. Data lines are constituted by first striped electrodes 130, and word lines constituted by second striped electrodes 131a and 131b. Each of two pairs of second striped electrodes 131a and 131b constitutes a one-bit memory cell. The striped electrodes 131a and 131b are adjacent to each other, and an erase/write/read circuit 70 determines data "1" and "0", or "0" and "1" to be written in the striped electrodes 131a and 131b so as to make the striped electrodes 131a and 131b have opposite data.

(1) and (2) in FIG. 34B show the above method as a pulse sequence. An output is detected by a sense circuit 59 comprising a differential amplifier in the same manner as in the above embodiment. In the case (1), a difference between "1" and "0" is detected by using normal capacitive coupling, and in the case (2), the difference is detected by using a real number component and an imaginary number component as shown in FIG. 34B.

According to the 18th embodiment, first data is written in one memory cell constituted by one of the two pairs 131a and 131b, and second data is written in the other memory cell. One word line connected to one memory cell constituted by one of two pairs is connected to an input terminal of the sense circuit 59, and the other word line is connected to the other input terminal of the sense circuit 59. With this arrangement, a difference is detected, thereby performing a read operation at a high S/N ratio.

Embodiments explaining the way of reading out data stored in a memory cell in detail will be described below.

Figure 35:
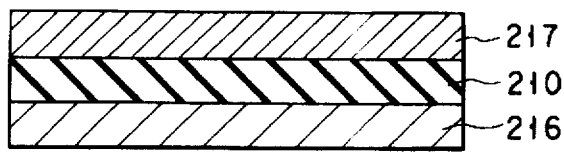
FIG. 35 shows a further embodiment of the present invention.
Figure 36:
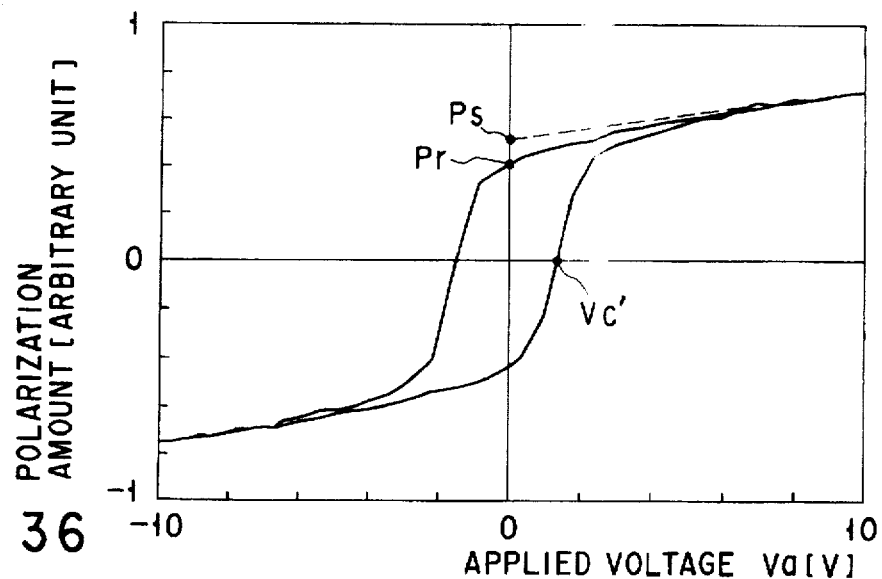
FIG. 36 shows hysteresis characteristics of the FIG. 35 embodiment.
Figure 37:
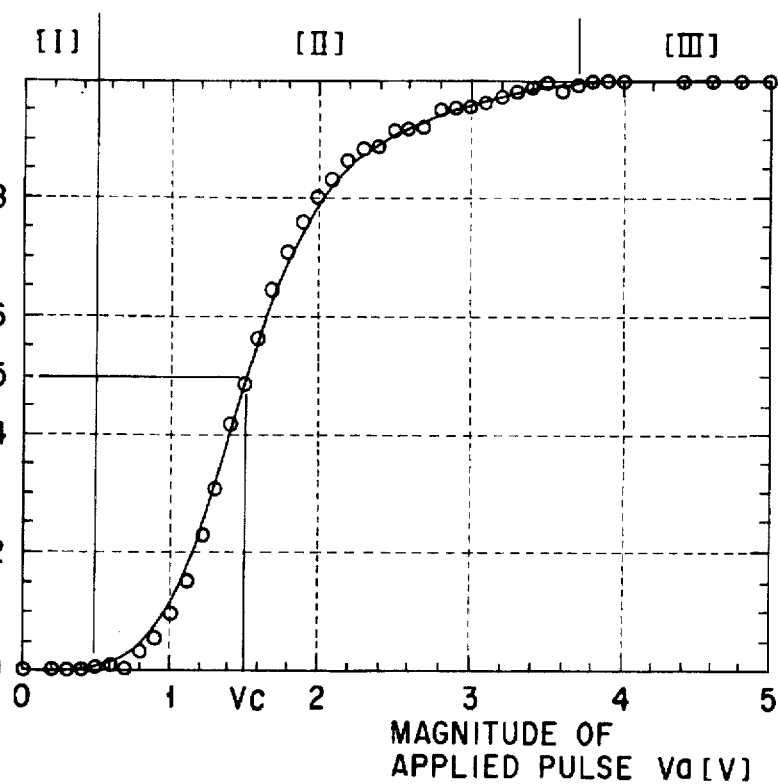
FIG. 37 is a graph which shows a relationship pertaining to the FIG. 35 embodiment.

First, the 19th embodiment of the present invention will be described referring to FIGS. 35 to 43. As shown in FIG. 35, a ferroelectric thin film 210 is interposed between two electrodes 216 and 217 consisting of platinum and the like. When a voltage is applied to the electrodes, a polarization amount non-linearly changes with respect to the applied voltage to represent hysteresis characteristics shown in FIG. 36. The hysteresis characteristics are generally measured by using a continuous sine wave having about 1 KHz or a triangular wave. In FIG. 36, $P_r$ is defined as a residual polarization amount, $P_s$ is a saturation polarization amount, and a voltage $V_c$, and a magnitude $V_a$ of an applied pulse when a single when poling is 0 is a coercive voltage. FIG. 37 shows a relationship between a poling destruction amount $\Delta P$ and a magnitude $V_a$ of an applied pulse when a single pulse is applied. FIG. 37 shows data measuring the ferroelectric thin film 210 consisting of $Sr_{1.0}Bi_{2.2}Ta_2O_{8.2}$.

Here, the poling destruction amount $\Delta P$ is an amount representing a change amount of the polarization amount of the ferroelectric thin film 210, i.e., a destruction amount of the ferroelectric thin film 210 by applying a pulse having the magnitude Va. The coercive voltage $V_c$ shown in FIG. 37 is also called a coercive voltage. The coercive voltage $V_c$ is defined as an intermediate voltage between a voltage when poling is not destructed and a voltage when poling is completely destructed. Generally, the coercive voltages $V_c$, and $V_c$ in the characteristics (FIG. 36) obtained upon application of a continuous wave and the characteristics (FIG. 37) obtained upon application of a single wave do not always coincide but have almost the same value.

Referring to FIG. 37, a domain [I] is a domain in which a poled state set in the first direction is not changed even if a pulse having a magnitude corresponding to the domain is applied. The first poled state in this embodiment is defined as digital data "0" in the negative direction with respect to the origin in FIG. 36. Taking into consideration of a read margin to a partially poled state as the other storage state, the first poled state is preferably set to have electrical characteristics greatly different from those of the partially poled state. More preferably, the first poled state is set to be a completely poled state. In other words, if a read margin can assure an amount by which data "1" are "0" is discriminated, the first poled state is not set to be a completely poled state. On the other hand, the partially poled state is defined as "1". This definition is only for eliminating confusion in the following explanation. Needless to say, if the first poled state and the partially poled state are defined as "1" and "0", this embodiment can be performed in the same manner. A domain [III] is a domain having a state obtained by inverting the first poled state into a second poled state using an applied pulse. Since the first poled state is defined in the negative direction with respect to the origin in FIG. 36, the second poled state is defined in the positive direction with respect to the origin. A domain [II] is a partially poled state. That is, the partial poling means a poled state having a mixed state of the first poling and the second poling.

As is apparent from the above description, this partial poling can be formed such that a poled state of the ferroelectric thin film 210 is set to the first poled state using the first pulse having the negative direction, and then the second pulse having the positive direction is applied to the first poled state. As described above, FIG. 37 shows data measuring the ferroelectric thin film 210 consisting of $SrBi_2Ta_2O_9$. A pulse having a magnitude 2 to 2.5 times the coercive voltage $V_c$ of the ferroelectric thin film 210 is actually applied to establish $\Delta P=1$. Poling is completely destructed. That is, poling can be completely inverted. Therefore, the first negative pulse having a magnitude 2 to 2.5 times the coercive voltage $V_c$ of the ferroelectric thin film 210 is applied to set the ferroelectric thin film 210 in the first poled state. Then, the second positive pulse having a magnitude 0.3 to 2 times the coercive voltage $V_c$ of the ferroelectric thin film 210 is applied to form a partially poled state. This partially poled state was confirmed to be very stable.

FIGS. 55A and 55B are graphs conceptually showing a difference between a conventional ferroelectric memory (FIG. 55A) and a ferroelectric memory (FIG. 55B) of this embodiment by using hysteresis curves.

In the conventional ferroelectric memory, data "1" and "0" are caused to correspond to poled states A and B which are completely inverted using an applied voltage $V_a$, i.e., saturated poled states A signal is read in the following manner. That is, the positive applied voltage $V_a$ which can sufficiently completely invert poling is applied, and a charge amount generated with a change in poling is detected as a current or voltage using a desired load. At this time, a poled state changes from A→C→B in the storage state "1", and from B→C→B in the storage state "0" (strictly speaking, the state is not always reset to the original poled state B, which change depends on a case). Assume that a change polarization amount is $\Delta P$. If $i=\Delta P \cdot A$ (ferroelectric cell area)/$d_r$, a charge amount ($=\Delta P \cdot A$) which changes within a certain unit of time becomes a current. When the charge amount is stored in the capacitor C, the charge amount can be detected as a voltage in accordance with $V=\Delta P \cdot A/C$. Therefore, since $\Delta P$ obtained when reading the storage state "1" is larger than that obtained when reading the storage state "0", a detected current or voltage becomes larger to identify "1" and "0".

On the other hand, in the ferroelectric memory of this embodiment, as has been described above, not both the storage states "1" and "0" are set to be saturated poled states, but one of them is assigned to a saturated poled state X or Z and the other is assigned to the partially poled state. Here, X and Z correspond to A and B in FIG. 55A. The storage state "0" is caused to correspond to the poled state X, and the storage state "1" is caused to correspond to the partially poled state. A negative voltage $-V_a$ which can sufficiently invert poling is applied to a ferroelectric capacitor, and the applied voltage is withdrawn to be the poled state X. This is set to the storage state "0". When a voltage $V_p$ for forming positive partial poling which has a proper magnitude at least to satisfy $V_a > V_p$ is applied to a cell in the poled state X, the poled state changes from X→D→E, and becomes a partially poled state which is not X or Z. A point Y which represents the maximum capacitance in FIGS. 39 to 41 corresponds to a partially poled state formed by applying, thereto, a positive pulse having a magnitude almost the same as the voltage $V_c$ defined by the characteristics (FIG. 37) obtained by applying a single pulse. It is difficult to represent the point Y on a curve of the hysteresis characteristics obtained by applying a continuous wave. The point Y is almost near the intermediate point between X and Z, as represented by hatched lines in FIG. 55B. In a read operation of "1" and "0" defined in the above manner, a difference between the capacitances are detected by applying a third proper pulse in accordance with a proper method.

FIG. 38 is a view showing the arrangement of a ferroelectric memory device using the above partial poling, and the operation thereof will be described below.

More specifically, data is written and stored in memory cells 211 selected by cell selection circuits 223. Similarly, in the read operation, desired memory cells 211 are selected by the cell selection circuits 223, and data stored in the selected memory cell 211 is read by a read circuit 224. An operation for writing data is performed in the following manner. Each memory cell 211 is set in the first poled state (in the negative direction) in accordance with the first pulse output from a first pulse output circuit 225. Then, the memory cell 211 in the first poled state is set in the partially poled state in accordance with the second pulse output from a second pulse output circuit 226. Switching between the first and second pulse output circuits 225 and 226 is performed by a switch 228. At this time, the first pulse is a negative pulse having a magnitude 2.5 times or-more the coercive voltage $V_c$ of the ferroelectric thin film 210, and the second pulse is a positive pulse having a magnitude $V_w$ equal to that of the coercive voltage $V_c$ of the ferroelectric thin film 210.

As for the read operation, in the same manner as in the write operation, desired memory cells 211 are selected by the cell selection circuits 223, a third pulse is applied from a third pulse output circuit 227 to the selected memory cells 211, and signals from the memory cells 211 are read by the read circuit 224. In the write and read operations of data, A and B of a load 230 may be switched by a switch 229 as shown in FIG. 38, or the same load may be used. Further, in the write operation, low level may be set instead of connecting the load 230.

Figure 39:
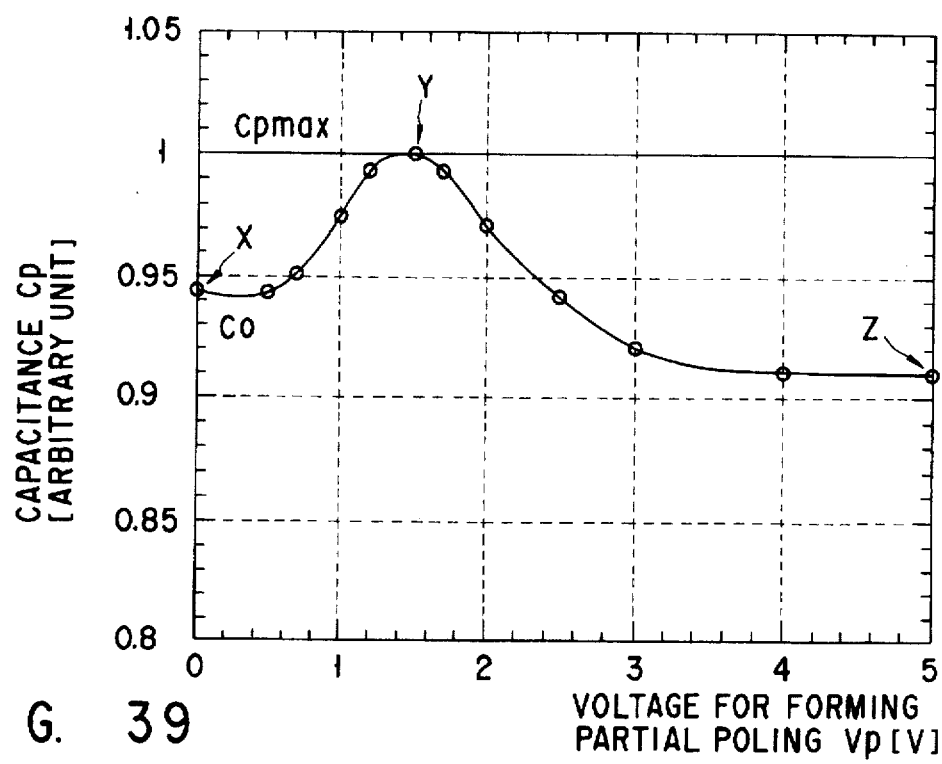
Figure 40:
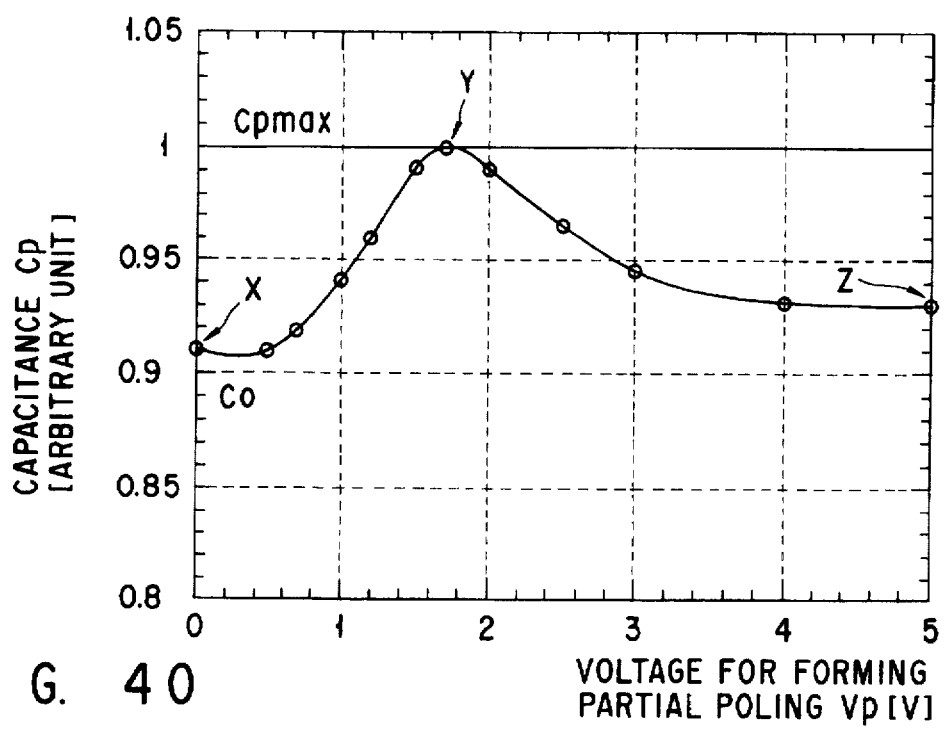

FIGS. 39 and 40 respectively show the magnitude $V_p$ of an applied pulse for forming a partially poled state and a capacitance $C_p$ of the ferroelectric thin film 210 in the resultant partially poled state. A capacitance $C_o$ at a voltage of 0 V (X point) is a capacitance of the ferroelectric thin film 210 in the first poled state. As the magnitude $V_p$ of the applied voltage for forming a partially poled state increases, the capacitance $C_p$ increases. After the capacitance $C_p$ has the maximum value, it decreases. Therefore, the capacitances of the two values "1" and "0" differ depending on two poled states, i.e., the first poled state and the partially poled state. For this reason, by detecting a difference between the two capacitances by the read circuit 224, this memory can be realized as a digital memory. Taking the read operation into consideration, as the capacitance $C_p$ in the partially poled state and the capacitance $C_o$ in the first poled state increase, a read margin increases, thereby realizing a ferroelectric memory which can perform a read operation at a high S/N ratio.

Next, a process of forming the memory cells 211 constituted by the ferroelectric thin film 210 which is interposed between the pair of electrodes 216 and 217 will be described below. Here, a case of forming the memory cells 211 using the above ferroelectric thin film 210 which consists of $SrBi_2Ta_2O_9$ by a wet coating method called the MOD method will be described. A xylene solution of 2-ethyl hexanoate of each of Sr, Bi, and Ta is used as a precursor solution, and Bi is added to exceed 10% with respect to the stoichiometric ratio. A film is formed on a silicon substrate on which the 2,000-Å thick electrode 216 consisting of platinum at a coating concentration of 0.15M and a swing speed of 2,000 rpm. The coated film is dried at 250° C. for 5 minutes. Thereafter, the dried film is heated to 800° C. at a temperature rise rate of 125° C./sec using a lamp annealer, and the heated film is baked by rapid heating in oxygen for 30 seconds. The process of film coating to baking is repeated three times to form a multilayered film. The multilayered film is annealed in an oxygen flow at 800° C. for 60 minutes. As a result, an $SrBi_2Ta_2O_9$ thin film having a thickness of 2,400 Å is obtained. Subsequently, the 2,000-Å thick electrode 217 consisting of platinum is formed on the ferroelectric thin film 210 by sputtering. The resultant structure is etched in an ion mill. Finally, the entire substrate is secondarily annealed in an oxygen flow at 800° C. for 30 minutes to form the memory cells 211. The main process described above does not always employ the exemplified MOD method. For example, the ferroelectric thin film 210 may be formed by a physical deposition method such as sputtering, or by a chemical vapor growth method such as MOCVD. In the above manner, the lower electrode 216, the ferroelectric thin film 210, and the upper electrode 217 are stacked while performing the annealing process. For this reason, it is expected that electrical properties at or near the interfaces between the ferroelectric thin film 210 and the lower and upper electrodes 216 and 217 differ, or some electrical characteristics becomes asymmetrical. Note that this interpretation is not sure. But it was found that the capacitance $C_p$ with respect to the voltage $V_p$ for forming partial poling shown in FIGS. 39 and 40 always has an asymmetrical curve as shown in FIGS. 39 and 40 regardless of a difference in degree. FIGS. 39 and 40 exemplify cases using the same memory cell 211. FIG. 39 exemplifies a case in which a voltage is applied to the upper electrode 217 side, and a signal is read at the lower electrode 216 side, and in contrast to this, FIG. 40 exemplifies a case in which a voltage is applied to the lower electrode 216 side, and a signal is read at the upper electrode 217 side. The curves in FIGS. 39 and 40 are asymmetrical, so the curves do not correspond without any processing. Note that maximum values $C_{pmax}$ of the capacitances $C_p$ in the partially poled state and the voltages $V_p$ representing these capacitances correspond to each other in the two curves. In addition, since these electrical characteristics are of identical cells, the two curves are coincided by replacing the lower electrode 216 with the upper electrode 217, as a matter of course. Therefore, in setting the first poled state, i.e., "0", the capacitance $C_o$ in the first poled state changes depending on the upper electrode 217 side or the lower electrode 216 side to which the memory cell is poled. For example, if the point X is set at "0", and the point Y is set at "0" in FIGS. 39 and 40, a difference $\Delta C$ between the capacitances is about 5% at "1" and "0". On the other hand, if the point Z is set at "0", and the point Y is set at "1", the difference between the capacitances is about 10% at "1" and "0", which is twice the above value. This is not a unique characteristic of the $SrBi_2Ta_2O_9$ ferroelectric thin film 210. This phenomenon also occurs when using, e.g., PZT, which is well-known as a ferroelectric material. FIG. 41 shows data obtained by measuring memory cells 211' constituted by a PZT or $Pb(Zr_{0.4}Ti_{0.6})O_3$ ferroelectric thin film 210'. This ferroelectric material has the same tendency. FIG. 41 shows data obtained when a voltage is applied to the upper electrode 217 side. When a voltage is applied to the lower electrode 216, the asymmetry is reversed, similarly in the above $SrBi_2Ta_2O_9$ ferroelectric material. In a case of PZT, if a point X is set at "0", and a point Y is set at "0", the difference $\Delta C$ between the capacitances is about 10% at "1" and "0". On the other hand, if a point Z is set at "0", and the point Y is set at "1", the difference $\Delta C$ between the capacitances is about 20% at "1" and "0". Note that the direction of asymmetry in the ferroelectric cell constituted by the $SrBi_2Ta_2O_9$ ferroelectric thin film is opposite to that in the ferroelectric cell constituted by the $Pb(Zr_{0.4}Ti_{0.5})O_3$ ferroelectric thin film, as shown in FIG. 42.

The curves $C_p$-$V_p$ obtained when a voltage is applied to the upper electrode 217 in FIGS. 39, 40, and 41 are plotted in FIG. 42. It is expected that a difference is caused not by a difference in materials of the ferroelectric thin films 210 but by a difference in device structures of evaluation samples, although reasons for this expectation are not clear.

Figure 43A:
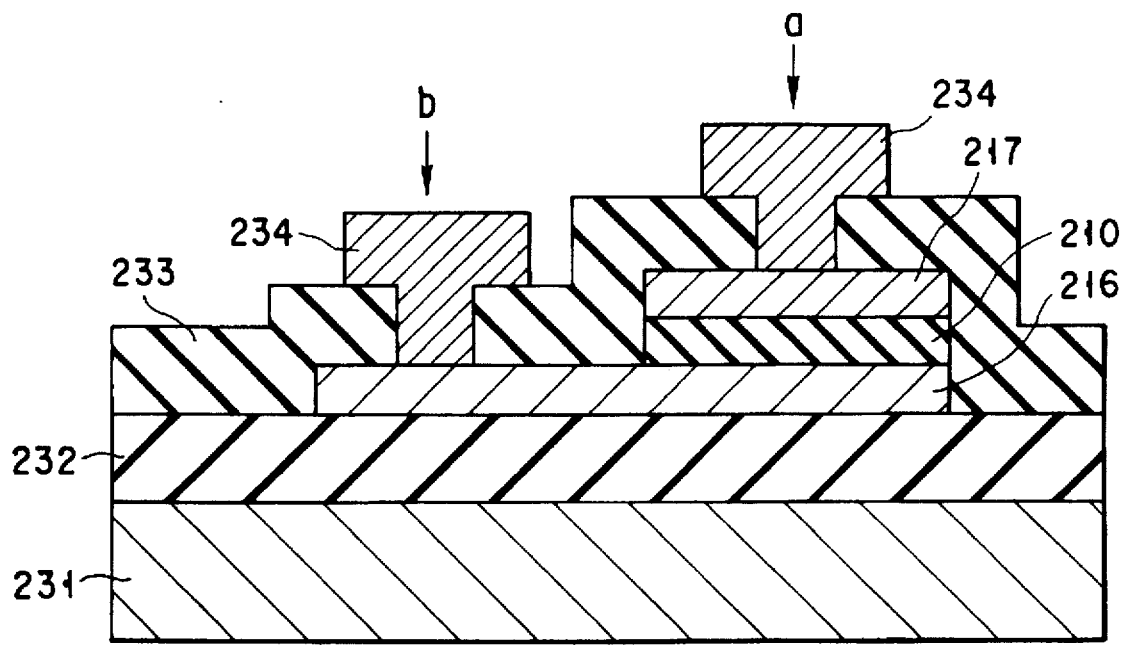
FIGS. 43A and 43B show the structure of a sample to be evaluated.
Figure 43B:
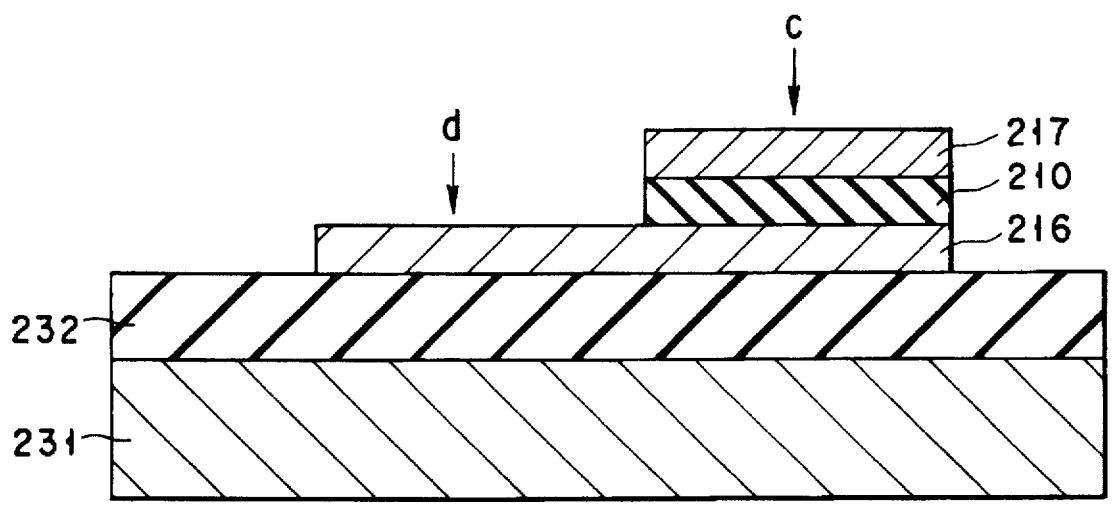
Figure 47:
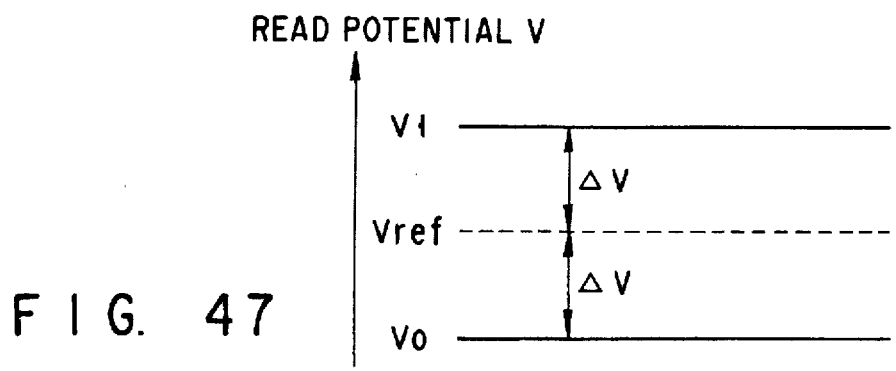
FIG. 47 shows signals used for the FIG. 44 embodiment.

FIGS. 43A and 43B show the structure of a sample to be evaluated actually. As shown in FIG. 43A, in a case of an $SrBi_2Ta_2O_9$ ferroelectric thin film 210, a memory cell 211 constituted by a 2,000-Å thick lower electrode 216 consisting of a Pt electrode, the ferroelectric thin film 210 having a thickness of about 2,000 Å, and a 2,000-Å thick upper electrode 217 consisting of a Pt electrode is stacked on an Si substrate 231 having a thermal oxide film 232. A 3,000-Å thick insulating interlayer 233 consisting of SAG, and a 3,000-521 thick wiring electrode 234 consisting of Pt are stacked on the resultant structure. Probes are brought into contact with at points a and b in FIG. 43A to apply a voltage and measure capacitances.. On the other hand, in a case of a $Pb(Zr_{0.45}Ti_{0.55})O_3$ ferroelectric thin film, a difference from the case of the $SrBi_2Ta_2O_9$ ferroelectric thin film 210 is that an insulating interlayer 233 and a wiring electrode 234 are not stacked, as shown in FIG. 43B, and that probes are brought into contact with points c and d to apply a voltage and measure capacitances. Probably, the difference between these structures influences the ferroelectric thin film 210 as a difference between stresses applied to the ferroelectric thin films 210 to cause the asymmetry of the $C_p$-$V_p$ of the ferroelectric cells 211. Further, the difference between the stresses reverses the direction of the $C_p$-$V_p$. When a thin film consisting of another material is stacked on an Si substrate, warping of the Si substrate changes depending on the shrinkage factor inherent to a material and conditions of forming a thin film. That is, a film stress makes the Si substrate distort. However, as it is not rare that unevenness reverses depending on films and their conditions, a stress to be applied to the ferroelectric thin film 210 greatly changes depending on structures, and the characteristics of the $C_p$-$V_p$ becomes asymmetrical. For this reason, the direction of the $C_p$-$V_p$ may be naturally reversed.. Note that this is merely a hypothesis, which will be described again to make sure asymmetry. Regardless of whether this interpretation is correct or not, it is confirmed that the asymmetry is present even if samples having the same structure are repeatedly manufactured.

Note that the memory of this embodiment has the same structure as that of a sample of the memory cell 211 consisting of $SrBi_2Ta_2O_9$ ferroelectric thin film, but the present invention is not limited to this structure depending on a memory arrangement. Therefore, it is important that the asymmetry of actual $C_p$-$V_p$ characteristics is detected to define the first poled state by poling in a direction of the lower electrode 216 or upper electrode 217.

As described above, since the first poled state is obtained by poling in a direction of the lower electrode 216 or upper electrode 217, the capacitance $C_o$ in the first poled state can be minimized, and a difference between the capacitance $C_o$ and the capacitance in the partially poled state can be increased. That is, a read margin can be set large, thereby realizing a ferroelectric memory which can perform a read operation at a high S/N ratio.

Further, as is apparent from FIGS. 37, 39, 40, and 41, the capacitance $C_p$ can be maximized by setting the second pulse (magnitude $V_w$ (absolute value)), i.e., the magnitude of a voltage for forming a partially poled state one or two times the coercive voltage $V_c$ of the ferroelectric thin film 210. That is, a read margin can be set large, thereby realizing a ferroelectric memory which can perform a read operation at a high S/N ratio.

The first poled state is obtained by poling in a direction of the lower electrode 216 or upper electrode 217 to minimum the capacitance $C_o$ in the first poled state. The magnitude $V_w$ (absolute value) of the second pulse, i.e., the magnitude of a voltage for forming a partially poled state is set one or two times the coercive voltage $V_c$ of the ferroelectric thin film 210 to maximize the capacitance $C_p$. With this operation, a large read margin can be assured, thereby realizing a ferroelectric memory which can perform a read operation at a very high S/N ratio, as a matter of course.

The 20th embodiment of the present invention will be described below with reference to FIGS. 44 to 49.

A characteristic feature of the 20th embodiment is a simple matrix arrangement. That is, a ferroelectric thin film 210 is interposed between a pair of striped electrodes which are almost perpendicular to each other with interposing the ferroelectric thin film 210 therebetween. Domains corresponding to crossing portions of the striped electrodes are defined as memory cells 220.

The operation of a memory in which the ferroelectric cells 211 have a simple matrix arrangement as described in the 19th embodiment will be described below. Upper and lower electrodes 217 and 216 of the ferroelectric thin film 210 are constituted by first and second striped electrodes 218 and 219. The upper electrodes 217 or the lower electrodes 216 may be first or second striped electrodes 218 or 219.

A write operation is performed in the following manner. First, the ferroelectric cells 220 are set in the first poled state. In this case, a desired cell 220 is selected by cell selection circuits 223, and the first pulse is applied only to the selected cell 220 from a first pulse output circuit 225 which outputs the first pulse. Then, a switch 228 is changed, and the second pulse is applied only to the selected cell from a second pulse output circuit 226 which outputs the second pulse. In a simple matrix arrangement as shown in FIG. 44, however, it is not easy to apply a voltage only to the selected cell. This is because, when a voltage is applied to the selected cell, a certain voltage is undesirably applied to non-selected cells due to mutual interference (crosstalk) with adjacent cells. For example, as shown in FIG. 45, capacitors C are made to have an n×n matrix arrangement. When $C_{ij}$ is selected, and a voltage having a magnitude of $V_a$ is applied thereto, a voltage applied to the cells including non-selected cells 220' has a value shown in FIG. 46. Therefore, this also changes poled states of the non-selected cells 220'. In consideration of this, this embodiment performs the write operation in the following manner.

More specifically, a poling setting operation for setting the first poled state is performed as follows. All the first striped electrodes 218 on X-lines are selected by the selection circuit 228, and all the second striped electrodes 219 on Y-lines are also selected by the selection circuit 228. A switch 229 is changed to a poling setting circuit side, and the first pulse is applied to all the cells. With this operation, all the cells are set in the first poled state. Next, a write operation for setting a partially poled state is performed by electrically connecting the switch 229 to a write circuit side in the following manner.

For example, a voltage $V_w/3$ is applied to the first selected striped electrode 218 on the X-line; 0 V, to first non-selected striped electrodes 218'; 0 V, to the second selected striped electrode 219 on the Y-lines; and a voltage $2V_w/3$, to second non-selected striped electrodes 219'. With this operation, the voltages $V_w$ and $\pm V_w/3$ are applied to the selected cell 220 and the non-selected cells 220', respectively. Therefore, only the low voltage $V_w/3$ is applied to the non-selected cells 226', thereby preventing the non-selected cells from being poling destruction. That is, the second pulse having the magnitude $V_w$ is applied to the selected cell 220, and a poled state is set in an intended partially poled state, i.e., an operation for writing data can be performed. This operation is sequentially performed, cells desired to be set in a partially poled state are set in the partially poled state, and then the write operation is ended.

As for a read operation, in a similar manner to the write operation, e.g., the third pulse for the read operation is applied as follows. A voltage $V_r/3$ is applied to the selected first striped electrode 218 on the X-lines; 0 V, to the non-selected first striped electrodes 218'; 0 V, to the selected second striped electrode 219 on the Y-lines; a voltage $2V_r/3$, to the non-selected second striped electrodes 219'; and voltages $\pm Vr/3$, to the non-selected cells 220'. Therefore, only a low voltage $V_w/3$ is applied to the non-selected cells 220'. A signal amount from the non-selected cells 220' is very small, so data flowing into a read circuit is mainly from the selected cell 220 to make it possible to discriminate "1" from "0".

As described above, the voltage $V_w$ is applied to the selected cell 220, and only the voltage $V_w/3$ is applied to the non-selected cells 220'. This method is generally called a ⅓ driving method.

This ⅓ driving method will be described below with reference to circuit diagrams in FIGS. 56A and 56B. Referring to these drawings, a 3×3 matrix constituted by lines X1, X2, X3, Y1, Y2, and Y3 is exemplified as shown in FIG. 65A, and a case in which a cell C22 is selected, and a voltage having a magnitude of $V_d$ will be described. When the cell C22 is selected, the line X2 is connected to a node A1, the lines Y1 and Y3 are connected to a node A2, the lines X1 and X3 are connected to a node A3, and the line Y2 is grounded. At this time, the nodes A1, A2, and A3 are arranged to respectively have potentials Vd, 2Vd/3, and Vd/3 by, e.g., a resistance element R, a proper element, or a circuit. In addition, in order to properly apply a voltage, the nodes may be connected not directly to the lines but to the lines through an impedance conversion element or circuit (not shown).

By connecting the lines in the above manner, its equivalent circuit becomes the one shown in FIG. 56B. The selected cell C22 is present between the nodes A1 and A4. Since the potential of the node A1 is Vd, and that of the node A4 is at a GND level, a voltage applied to the selected cell C22 is Vd. Cells C12 and C32 are present between the nodes A1 and A2, cells C13 and C33 are present between the nodes A2 and A3, and cells C21 and C23 are present between the nodes A3 and A4. For this reason, by applying a difference between the potentials supplied to the nodes, all the voltages become Vd/3. Therefore, when the cell C22 is selected, and a voltage having a magnitude of Vd is applied, a voltage Vd/3 is applied to other cells, as shown in FIG. 56C.

The operation using a simple matrix has been described above. The magnitude and direction of an applied pulse comply with the 19th embodiment, as a matter of course.

Next, a read operation will be described in more detail. More specifically, as shown in FIG. 44, the read operation uses a comparison amplifier 235 for comparing and amplifying two signals. One input terminal 236a of the comparison amplifier 235 receives a signal, i.e., a signal V1 in a case of data "1", or a signal V0 in a case of data "0" from a memory cell. The other terminal 236b receives a signal $V_{ref}$ from a dummy cell 237. At this time, a required load, a required switch, and the like (not shown) are properly connected to the dummy cell side. The magnitudes of the signals are set to have the relationship shown in FIG. 47. Therefore, signal differences ΔV in FIG. 47 serve as read margins. The differences ΔV are compared and amplified by the comparison amplifier 235, and the obtained value is compared whether it is larger or smaller than the signal $V_{ref}$ to discriminate data "1" and "0". In order to discriminate whether data stored in the memory cell 220 is "1" or "0", the data must be compared with a certain reference to determine its magnitude.

Therefore, only a signal from the memory cell 220 is amplified by a proper amplifier. Then, a preset value is used as a reference. Alternatively, a signal set outside the memory device may be used as a reference. However, taking into consideration deterioration in characteristics with respect to the number of times of access, weatherproof characteristics to a use environment, and the like, a cell identical to the memory cell which is set in the same environment as that of the memory cell, i.e., a cell identical to the memory cell, which is set in the same memory device as that of the memory cell is defined as a dummy cell 232. A signal from the dummy cell 232 is used as a reference. This arrangement has a higher reliability. In this read method, the difference ΔV serves as a read margin as described above. A memory device in which the read margin is further increased to increase a read S/N ratio will be described.

Although this embodiment essentially follows FIG. 44, it will be described with reference to FIG. 49. Two memory cells 220-1 and 220-2 corresponding to crossing portions of first striped electrodes 238-1 and 238-2 and second striped electrodes 239 which are perpendicular to each other to interpose the ferroelectric thin film 210 therebetween are defined as one memory unit. Although one memory cell 220 constitutes one memory unit in FIG. 44, two memory cells constitute one memory unit in FIG. 49. In this case, two memory cells are not necessarily adjacent to each other, and they may be arranged in a one-to-one correspondence. For the sake of easy understanding, assume that two memory cells are adjacent to each other. Data opposite to each other are respectively written in the memory cells 220-1 and 220-2 so that the memory cells 220-1 and 220-2 have opposite data such as data "1" and "0", or "0" and "1". A signal from the memory cell 220-1 flows into the one input terminal 236a of the comparison amplifier 235, and a signal from not a dummy cell but the memory cell 220-2 flows into the other input terminal 236b. Two signals are compared and amplified. Of course, assume that required components such as a load, a switch, and the like are satisfied (not shown).

Figure 48:
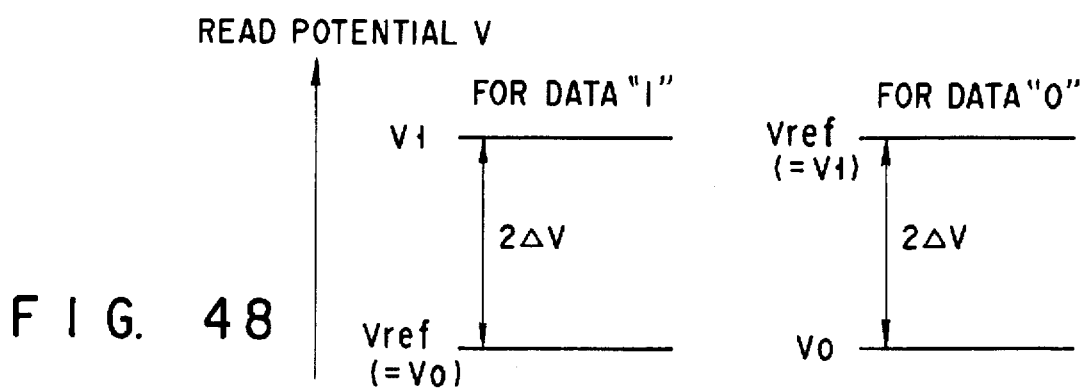
FIG. 48 shows signals pertaining to the FIG. 49 arrangement.

In this case, a signal from the dummy cell does not serve as a reference, but complementary data serves as a reference signal. That is, the memory cell 220-1 is defined as a cell storage data, and the memory cell 220-2 is defined as a reference cell for discriminating data. The present invention is not limited to this definition, and the definition may be reversed. For example, when data "0" is stored in the memory cell 220-1, data "1" is stored in the reference cell 220-2. The relationship between the magnitudes of signals read out from these cells is shown in FIG. 48. In contrast, when data "1" is stored in the memory cell 220-1, data "0" is stored in the reference cell 220-2. For this reason, the relationship between the magnitudes of signals read out from these cells is reversed (FIG. 48). In memory cells under the same conditions (e.g., a ferroelectric thin film material, a cell area, a poled state, an applied voltage, . . . ), a signal V1 with respect to the data "1", and a signal V0 with respect to the data "0" correspond to magnitudes shown in FIG. 47. Therefore, a read margin becomes twice, i.e., 2ΔV. Compared to a memory having the arrangement shown in FIG. 44, a read S/N ratio is greatly increased.

As described above, the ferroelectric thin film 210 is interposed between the electrodes comprising the first striped electrodes 218 as a plurality of parallel stripped electrodes each constituting one of the pair of electrodes or as a plurality of parallel stripped electrodes each electrically connected to one of the pair of electrodes, and the second striped electrodes 219 as a plurality of parallel stripped electrodes each constituting the other of the pair of electrodes or as a plurality of parallel stripped electrodes each electrically connected to the other of the pair of electrodes. The first striped electrodes 218 and the second striped electrodes 219 are perpendicular to each other to interpose the ferroelectric thin film 210 therebetween. The crossing domains of the first and second striped electrodes 218 and 219 are defined as the memory cells 220. In the ferroelectric memory having the above arrangement, the two memory cells 220-1 and 220-2 are paired to constitute one memory unit. One of the memory cells 220-1 and 220-2 is electrically connected to one input terminal of the comparison amplifier 235, and the other memory cell is electrically connected to the other input terminal of the comparison amplifier 235. Signals are compared, and its difference is amplified to perform a read operation.

The two memory cells 220-1 and 220-2 are paired to constitute one memory unit, and either the same or different data are written in the memory cells 220-1 and 220-2. Then, signals are compared, and its difference is amplified. With this operation, a read margin can be increased, and the read operation can be performed at a high S/N ratio.

As the 21th embodiment of the present invention, another modification of a ferroelectric memory having the single matrix arrangement described in the 20th embodiment will be described below with reference to FIGS. 50A and 50B.

Figure 50A:
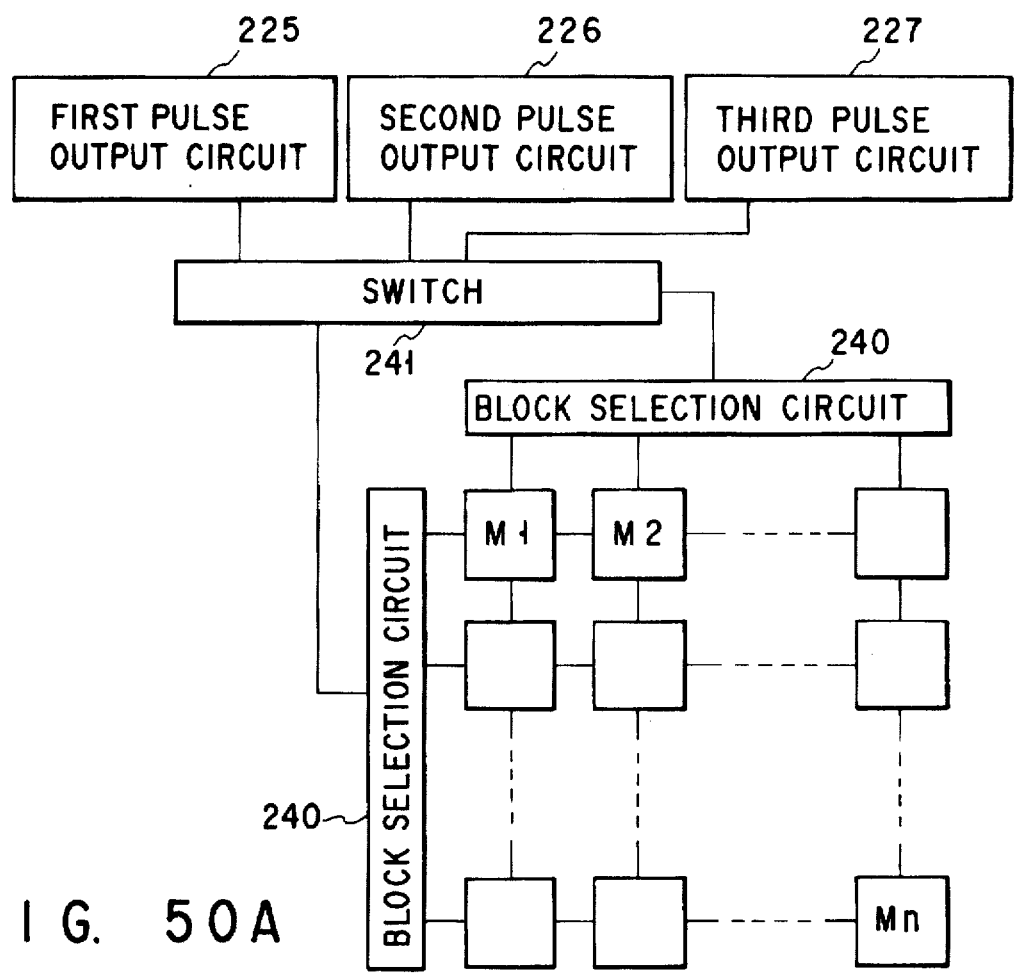
FIGS. 50A and 50B show a further embodiment of the present invention.
Figure 50B:
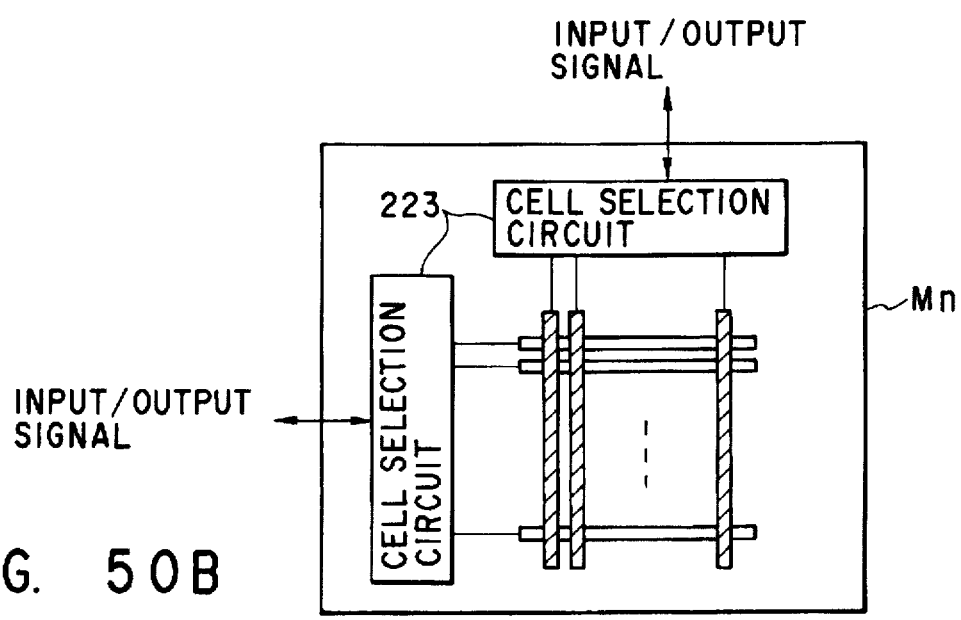

As shown in FIG. 50A, a ferroelectric memory having a total of n memory units is arranged to be divided into a plurality of blocks (M1, M2, M3, ...). The blocks are electrically separated or connected by block selection circuits 240, as needed. The arrangement in one block complies with that described in the 20th embodiment. In the block, a ferroelectric thin film 210 is interposed between a pair of striped electrodes 218 and 219 which are almost perpendicular to each other to interpose the ferroelectric thin film 210 therebetween. Domains corresponding to crossing portions of the striped electrodes 218 and 219 are defined as memory cells. The block comprises cell selection circuits 223 for selecting desired memory cells. First, the block selection circuits 240 select a block, and the cell selection circuits 223 select a desired memory cell. The block selection and the cell selection are not necessarily performed in an order of time-series as described above, and they can be performed at once or in reversed order without any trouble.

A write operation is performed by setting all the cells in the first poled state at once and setting a desired memory cell in a partially poled state. In this method, all the cells are set in the first poled state at once. Even when one memory unit is rewritten, all the memory cells must be rewritten. For this reason, in a large-capacity memory, this operation is very time-consuming, and avoids an increase in access speed. However, if a memory is divided into a plurality of blocks as exemplified in this embodiment, the above write operation can be performed each block. Therefore, the above write operation is performed only on a block including the memory cell 211 subjected to be rewritten, thereby increasing the access speed to the memory. When all the memory cells are to be rewritten, the block selection circuits 240 may select all the block at once. As needed, each block may comprise a first pulse output circuit 225, a second pulse output circuit 226, a third pulse output circuit 227, and the like. Alternatively, all the first pulse output circuit 225, the second pulse output circuit 226, the third pulse output circuit 227, and the like may be set outside the block selection circuits 240 through a switch 241.

Further, assume that the ferroelectric memory of this embodiment is used as a digital image file. In a case of an image, no rewrite operation is performed only on data of one bit or several bits. One image or a certain units of data is rewritten. Therefore, the memory capacity of one block is constituted by its data unit. With this arrangement, the rewrite operation is performed every data unit subjected to be rewritten. The ferroelectric memory is arranged to comprise a plurality of blocks each using a data unit as a memory capacity, so the ferroelectric memory for an image film at a high access speed can be provided.

The 22th embodiment of the present invention will be described below. That is, a magnitude $V_e$ (absolute value) of the first pulse used when a ferroelectric thin film 210 in the first poled state is set in a poled state in the above embodiments will be described.

FIGS. 39 and 40 show measurement data of a magnitude $V_a$ of an applied pulse and an inverted polarization amount with respect to an $SrBi_2Ta_2O_9$ ferroelectric thin film, and FIG. 41 shows measurement data of the magnitude $V_a$ of an applied pulse and the inverted polarization amount with respect to a $pb(Zr_{0.45}Ti_{0.55})O_3$ ferroelectric thin film. As is apparent from these drawings, poling of the ferroelectric thin film is nonlinearly inverted with the applied voltage Va, and the inverted polarization amount is saturated when the applied voltage $V_a$ becomes 2 to 2.5 times a coercive voltage $V_c$. That is, even if the applied voltage $V_a$ is further increased, the inverted polarization amount does not increase. In other words, when a pulse having a magnitude 2 to 2.5 times the coercive voltage $V_c$ is applied, poling of the ferroelectric thin film can be completely inverted, which is called complete inversion. As described in the above embodiments, the memory of this embodiment utilizes the first poled state and a partially poled state as storage states, and reads a difference $\Delta C$ between capacitances. For this reason, the difference $\Delta C$ is preferably large.

As is apparent from these drawings, a $C_p$-$V_p$ curve which shows a capacitance $C_p$ in the resultant partially poled state with respect to a voltage $V_p$ for forming partial poling is asymmetrical. A capacitance $C_o$ at $V_p = 0$ changes depending on upper electrodes 217 or lower electrodes 216 to which a voltage is applied, and this value $C_o$ is a capacitance with respect to data "0".

In these drawings, 1) a sufficient voltage (−5 V with respect to the sample) is applied in the negative direction, 2) the voltage $V_p$ is applied after setting the first poled state obtained by complete inversion poling, and 3) a partially poled state is formed, and the capacitance $C_p$ is measured.

The above processing is repeated such that the processing returns to 1), the voltage $V_p$ is changed as a parameter, then the capacitance $C_p$ is measured.... Therefore, the value $C_o$ is a capacitance in a completely inverted state. In order to maximize the read margin $\Delta C$, the first poled state must be set to be a completely inverted poled state. This is because the capacitance $C_o$ can be minimized by utilizing the asymmetry described in the 19th embodiment. In order to maximize the read margin $\Delta C$, the capacitance $C_o$ in the first poled state is minimized, and a capacitance in the partially poled state is maximized. With this operation, the read margin $\Delta C$ can be maximized, and the memory at a high S/N ratio can be realized.

By applying the first pulse having a magnitude twice or more the coercive voltage $V_c$ of the ferroelectric thin film 210, the first poled state can be set to be a completely poled state, and a difference between the capacitance of the completely poled state and that of the partially poled state as the other storage state can be maximized. Therefore, the read operation can be performed at high S/N ratio.

The 23th embodiment of the present invention will be described below. As is apparent from FIG. 37, the first pulse having a magnitude 2 to 2.5 times a coercive voltage $V_c$ of a ferroelectric thin film 210 is applied to completely invert poling. The first negative pulse having a magnitude 2 to 2.5 times the coercive voltage $V_c$ of the ferroelectric thin film 210 is applied to set a poled state of the ferroelectric thin film 210 in the first poled state in the negative direction. Then, the second positive pulse having a magnitude 0.3 to 2.5 times the coercive voltage $V_c$ of the ferroelectric thin film 210 is applied to form a partially poled state (FIG. 37). The present inventors found that this method could be applied to both an $SrBi_2Ta_2O_9$ thin film which had been studied as a representative ferroelectric memory, and a $Pb(Zr_{0.4}Ti_{0.6})O_3$ ferroelectric thin film. It was also confirmed that the partially poled state was very stable.

By applying the second pulse having a magnitude $V_w$ (absolute value) 0.3 to 2.5 times the coercive voltage $V_c$ of the ferroelectric thin film 210, the very stable partially poled state can be formed.

In addition, the first poled state need not always be inverted completely. If a required read margin ΔC is obtained, the ferroelectric memory of this embodiment can be realized. Therefore, it is not essential to define the first poled state as the completely inverted poled state. The first poled state may be formed by an applied voltage properly set in the whole memory system. In this case, the first poled state is generally formed by the maximum applied voltage which is allowed in the whole memory system, but the present invention is not limited to this.

The 24th embodiment of the present invention will be described below. That is, a voltage used when the third pulse is applied to read data in memory cells 211, or memory cells 220-1 and 220-2 in the simple matrix described in the 20th embodiment will be described. Generally, taking a memory function into consideration, the same cell in the same state is read $10^6$ or $10^7$ times. If a change in polarization amount of the memory cell upon a read operation is about 10% the original amount, this memory can be allowed in terms of a design.

FIGS. 51, 52, 53, and 54 show the relationship between an applied voltage $V_d$ with respect to an $SrBi_2Ta_2O_9$ ferroelectric thin film and a poling destruction amount $P_d$. FIGS. 51 and 52 show data with respect to the first poled state formed by applying the first negative pulse having a magnitude 2.5 times or more a coercive voltage $V_c$ of a ferroelectric thin film 210, and completely inverting poling. FIGS. 53 and 54 show data with respect to a partially poled state formed by applying the second positive pulse having a magnitude 1.5 times the coercive voltage $V_c$ of the ferroelectric thin film 210 after the first poled state is formed by applying, the first negative pulse having a magnitude 2.5 times or more the coercive voltage $V_c$ of the ferroelectric thin film 210, and completely inverting poling. The partially poled state formed by applying the second positive pulse having a magnitude 1.5 times the coercive voltage $V_c$ is a poled state having the maximum value $C_{pmax}$ described in the above embodiments. FIGS. 51 and 53 show data obtained when a one-sided positive poling pulse having a magnitude $V_d$ is applied, and FIGS. 52 and 54 show data obtained when a two-sided poling pulse having the magnitude $V_d$ is applied. As is apparent from these drawings, if the voltage is 0.3 times or less the coercive voltage $V_c$ of the ferroelectric thin film 210, a change in poling, i.e., a destruction amount is 10% the original polarization amount with respect to the one-sided poling pulse or the two-sided poling pulse upon read operations performed $10^9$ times.

Therefore, the third one-sided or two-sided poling pulse, which has the maximum amplitude value 0.3 times or less the coercive voltage $V_c$ of the ferroelectric thin film 210 and has a reference in a zero-biased state, is applied to the memory cell 211 poled in the first poled state or the partially poled state, and data stored in the memory cell 211 is read out. With this operation, the read operation can be performed without changing a poled state, i.e., without destructing a storage state.

The 25th embodiment of the present invention will be described below. The 25th embodiment of the present invention will be described with reference to FIGS. 44, 45, and 46. This embodiment employs a simple matrix arrangement. That is, a ferroelectric thin film 210 is interposed between a pair of striped electrodes which are almost perpendicular to each other to interpose the ferroelectric thin film 210 therebetween. Domains corresponding to crossing portions of the striped electrodes are defined as memory cells 220.

The operation of a memory in which ferroelectric cells 211 have the simple matrix arrangement as described in the 19th embodiment will be described below. Upper electrodes 217 and lower electrodes 216 of the ferroelectric thin film 210 are constituted by first striped electrodes 218 and second striped electrodes 219. The upper electrodes 217 or the lower electrodes 216 may be the first or second striped electrodes 218 or 219.

A write operation is performed in the following manner. First, the ferroelectric cells 220 are set in the first poled state. In this case, a desired cell 220 is selected by cell selection circuits 223, and the first pulse is applied only to the selected cell 220 from a first pulse output circuit 225 which outputs the first pulse. Then, a switch 228 is changed, and the second pulse is applied only to the selected cell from a second pulse output circuit 226 which outputs the second pulse. In a simple matrix arrangement as shown in FIG. 44, however, it is not easy to apply a voltage only to the selected cell 220. This is because, when a voltage is applied to the selected cell, a certain voltage is undesirably applied to non-selected cells due to mutual interference (crosstalk) with adjacent cells. For example, as shown in FIG. 45, capacitors C are made to have an n×n matrix arrangement. When $C_{ij}$ is selected, and a voltage having a magnitude of $V_a$ is applied thereto, a voltage applied to the cells including non-selected cells becomes the one shown in FIG. 46. Therefore, the voltage also changes poled states of non-selected cells 220'. In consideration of this, this embodiment performs a write operation in the following manner. A poling setting operation for setting the first poled state is performed as follows. All the first striped electrodes 218 on X-lines are selected by the selection circuit 228, and all the second striped electrodes 219 on Y-lines are also selected by the selection circuit 228. A switch 229 is changed to a poling setting circuit side, and the first pulse is applied to all the cells. With this operation, all the cells are set in the first poled state. Next, a write operation for setting a partially poled state is performed in the following manner by electrically connecting the switch 229 to a write circuit side.

More specifically, a voltage $V_w/3$ is applied to the first selected striped electrode 218 on the X-line; 0 V, to first non-selected striped electrodes 218'; 0 V, to the second selected striped electrode 219 on the Y-line; and a voltage $2V_w/3$, to second non-selected striped electrodes 219'. With this operation, the voltages $V_w$ and $\pm V_w/3$ are applied to the selected cell 220 and the non-selected cells 220', respectively. Here, this method of applying a voltage is named the ⅓ driving method. At this time, as is apparent from FIGS. 51 to 54, if the magnitude of an applied voltage is at least 0.3 times or less the coercive voltage $V_c$ of the ferroelectric thin film 210, a change in poling, i.e., a destruction amount is 10% the original polarization amount with respect to a one-sided poling pulse or a two-sided poling pulse upon read operations performed $10^9$ times. Therefore, if the voltage $\pm V_w/3$ to be applied to the non-selected cells 220' is about 0.3 times the coercive voltage $V_c$ of the ferroelectric thin film 210, the poled states, i.e., memory data of the cells 220' are not destructed.

The second pulse having the magnitude $V_w$ (absolute value) equal to or lower than the coercive voltage $V_c$ of the ferroelectric thin film 210 is applied to the selected cell 220 to form the partially poled state. With this operation, the selected memory cell 220 can be set in the stable partially poled state without destructing the storage states of the non-selected cells 220'. That is, the write operation can be performed without interference with other memory cells.

Figure 49:
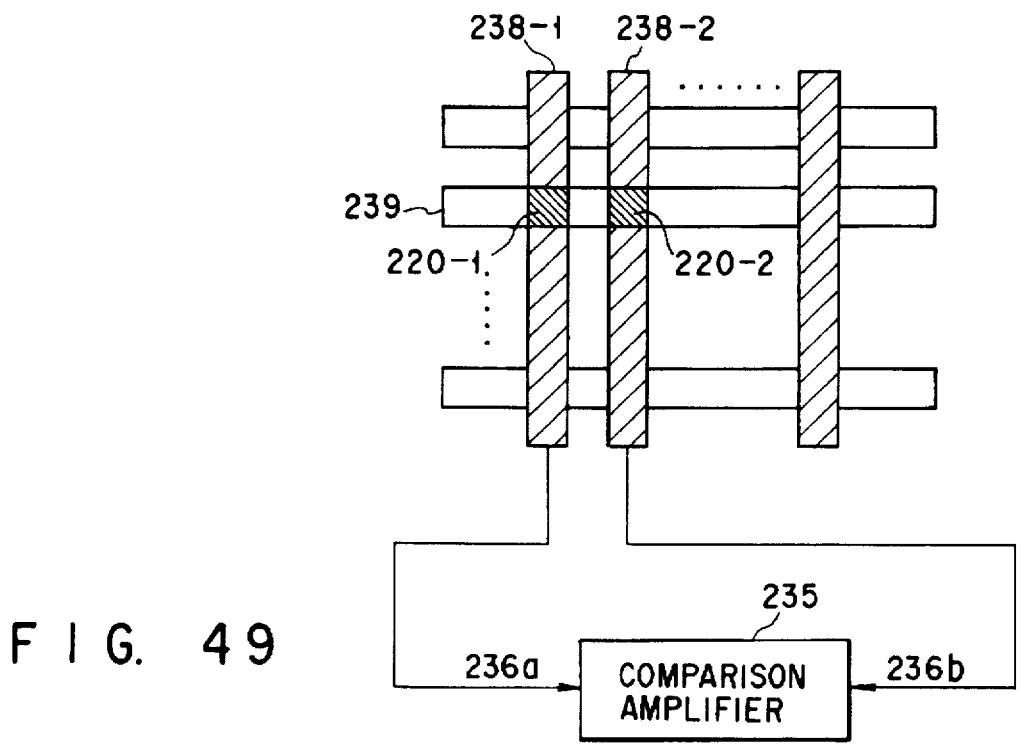
FIG. 49 is a memory cell arrangement of the FIG. 44 embodiment.

As shown in FIG. 49, this embodiment can be applied to a ferroelectric memory having a simple matrix arrangement in which two memory cells constitute one memory unit. That is, two memory cells 220-1 and 220-2 corresponding t6 crossing domains of first striped electrodes 238-1 and 238-2 and second striped electrodes 239 which are almost perpendicular to each other to interpose the ferroelectric thin film 210 therebetween are defined as one memory unit. Although one memory cell 220 constitutes one memory unit in FIG. 44, two memory cells constitute one memory unit in FIG. 49. In this case, two memory cells are not necessarily adjacent to each other, and they may be arranged in a one-to-one correspondence. A detailed description of this memory has been described in the 22th embodiment. The ⅓ driving method is also applied to this memory. The second pulse having the magnitude $V_w$ (absolute value) equal to or smaller than the coercive voltage $V_c$ of the ferroelectric thin film 210 is applied to the memory cells 220-1 and 220-2 to form the partially poled state. With this operation, the selected memory cells 220-1 and 220-2 can be set in the stable partially Doled state without destructing the storage states of the non-selected cells 220'. That is, the write operation can be performed without interference with other memory cells.

Therefore, the second pulse having the magnitude $V_w$ (absolute value) equal to or smaller than the coercive voltage $V_c$ of the ferroelectric thin film 210 is applied to form the partially poled state. With this operation, the selected memory cells 220-1 and 220-2 can be set in the stable partially poled state without destructing the storage states of the non-selected cells 220'. That is, the write operation can be performed without interference with other memory cells. In addition, the two memory cells 220-1 and 220-2 are paired to constitute one memory unit. Either the same or different data are written in the memory cells 220-1 and 220-2, and the sum or difference of these data is read out. With this operation, the read operation can be performed at a high S/N ratio.

Note that a so-called anti-ferroelectric thin film may be used as the ferroelectric thin film of this embodiments. In this case, a proper bias voltage is applied in advance. With this operation, data "0" and "1" can be written in or read out by using the first poled state and the partially poled state as described above.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A ferroelectric memory device, comprising:
   a ferroelectric memory having a ferroelectric thin film as a memory cell;
   first pulse application means for applying a first pulse having a voltage higher than a coercive voltage of said ferroelectric thin film to said ferroelectric memory to perform poling to a first poled state, in a first direction, of two spontaneous poled states; and
   second pulse application means for recording information by applying a second pulse having a second voltage with a polarity opposite to a polarity of the first pulse to form a partially poled state in which a domain having the poled state in the first direction and a domain having a second poled state in a second direction opposite to the first direction are mixed.

2. A memory device according to claim 1, further comprising:

a semiconductor substrate on which a pair of impurity regions are provided, wherein said ferroelectric thin film electrically connected with a channel region between said pair of impurity regions is formed on said channel region, and a conductive electrode is provided as a gate electrode on said ferroelectric thin film.

3. A memory device according to claim 2, wherein one of said pair of impurity regions is defined as a source region, the other is defined as a drain region, and a MOSFET is connected with said source region and a MOSFET is connected with said drain region.

4. A memory device according to claim 3, wherein a gate electrode of each said MOSFET is provided to overlap said gate electrode on said ferroelectric thin film.

5. A memory device according to claim 2, wherein one of said pair of impurity regions is defined as a source region, the other is defined as a drain region, and a MOSFET is connected with any one of said source region and said drain region.

6. A memory device according to claim 5, wherein a gate electrode of said MOSFET is provided to overlap said gate electrode on said ferroelectric thin film.

7. A memory according to claim 2, wherein said semiconductor substrate consists of an n-type semiconductor, and said impurity regions consist of a p-type semiconductor.

8. A memory according to claim 2, wherein said semiconductor substrate consists of a p-type semiconductor, and said impurity regions consist of an n-type semiconductor.

9. A memory according to claim 2, wherein said ferroelectric thin film comprises at least two stacked ferroelectric thin films.

10. A memory according to claim 2, further comprising:

a dielectric layer formed between said channel region and said ferroelectric thin film.

11. A memory according to claim 2, further comprising:

a dielectric layer and a metal layer formed between said channel region and said ferroelectric thin film.

12. A memory according to claim 1, further comprising:

third pulse application means for applying, to said ferroelectric thin film, a third voltage which is lower than the second voltage and has the same polarity as the polarity of the second voltage to read out the information written in said ferroelectric memory.

13. A memory device according to claim 12, wherein a third pulse is applied to a memory cell poled in the first poled state or the partially poled state, and has a maximum value of an amplitude not more than 0.3 times a coercive voltage Vc of said ferroelectric thin film.

14. A memory device according to claim 1, wherein a magnitude Vw (absolute value) of the second pulse is set to 0.3 to 2 times the coercive voltage of said ferroelectric thin film.

15. A memory device according to claim 1, wherein a magnitude Ve (absolute value) of the first pulse and a magnitude Vw (absolute value) of the second pulse satisfy Vw≦Ve.

16. A memory device according to claim 1, wherein a pulse width Ww of the second pulse is 1% to 300% of a pulse width We of the first pulse.

17. A memory device according to claim 16, wherein the pulse width We of the first pulse and the pulse width Ww of the second pulse satisfy Ww≦We.

18. A memory device according to claim 1, wherein a polarization amount of the partially poled state is 10% to 90% of a polarization amount of a first poled state.

19. A memory device according to claim 1, further comprising:
detection means for detecting a difference between the first poled state and the partially poled state as a difference between capacitances.

20. A memory device according to claim 1, wherein said detection means comprises third pulse application means for applying a third pulse to said ferroelectric memory so as to read out a poled state of the partially poled state.

21. A memory device according to claim 20, wherein said detection means further comprises a sense circuit for detecting a read signal, and the third pulse has a pulse width longer than a set time for said sense circuit.

22. A memory device according to claim 20, wherein the third pulse has a pulse height not more than 0.3 times the coercive voltage of said ferroelectric thin film.

23. A memory device according to claim 20, wherein a pulse height or pulse width of the third pulse is smaller than a pulse height or pulse width of the second pulse.

24. A memory device according to claim 20, wherein the third pulse is an AC signal having a baseline in a biased state.

25. A memory device according to claim 24, wherein a maximum value of an amplitude of the third pulse is not more than 0.3 times the coercive voltage of said ferroelectric thin film.

26. A memory device according to claim 24, wherein the third pulse has a rise time tr longer than a set time of a sense circuit.

27. A memory device according to claim 20, wherein the third pulse is applied to a memory cell poled in the first poled state or the partially poled state, and has a maximum value of an amplitude not more than 0.3 times a coercive voltage Vc of said ferroelectric thin film.

28. A memory device according to claim 27, wherein the third pulse is applied to a memory cell poled in the first poled state or the partially poled state, and has the maximum value of the amplitude not more than 0.3 times the coercive voltage Vc of said ferroelectric thin film.

29. A memory according to claim 1,
wherein said ferroelectric memory forms a memory cell and there are a plurality of said memory cells, and further comprising:
first stripe electrodes, each of a plurality of said memory cells being electrically connected with one of said first stripe electrodes;
second stripe electrodes crossing said first stripe electrodes at a different height level from that of said first stripe electrodes, each of a plurality of said memory cells being electrically connected with said second electrodes;
a selection circuit for selecting a desired memory cell;
a write circuit for respectively writing information in said memory cells; and
a read circuit for reading out the information written in said memory cells.

30. A memory device according to claim 29, wherein said write circuit is connected with said first stripe electrodes through said selection circuit.

31. A memory device according to claim 29, wherein said write circuit is connected with each of said first stripe electrodes.

32. A memory device according to claim 29, wherein said read circuit is connected with said second stripe electrodes through said selection circuit.

33. A memory device according to claim 29, wherein said read circuit is connected with each of said second stripe electrodes.

34. A memory device according to claim 29, wherein, when poling of said memory cells is to be set in the poled state in the first direction, a plurality of memory cells are defined as one block, and the first pulse is applied in units of blocks.

35. A memory device according to claim 31, wherein the voltage of the second pulse to be applied in a write operation is controlled to apply Vw to a first stripe electrode connected with a memory cell in which data is to be written, Vw/3 to said remaining first stripe electrodes, 0 V to a second stripe electrode connected with said memory cell in which the data is to be written, and 2Vw/3 to said remaining second stripe electrodes.

36. A memory device according to claim 31, wherein the voltage of the second pulse to be applied in a write operation is controlled to apply Vw/2 to a first stripe electrode connected with a memory cell in which data is to be written, 0 V to said remaining first stripe electrodes, −Vw/2 to a second stripe electrode connected with said memory cell in which the data is to be written, and 0 V to said remaining second stripe electrodes.

37. A memory device according to claim 34, wherein said blocks are electrically separated.

38. A memory device according to claim 37, wherein a magnitude Vw (absolute value) of the second pulse is smaller than a magnitude of the first pulse and 0.3 to 2.5 times the coercive voltage of said ferroelectric thin film.

39. A memory according to claim 29, further comprising:
impedance means for keeping each of said first stripe electrodes and/or each of said second stripe electrodes at a low impedance; and
switching means for selectively connecting each of said first stripe electrodes and/or each of said second stripe electrodes with said impedance means or said selection circuit.

40. A memory device according to claim 39, wherein a rise time of the second pulse is shorter than a time constant determined by a resistance of said impedance means and capacitances of said first stripe electrodes or said second stripe electrodes.

41. A memory device according to claim 39, wherein said read circuit comprises detection means for detecting a difference between a capacitance of the first poled state and a capacitance of the partially poled state by applying a third pulse having a polarity opposite to the polarity of the second pulse to said ferroelectric thin film.

42. A memory device according to claim 41, wherein a rise time of the third pulse is longer than a time constant determined by a resistance of said impedance means and capacitances of said first stripe electrodes or said second stripe electrodes.

43. A memory device according to claim 29, wherein
either said first stripe electrodes or said second stripe electrodes are paired to be arranged parallel, pairs of electrodes are connected with said common first stripe electrodes, each of pairs of memory cells connected with a corresponding pair of electrodes constitutes one memory unit, and said selection circuit, said write circuit, and said read circuit select memory units to perform write and read operations.

44. A memory device according to claim 43, wherein
data is read out by comparing a difference between signals from said pairs of memory cells.

45. A memory device according to claim 43, wherein
one of said pair of memory cells is a linear capacitive element.

46. A memory device according to claim 44, wherein
said third stripe electrode connected with a memory cell from which data has been read out is selected again upon a read operation.

47. A memory according to claim 46, wherein
said read circuit comprises a differential sense amplifier, and
said third stripe electrode electrically connected with one of said pair of memory cells is connected to one input terminal of said differential sense amplifier, and said third stripe electrode electrically connected with the other of said pair of memory cells is connected with the other input terminal of said differential sense amplifier.

48. A memory device according to claim 47, wherein
a magnitude Vw of the second pulse is not more than the coercive voltage of said ferroelectric thin film.

49. A memory device according to claim 29, further comprising:
a plurality of switching devices, each of switching devices having three terminals, and a first terminal of said three terminals being connected with said second stripe electrode, and a second terminal of said three terminals being connected with said memory cell; and
third stripe electrodes, a third terminal of said three terminals of each switching device being connected with said third stripe electrode.

50. A memory device according to claim 44, wherein
each switching device is an FET type semiconductor transistor, and said third terminal is a gate of said transistor.

51. A memory device according to claim 44, wherein
said first stripe electrodes are arranged parallel to said third stripe electrodes.

52. A memory device according to claim 44, wherein
said first stripe electrodes are arranged perpendicularly to said second stripe electrodes.

53. A memory device according to claim 44, wherein
a power supply voltage is applied to all said first stripe electrodes.

54. A memory device according to claim 53, wherein,
when the poled state in the first direction is written in one of said pair of memory cells, the second poled state is written in the other, and when the poled state in the second direction is written in one of said pair of memory cells, the poled state in the first direction is written in the other.

55. A memory device according to claim 44, wherein
a voltage ½ the voltage of the second pulse is applied to all said first stripe electrodes.

56. A memory device according to claim 29, wherein
two memory cells are paired to constitute one memory unit.

57. A memory device according to claim 56, wherein
said read circuit comprises a differential sense amplifier, and one of said pair of memory cells is connected to one input terminal of said differential sense amplifier, and the other of said pair of memory cells is connected with the other input terminal of said differential sense amplifier.

58. A memory device according to claim 29, wherein
a magnitude Vw (absolute value) of the second pulse is not more than a coercive voltage Vc of said ferroelectric thin film, and a voltage ⅓ the magnitude Vw of the second pulse is applied to said first stripe electrodes.

59. A memory device according to claim 1, further comprising:
a substrate,
wherein said ferroelectric thin film is formed on said substrate, and the poled state in the first direction is a poled state in which a positive charge is output to side opposite to said substrate.

60. A memory device according to claim 1, further comprising:
substrate,
wherein said ferroelectric thin film is formed on said substrate, and the poled state in the first direction is a poled state in which a positive charge is output to substrate side.

61. A memory device according to claim 1, wherein
a magnitude Ve (absolute value) of the first pulse is not less than 2 times the coercive voltage of said ferroelectric thin film.

62. A memory device according to claim 1, wherein
a magnitude Vw (absolute value) of the second pulse is 1 to 2 times the coercive voltage of said ferroelectric thin film.

63. A memory device according to claim 1, wherein
a third poling pulse having one or two poled states, and a maximum value of an amplitude not more than 0.3 times a coercive voltage Vc of said ferroelectric thin film, and using a zero-biased state as a reference is applied to a memory cell poled in the first poled state or the partially poled state to read out the information in said memory cell.

64. A memory device according to claim 1, wherein
detection means comprises third pulse application means for applying a poling pulse of two poled states to said ferroelectric memory so as to read out a poled state of the partially poled state.

65. A method of driving a ferroelectric memory using a ferroelectric thin film as a memory cell, comprising:
the first pulse application step of applying a first pulse having a voltage higher than a coercive voltage of said ferroelectric thin film to said ferroelectric memory to perform poling to a first poled state in a first direction of two spontaneous poled states;
the second pulse application step of recording information by applying a second pulse having a voltage with a polarity opposite to a polarity of the first pulse to form a partially poled state in which a domain having the poled state in the first direction and a domain having a poled state in a second direction opposite to the first direction are mixed; and
the step of writing or reading out the information in or from said ferroelectric memory on the basis of the poled state in the first direction and the partially poled state.

66. A method according to claim 65, wherein said ferroelectric memory has a ferroelectric gate transistor structure in which source and drain regions of a second conductivity type are formed on a semiconductor of a first conductivity type, said ferroelectric thin film is formed on a channel region between said source and drain regions, and a conductive electrode is provided as a gate electrode on said ferroelectric thin film;

the first pulse application step comprises the step of applying a first voltage having a first polarity to said ferroelectric memory so as to change a poling direction of said ferroelectric memory to the first direction to erase memory information; and the second pulse application step comprises the step of applying a second voltage which is lower than the coercive voltage of said ferroelectric thin film and has a second polarity opposite to the polarity of the first voltage so as to write the information in said memory.

67. A method according to claim 66, comprising:

the third pulse application step of applying, to said ferroelectric thin film, a third voltage which is lower than the second voltage and has the same polarity as the polarity of the second voltage to read out the information written in said ferroelectric memory.

68. A method according to claim 66, wherein the second voltage is lower than a threshold voltage in a switching charge amount rising in response to a read voltage.

69. A method according to claim 66, wherein the second voltage is not more than ½ the coercive voltage of said ferroelectric thin film.

70. A method according to claim 66, wherein application of the first voltage is application of the voltage having the first polarity to said gate electrode of said ferroelectric gate transistor structure.

71. A method according to claim 66, wherein the first polarity is a positive polarity, and the second polarity is a negative polarity.

72. A method according to claim 66, wherein application of the first voltage is application of the voltage having the second polarity to said source and drain regions of said ferroelectric gate transistor structure.

73. A method according to claim 72, comprising:

the third pulse application step of applying a third pulse having a polarity opposite to the polarity of the second pulse to said ferroelectric memory; and the step of reading out the information from said ferroelectric memory by detecting a difference between the first poled state and the partially poled state as a difference between capacitances.

74. A method according to claim 73, wherein a third poling pulse having one or two poled states, and a maximum value of an amplitude not more than 0.3 times a coercive voltage Vc of said ferroelectric thin film, and using a zero-biased state as a reference is applied to a memory cell poled in the first poled state or the partially poled state in the third pulse application step.

75. A method according to claim 66, wherein the first polarity is a positive polarity, and the second polarity is a negative polarity.

76. A method according to claim 65, wherein a magnitude Vw (absolute value) of the second pulse is 0.3 to 2 times the coercive voltage of said ferroelectric thin film in the second pulse application step.

77. A method according to claim 65, wherein a relationship between a magnitude Ve (absolute value) of the first pulse and a magnitude Vw (absolute value) of the second pulse is set to Vw≦Ve in the first and second pulse application steps.

78. A method according to claim 65, wherein a pulse width Ww of the second pulse is 1% to 300% of a pulse width We of the first pulse in the second pulse application step.

79. A method according to claim 78, wherein a relationship between the pulse width We of the first pulse and the pulse width Ww of the second pulse is set to Ww≦We in the first and second pulse application steps.

80. A method according to claim 65, wherein the second pulse is applied in the second pulse application step so as to set a polarization amount of the partially poled state at 10% to 90% of a polarization amount of a first poled state.

81. A method according to claim 65, wherein, in the second pulse application step, said second pulse has a voltage of:

Vw when applied to the ferroelectric memory of a selected word line to be activated, Vw/3 when applied to the ferroelectric memory of a non-selected word line which is not to be activated, 0 V when applied to the ferroelectric memory of a selected data line to be activated, and 2Vw/3 when applied to the ferroelectric memory of a non-selected data line which is not to be activated.

82. A method according to claim 65, wherein, in the second pulse application step, said second pulse has a voltage of:

Vw/2 when applied to the ferroelectric memory of a selected word line to be activated, 0 V when applied to the ferroelectric memory of a non-selected word line which is not to be activated, −Vw/2 when applied to the ferroelectric memory of a selected data line to be activated, and 0 V when applied to the ferroelectric memory of a non-selected data line which is not to be activated.

83. A method according to claim 65, wherein one of a pair of electrodes of said ferroelectric memory is a lower electrode serving as a lower layer of said ferroelectric thin film; and the other electrode is an upper electrode serving as an upper layer of said ferroelectric thin film, and the first poled state is obtained by performing poling in a direction of said lower electrode in the first pulse application means.

84. A method according to claim 65, wherein one of a pair of electrodes of said ferroelectric memory is a lower electrode serving as a lower layer of said ferroelectric thin film, and the other electrode is an upper electrode serving as an upper layer of said ferroelectric thin film, and the first poled state is obtained by performing poling in a direction of said upper electrode in the first pulse application means.

85. A method according to claim 65, wherein a magnitude Ve (absolute value) of the first pulse is not less than 2 times the coercive voltage of said ferroelectric thin film in the first pulse application step.

86. A method according to claim 85, wherein a magnitude Vw (absolute value) of the second pulse is smaller than the magnitude of the first pulse and 0.3 to 2.5 times the coercive voltage of said ferroelectric thin film in the second pulse application step.

87. A method according to claim 65, wherein
a magnitude Vw (absolute value) of the second pulse is 1 to 2 times the coercive voltage of said ferroelectric thin film in the second pulse application step.

88. A method according to claim 65, wherein
said ferroelectric memory consists of said ferroelectric thin film interposed between electrodes constituted by first stripe electrodes as a plurality of parallel stripe electrodes each constituting one of a pair of electrodes or as a plurality of parallel stripe electrodes each electrically connected with one of said pair of electrodes, and second stripe electrodes as a plurality of parallel stripe electrodes each constituting the other of said pair of electrodes or as a plurality of parallel stripe electrodes each electrically connected with the other of said pair of electrodes, said first stripe electrodes and said second stripe electrodes are almost perpendicular to interpose said ferroelectric thin film, and domains corresponding to crossing portions of said first stripe electrodes and said second stripe electrodes are defined as memory cells, and
a magnitude Vw (absolute value) of the second pulse is not more than a coercive voltage Vc of said ferroelectric thin film, and a voltage ⅓ the magnitude Vw of the second pulse is applied to said first stripe electrodes in the second pulse application step.

89. A method of driving a ferroelectric gate transistor memory cell having a ferroelectric gate transistor structure in which source and drain regions of a second conductivity type are formed on a semiconductor of a first conductivity type, a ferroelectric thin film is formed on a channel region between said source and drain regions, and a conductive electrode serving as a gate electrode is formed thereon, comprising the steps of:

erasing memory information by applying a first voltage having a first polarity to said ferroelectric to cause poling in a first direction;

writing the memory information, during a write cycle, by applying a second voltage lower than a coercive voltage of said ferroelectric and having a second polarity opposite to that of the first voltage to said ferroelectric; and reading the memory information, during a read cycle, by applying a third voltage lower than the second voltage and having the second polarity to said drain to read out a drain current.

90. The method according to claim 89, wherein
the second voltage is lower than a threshold voltage whose switching charge amount rises with respect to a read voltage.

91. The method according to claim 89, wherein
the second voltage is not more than ½ the coercive voltage of said ferroelectric.

92. The method according to claim 89, wherein
the step of erasing the memory information by applying the first voltage comprises applying a voltage having the first polarity to said gate electrode of said ferroelectric gate transistor structure.

93. The method according to claim 92, wherein
the first polarity is a positive polarity; and
the second polarity is a negative polarity.

94. The method according to claim 89, wherein
the step of erasing the memory information by applying the first voltage comprises applying a voltage having the second polarity to said source and drain regions of said ferroelectric gate transistor structure.

95. The method according to claim 94, wherein
the first polarity is a positive polarity; and
the second polarity is a negative polarity.

96. A ferroelectric gate transistor memory, comprising:
a ferroelectric gate transistor memory cell having a ferroelectric gate transistor structure in which source and drain regions of a second conductivity type are formed on a semiconductor of a first conductivity type, a ferroelectric thin film is formed on a channel region between said source and drain regions, and a conductive electrode serving as a gate electrode is formed thereon; and control means for erasing memory information by applying a first voltage having a first polarity to cause poling in a first direction, writing the memory information, during a write cycle, by applying a second voltage lower than a coercive voltage of said ferroelectric and having a second polarity opposite to that of the first voltage, and reading the memory information, during a read cycle, by applying a third voltage lower than the second voltage and having the second polarity to said drain to read out a drain current.

97. The memory according to claim 96, wherein
the first conductivity type is an n type; and
the second conductivity type is a p type.

98. The memory according to claim 96, wherein
the first conductivity type is a p type; and
the second conductivity type is an n type.

99. The memory according to claim 96, wherein
said ferroelectric thin film includes at least two layers formed to be in contact with said channel region of said ferroelectric gate transistor structure.

100. The memory according to claim 96, further comprising
a dielectric layer formed between said channel region and said ferroelectric thin film of said ferroelectric gate transistor structure.

101. The memory according to claim 96, further comprising
a dielectric layer and a metal layer which are formed between said channel region and said ferroelectric thin film of said ferroelectric gate transistor structure.

102. The memory according to claim 96, wherein
said ferroelectric gate transistor memory cell has two MOSFETs connected in series with said ferroelectric gate transistor structure.

103. The memory according to claim 102, wherein gates of said MOSFETs overlap with said gate electrode of said ferroelectric gate transistor structure.

104. The memory according to claim 96, wherein
said ferroelectric gate transistor memory cell has a MOSFET connected in series with said ferroelectric gate transistor structure.

105. The memory according to claim 104, wherein a gate of said MOSFET overlaps with said gate electrode of said ferroelectric gate transistor structure.

* * * * *

UNITED STATES PATENT AND TRADEMARK OFFICE
CERTIFICATE OF CORRECTION

PATENT NO. : 5,666,305
DATED : September 9, 1997
INVENTOR(S) : MIHARA et al.

It is certified that error appears in the above-identified patent and that said Letters Patent is hereby corrected as shown below:

Title page, Item [73] Assignee, line 2, after "Japan" insert:

--; and Symetrix Corporation
    Colorado Springs, Colorado 80918 USA--.

Signed and Sealed this

Twentieth Day of October, 1998

Attest:

BRUCE LEHMAN

Attesting Officer

Commissioner of Patents and Trademarks